(12) United States Patent
Miyazawa et al.

(10) Patent No.: US 9,929,197 B2
(45) Date of Patent: Mar. 27, 2018

(54) SOLID-STATE IMAGE SENSOR AND ELECTRONIC DEVICE

(71) Applicant: SONY CORPORATION, Tokyo (JP)

(72) Inventors: Shinji Miyazawa, Kanagawa (JP); Yutaka Ooka, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/691,529

(22) Filed: Aug. 30, 2017

(65) Prior Publication Data

US 2017/0365633 A1    Dec. 21, 2017

Related U.S. Application Data

(63) Continuation of application No. 15/476,554, filed on Mar. 31, 2017, now Pat. No. 9,812,479, which is a continuation of application No. 15/015,984, filed on Feb. 4, 2016, which is a continuation of application No. 14/011,193, filed on Aug. 27, 2013, now Pat. No. 9,257,474.

(30) Foreign Application Priority Data

Sep. 14, 2012    (JP) .................................. 2012-203069

(51) Int. Cl.
*H01L 27/00*    (2006.01)
*H01L 27/146*    (2006.01)

(52) U.S. Cl.
CPC .. *H01L 27/14618* (2013.01); *H01L 27/14621* (2013.01); *H01L 27/14623* (2013.01); *H01L 27/14627* (2013.01); *H01L 27/14636* (2013.01); *H01L 27/14645* (2013.01); *H01L 27/14685* (2013.01)

(58) Field of Classification Search
CPC ............. H01L 27/146; H01L 27/14603; H01L 27/14645
USPC ............ 250/208.1, 214.1; 257/432, 433, 435
See application file for complete search history.

(56) References Cited

U.S. PATENT DOCUMENTS

2003/0197210 A1*  10/2003  Uchida ................ G02B 3/0012
                                                                     257/294
2005/0056903 A1*   3/2005  Yamamoto ........ H01L 21/76898
                                                                     257/433

* cited by examiner

*Primary Examiner* — Kevin Pyo
(74) *Attorney, Agent, or Firm* — Sheridan Ross P.C.

(57) ABSTRACT

There is provided a solid-state imaging device including a substrate having a surface over which a plurality of photodiodes are formed, and a protection film that is transparent, has a water-proofing property, and includes a side wall part vertical to the surface of the substrate and a ceiling part covering a region surrounded by the side wall part, the side wall part and the ceiling part surrounding a region where the plurality of photodiodes are arranged over the substrate.

30 Claims, 41 Drawing Sheets

SOLID-STATE IMAGE SENSOR AND ELECTRONIC DEVICE

PRIORITY

The present application is a Continuation application of U.S. patent application Ser. No. 15/476,554, filed Mar. 31, 2017, which is a Continuation of U.S. patent application Ser. No. 15/015,984, filed Feb. 4, 2016, which is a Continuation of U.S. patent application Ser. No. 14/011,193 filed Aug. 27, 2013, now U.S. Pat. No. 9,257,474, which claims priority of the Japanese Patent Application No. 2012-203069 filed Sep. 14, 2012, the entire contents of which are hereby incorporated by reference.

BACKGROUND

The present application relates to a solid-state image sensor and an electronic device, particularly to a solid-state imaging device and an electronic device in which a water-proofing property is improved.

In the past, in order to protect a microlens in manufacture of a solid-state imaging device, formation of a protection film formed from an oxide film, a nitride film, or an oxide nitride film was proposed to be formed over a surface of the microlens (see JP 2005-277409A and JP 2008-288570A). This protection film is formed using SiN (silicon nitride) for example, and also has a function of preventing corrosion of a metal wiring over a surface of a silicon substrate.

FIG. 1 is a cross-sectional view schematically illustrating a structure of a CMOS image sensor chip as an example of the solid-state imaging device in which the protection film is formed over the surface of the microlens. This chip 10 has a structure in which a silicon substrate 11, a protection film 12, light-shielding films 13, a planarization film 14, a color filter layer 15, a planarization film 16, and a microlens layer 17 are stacked. Note that unillustrated photodiodes are formed over a surface of the silicon substrate 11.

Further, by forming an unillustrated protection film using SiN or the like over a surface of the microlens layer 17, it is possible to prevent the entrance of moisture and an impurity to a surface (microlens layer 17) side of the chip 10.

SUMMARY

However, for example, when the chip 10 is placed in an environment with a high water vapor pressure, moisture and an impurity may enter a side surface of the chip 10, on which a protection film is not formed, and the quality may degrade.

For example, as indicated by arrows in FIG. 1, moisture entering the side surface of the chip 10 may absorb a component of a sealing resin used for the chip 10 and enter the color filter layer 15, which may result in decolorization of color filters and a change in optical characteristics.

Further, as indicated by arrows in FIG. 2, moisture entering the side surface of the chip 10 may reach the surface of the silicon substrate 11, which may result in a variation in fixed charges on surface films of the photodiodes and an increase in dark current.

Accordingly, according to the present application, a water-proofing property of a solid-state imaging device, such as a CMOS image sensor, is improved.

According to a first embodiment of the present application, there is provided a solid-state imaging device including a substrate having a surface over which a plurality of photodiodes are formed, and a protection film that is transparent, has a water-proofing property, and includes a side wall part vertical to the surface of the substrate and a ceiling part covering a region surrounded by the side wall part, the side wall part and the ceiling part surrounding a region where the plurality of photodiodes are arranged over the substrate.

The side wall part of the protection film may be formed along a side surface of the solid-state imaging device.

The protection film may be further formed along an inner wall of an opening for wiring to an electrode pad of the solid-state imaging device.

The side wall part of the protection film may be embedded in a groove formed inside and along an outer periphery of the solid-state imaging device.

The protection film may be further embedded in a groove formed in a periphery of an opening for wiring to the electrode pad of the solid-state imaging device.

At least one of a lower end and an inner wall of the side wall part of the protection film may be in contact with the substrate.

A color filter may be disposed between the ceiling part of the protection film and the substrate.

The ceiling part of the protection film may form a microlens for gathering light to each of the photodiodes.

The ceiling part of the protection film may be in contact with the color filter.

The ceiling part of the protection film may be formed over a surface of a microlens for gathering light to each of the photodiodes.

The ceiling part of the protection film may be disposed between a microlens for gathering light to each of the photodiodes and the color filter.

The ceiling part of the protection film may be disposed between a color filter and the substrate.

The color filter may be in contact with the ceiling part of the protection film.

The ceiling part of the protection film may be in contact with a light-shielding film for preventing light leakage to an adjacent pixel.

The protection film may include silicon nitride.

The solid-state imaging device may be a bottom emission type.

The solid-state imaging device may be a top emission type.

The solid-state imaging device may be packaged with a transparent resin and glass.

According to a second embodiment of the present application, there is provided an electronic device including a solid-state imaging device including a substrate having a surface over which a plurality of photodiodes are formed, and a protection film that is transparent, has a water-proofing property, and includes a side wall part vertical to the surface of the substrate and a ceiling part covering a region surrounded by the side wall part, the side wall part and the ceiling part surrounding a region where the plurality of photodiodes are arranged over the substrate, and a signal processing part configured to perform signal processing of a pixel signal output from the solid-state imaging device.

According to the first or second embodiment of the present application, the protection film prevents the entrance of moisture and an impurity.

According to the first or second embodiment of the present application, a water-proofing property of a solid-state imaging device can be improved.

Additional features and advantages are described herein, and will be apparent from the following Detailed Description and the figures.

BRIEF DESCRIPTION OF THE FIGURES

FIG. 41 is a cross-sectional view schematically illustrating a thirty-sixth embodiment of a chip forming a CMOS image sensor to which the present application is applied.

DETAILED DESCRIPTION

Figure 1:
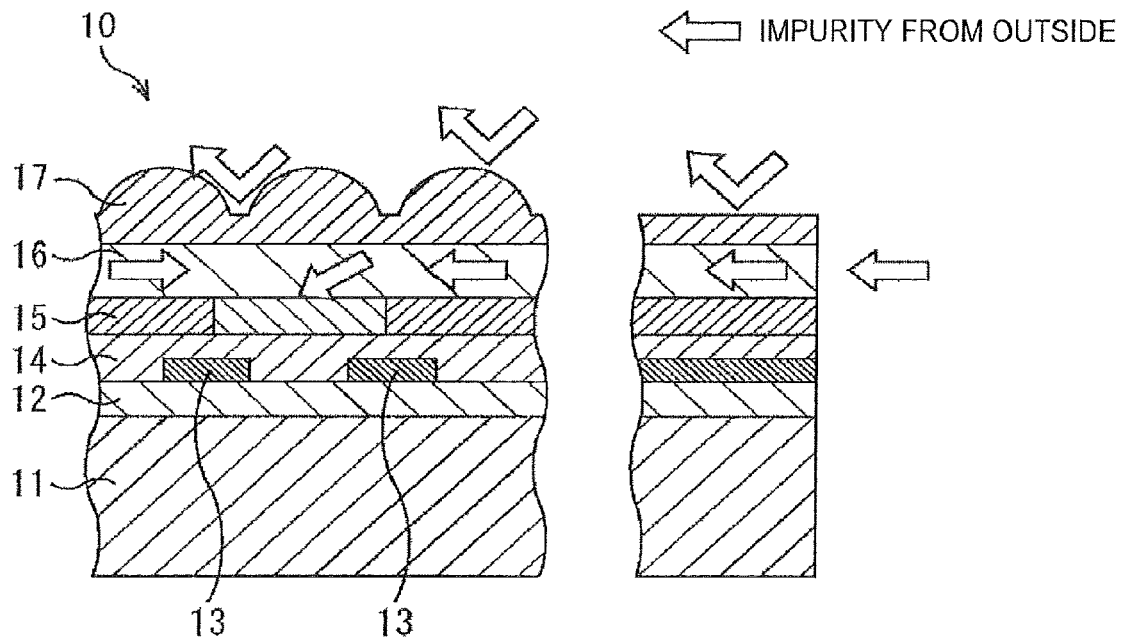
FIG. 1 is a cross-sectional view schematically illustrating a structure of a CMOS image sensor of the related art.
Figure 2:
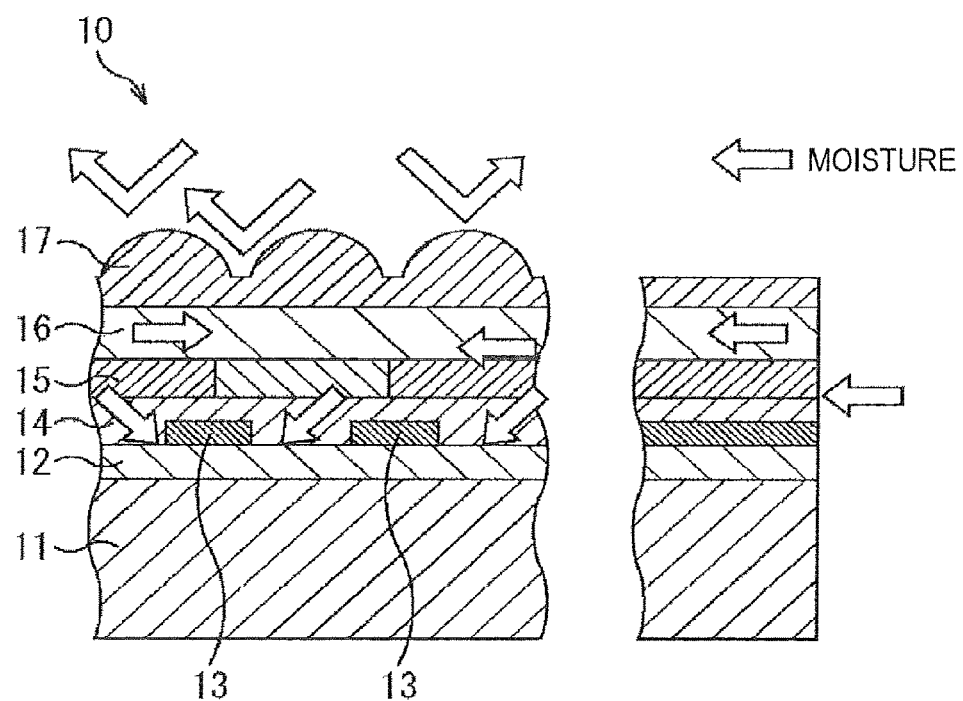
FIG. 2 is a cross-sectional view schematically illustrating a structure of a CMOS image sensor of the related art.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Hereinafter, embodiments for implementing the present application (hereinafter referred to as embodiments) will be described. Note that a description will be given in the following order:

1. Configuration example of system of solid-state imaging device to which the present application is applied
2. Example of basic structure of chip included in solid-state imaging device to which the present application is applied
3-14. First to twelfth embodiments: Examples of applications of the present application to chips of bottom emission type CMOS image sensors
15-20. Thirteenth to eighteenth embodiments: Examples of applications of the present application to chips of top emission type CMOS image sensors
21-38. Nineteenth to thirty-sixth embodiments: Examples of applications of the present application to CSPs
39. Modification examples
40. Electronic devices (imaging devices)

Figure 3:
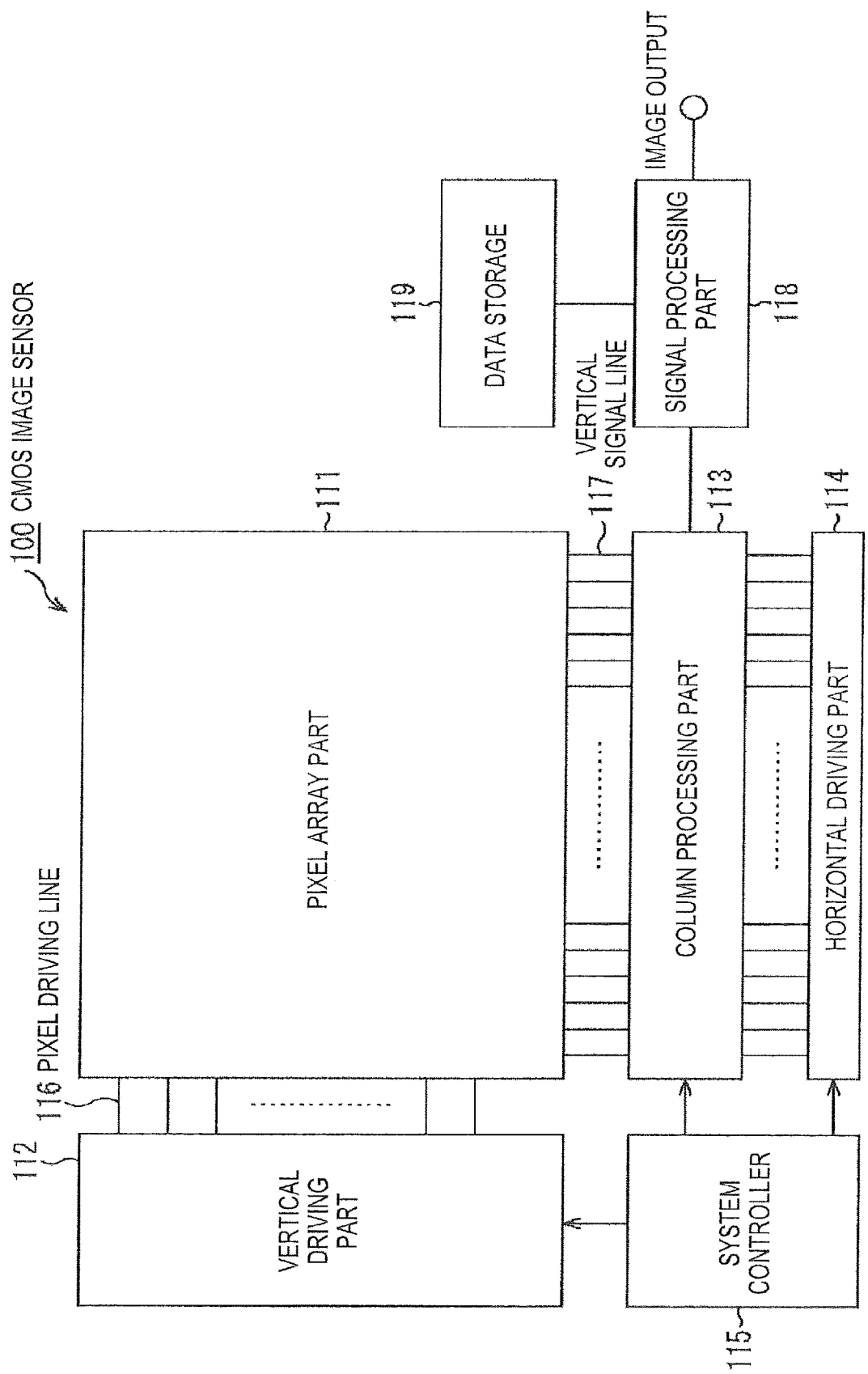
FIG. 3 is a block diagram illustrating a configuration example of an embodiment of a CMOS image sensor to which the present application is applied.

1. Configuration Example of System of Solid-State Imaging Device to which the Present Application is Applied FIG. 3 is a system configuration diagram illustrating a general configuration of a CMOS image sensor, which is a type of an X-Y address-type solid-state imaging device for example, a solid-state imaging device to which the present application is applied. Here, the CMOS image sensor refers to an image sensor formed by applying or partly using a CMOS process.

A CMOS image sensor 100 includes a pixel array part 111 formed over an unillustrated semiconductor substrate and a peripheral circuit part integrated over the same semiconductor substrate as the pixel array part 111. The peripheral circuit part includes a vertical driving part 112, a column processing part 113, a horizontal driving part 114, and a system controller 115, for example.

The CMOS image sensor 100 further includes a signal processing part 118 and a data storage 119. The signal processing part 118 and the data storage 119 may be mounted over the same substrate as the CMOS image sensor 100 or may be disposed over another substrate that is different from the substrate over which the CMOS image sensor 100 is formed. Further, each processing of the signal processing part 118 and the data storage 119 may be a processing by software or an external signal processing part such as a digital signal processor (DSP) circuit provided over another substrate that is different from the substrate over which the CMOS image sensor 100 is formed.

In the pixel array part 111, unit pixels (hereinafter, also simply referred to as "pixels") each having a photoelectric conversion part in which photocharges are generated in accordance with the amount of received light and is accumulated are two-dimensionally arranged in a row direction and a column direction, in other words, as a matrix. Here, the row direction refers to a direction in which pixels in a pixel row are arranged (i.e., the horizontal direction), and the column direction refers to a direction in which pixels in a pixel column are arranged (i.e., the vertical direction).

In the pixel array part 111, with respect to the pixel arrangement as the matrix, pixel driving lines 116 are wired along the row direction for each pixel row, and vertical signal lines 117 are wired along the column direction for each pixel column. Each of the pixel driving lines 116 transmits a driving signal for driving when a signal is read out from a pixel. Although FIG. 3 illustrates one wiring as the pixel driving line 116, the number of the lines is not limited to one. One terminal of the pixel driving line 116 is connected to an output terminal corresponding to each row of the vertical driving part 112.

The vertical driving part 112 includes a shift register, an address decoder, and the like, and drives all the pixels in the pixel array part 111 at the same time or by row unit or the like. That is, the vertical driving part 112 forms a driving part that drives each pixel in the pixel array part 111, together with the system controller 115 that controls the vertical driving part 112. Although an illustration of a specific configuration of the vertical driving part 112 is omitted here, in general, the vertical driving part 112 includes two scanning systems: a read scanning system and a sweep scanning system.

The read scanning system sequentially and selectively scans unit pixels in the pixel array part 111 by row unit to read out signals from the unit pixels. The signals read out from the unit pixels are analog signals. The sweep scanning system sweep-scans a row-to-be-read that is to be subjected to read scanning by the read scanning system to precede the read-scanning by a time for shutter speed.

The sweep scanning by the sweep scanning system sweeps unnecessary charges from photoelectric conversion parts in the unit pixels in the row-to-be-read, so that the photoelectric conversion parts are reset. Further, by sweeping the unnecessary charges (by resetting) by the sweep scanning system, a so-called electronic shuttering operation is performed. Here, the electronic shuttering operation refers to an operation to abandon photocharges to start new light exposure (to start accumulating photocharges).

Signals read out by the reading operation by the read scanning system correspond to the amount of light received after the preceding reading operation or the electronic shuttering operation. Further, a period from the reading timing by the preceding reading operation or the sweeping timing by the electronic shuttering operation to the reading timing by the reading operation this time is a light exposure period of photocharges in a unit pixel.

A signal output from each unit pixel in a pixel row that is selectively scanned by the vertical driving part 112 are input to the column processing part 113 through each of the vertical signal lines 117 for each pixel column. The column processing part 113 performs a predetermined signal processing on the signal output from each pixel in a selected row through each of the vertical signal lines 117 for each pixel column in the pixel array part 111, and temporally holds a pixel signal after the signal processing.

Specifically, the column processing part 113 performs at least a noise removing processing, such as a correlated double sampling (CDS) processing, as the signal processing. The CDS processing by the column processing part 113 removes a reset noise or a fixed pattern noise that is unique to a pixel, such as a variation in the threshold value of an amplifying transistor in a pixel. Instead of the noise removing processing, for example, the column processing part 113 can have an analog-to-digital (AD) conversion function to convert an analog pixel signal to a digital signal and output the digital signal.

The horizontal driving part 114 includes a shift register, an address decoder, and the like, and sequentially selects a unit circuit corresponding to a pixel column in the column processing part 113. By the selective scanning by the horizontal driving part 114, pixel signals that are subjected to the signal processing for each unit circuit in the column processing part 113 are sequentially output.

The system controller 115 includes a timing generator that generates a variety of timing signals and the like, and controls driving of the vertical driving part 112, the column processing part 113, the horizontal driving part 114, and the like, based on a variety of timings generated by the timing generator.

The signal processing part 118 has at least an arithmetic processing function, and performs a variety of signal processings, such as an arithmetic processing on the pixel signal output from the column processing part 113. The data storage 119 temporally stores data necessary for the processing before the signal processing by the signal processing part 118.

2. Example of Basic Structure of Chip Included in Solid-State Imaging Device to which the Present Application is Applied FIG. 4 is a cross-sectional view schematically illustrating a basic structure of a chip forming the CMOS image sensor 100 in FIG. 3, which is a solid-state imaging device to which the present application is applied.

Figure 4:
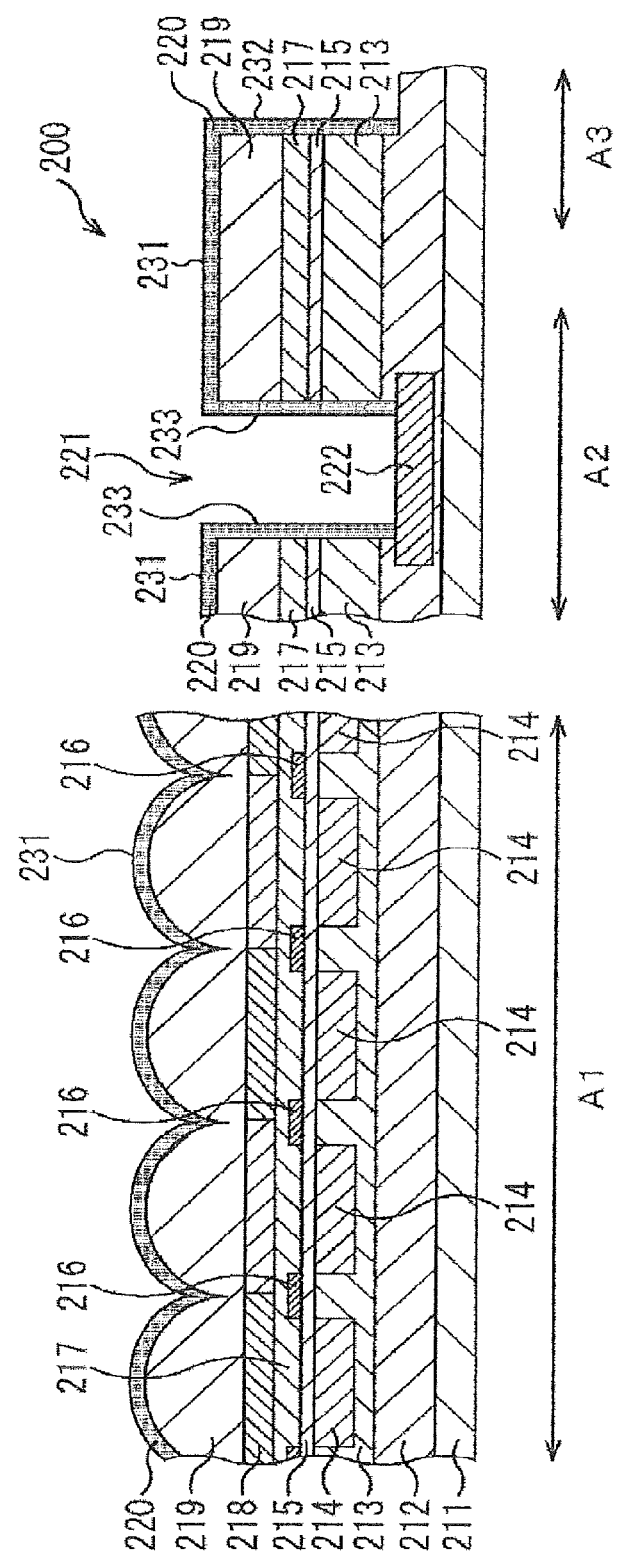
FIG. 4 is a cross-sectional view schematically illustrating a basic structure of a chip forming a CMOS image sensor to which the present application is applied.

A chip 200 in FIG. 4 forms a bottom emission type CMOS image sensor.

Specifically, over a supporting substrate 211, a wiring layer 212 is formed using $SiO_2$, and a silicon substrate 213 is formed over the wiring layer 212. Over a surface of the silicon substrate 213, a plurality of photodiodes 214 are formed at predetermined intervals, each as a photoelectric conversion part of each pixel.

Over the silicon substrate 213 and the photodiodes 214, a protection film 215 is formed using $SiO_2$. Over the protection film 215, light-shielding films 216 for preventing light leakage to adjacent pixels are each formed between the adjacent photodiodes 214. Over the protection film 215 and the light-shielding films 216, a planarization film 217 for planarizing a region where color filters are to be formed is formed.

Over the planarization film 217, a color filter layer 218 is formed. In the color filter layer 218, a plurality of color filters are provided for each pixel, and colors of the respective color filters are arranged in accordance with the Bayer arrangement, for example.

Over the color filter layer 218, a microlens layer 219 is formed. In the microlens layer 219, microlenses for gathering light to each of the photodiodes 214 in each pixel are formed for each pixel.

Over a surface of the microlens layer 219, a protection film 220 is formed for preventing the entrance of moisture and an impurity. The protection film 220 is formed using SiN (silicon nitride) for example, which is transparent and has a water-proofing property.

Figure 5:
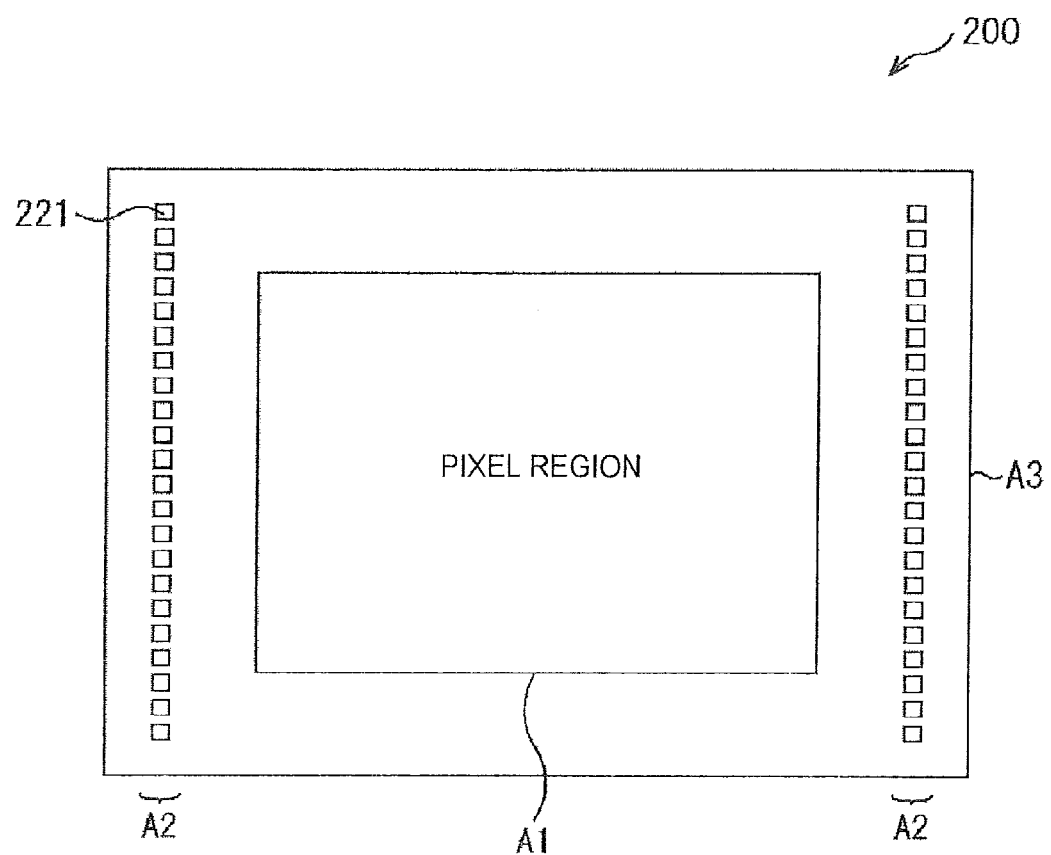
FIG. 5 is a plan view schematically illustrating the basic structure of the chip forming the CMOS image sensor to which the present application is applied.

Here, referring to FIG. 5 in addition to FIG. 4, a structure of the protection film 220 will be described in detail. FIG. 5 is a plan view schematically illustrating a structure of the chip 200. Note that some reference numerals of pad openings 221 are omitted for easy understanding of the drawing.

The chip 200 is broadly divided into a pixel region A1, pad regions A2, a scribe region A3, and other regions.

The pixel region A1 is a region in which pixels each including the photodiode 214 provided over the surface of the silicon substrate 213 are arranged.

Outside the pixel region A1, the pad regions A2 are provided to be parallel to two facing sides of the chip 200. In each of the pad region A2, the pad openings 221 each of which is a vertical opening reaching the inside of the wiring layer 212 from an upper end of the chip 200 and is an opening for wiring to an electrode pad 222 are formed to be linearly arranged. Further, the electrode pad 222 for wiring is provided at a bottom of each of the pad openings 221.

The scribe region A3 is a region for separating the chip 200 from a wafer, and is a region including an end part of the chip 200.

Further, the protection film 220 is broadly divided into a ceiling part 231, a side wall part 232, and an opening wall part 233.

The ceiling part 231 is formed to cover the entire region surrounded by the side wall part 232 except for a part where the pad opening 221 is formed. Further, the color filter layer 218 is deposited between the ceiling part 231 and the silicon substrate 213.

The side wall part 232 is formed vertically to the surface of the silicon substrate 213 along a side surface of the chip 200 (a side wall of an outer periphery, i.e., an outer wall, of the chip 200). The side wall part 232 covers a range from an upper end of the microlens layer 219 to a part of the wiring layer 212 in the side surface of the chip 200, and an inner wall of the side wall part 232 is in contact with a side surface of the silicon substrate 213.

The opening wall part 233 is formed to cover the inner wall of each pad opening 221. An outer wall of the opening wall part 233 is in contact with the silicon substrate 213, and a lower end of the opening wall part 233 is in contact with a top surface of the electrode pad 222.

Therefore, the entire surface of the silicon substrate 213 including the pixel region A1 and the entire color filter layer 218 except for parts where the pad openings 221 are formed are tightly surrounded by the ceiling part 231 and the side wall part 232 of the protection film 220. Further, the inner wall of each pad opening 221 is tightly covered with the opening wall part 233 of the protection film 220.

Accordingly, the ceiling part 231 and the opening wall part 233 of the protection film 220 prevent the entrance of moisture and an impurity to the surface (from above) the chip 200. Further, the side wall part 232 of the protection film 220 prevents the entrance of moisture and an impurity to the side surface of the chip 200. Furthermore, a lower surface of the silicon substrate 213 prevents the entrance of moisture and an impurity from below the chip 200. As a result, even when the chip 200 is placed in an environment where the water vapor pressure is high and moisture is rapidly dispersed, for example, it is possible to prevent an increase in dark current or a change in optical characteristics due to the entrance of moisture and an impurity to surfaces of the photodiodes 214 and the color filter layer 218.

Hereinafter, embodiments of the present application will be specifically described. Note that the embodiments of the present application are classified according to differences in a structure of the protection film, an emission type, a package, and the like, by using the chip 200 in FIG. 4 as a base.

3. First Embodiment

Figure 6:
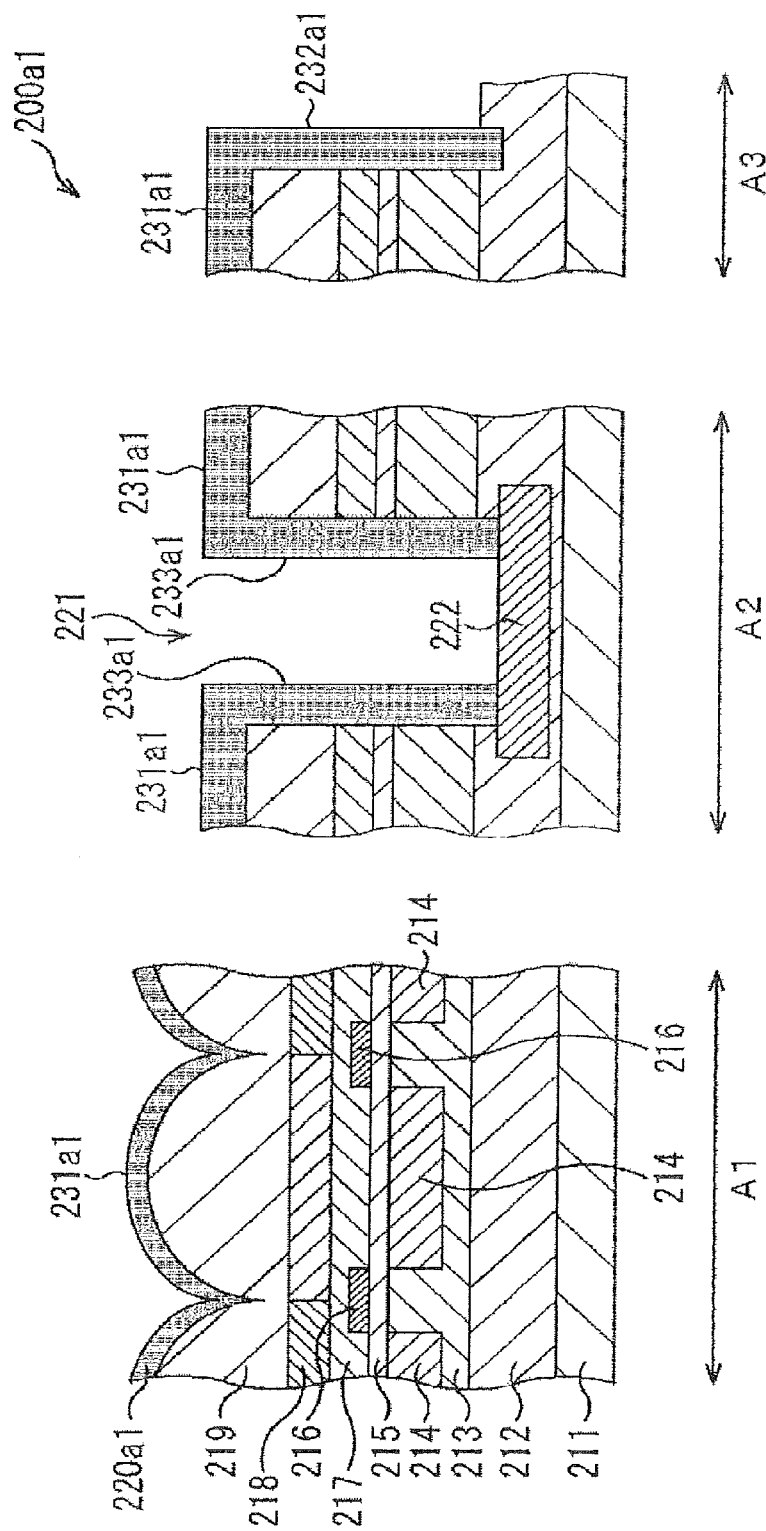
FIG. 6 is a cross-sectional view schematically illustrating a first embodiment of a chip forming a CMOS image sensor to which the present application is applied.

First, referring to FIG. 6, a first embodiment of the present application will be described. FIG. 6 is a cross-sectional view schematically illustrating the first embodiment of the chip forming the CMOS image sensor 100 in FIG. 3. Note that in FIG. 6, parts corresponding to those in FIG. 4 are denoted by the same reference numerals, and a description thereof is omitted as necessary for avoiding repetition.

A chip 200a1 in FIG. 6 has a structure similar to that of the chip 200 in FIG. 4. Note that as for the reference numerals, the protection film 220, the ceiling part 231, the side wall part 232, and the opening wall part 233 are changed to a protection film 220a1, a ceiling part 231a1, a side wall part 232a1, and an opening wall part 233a1, respectively, for discrimination from the other embodiments.

4. Second Embodiment

Figure 7:
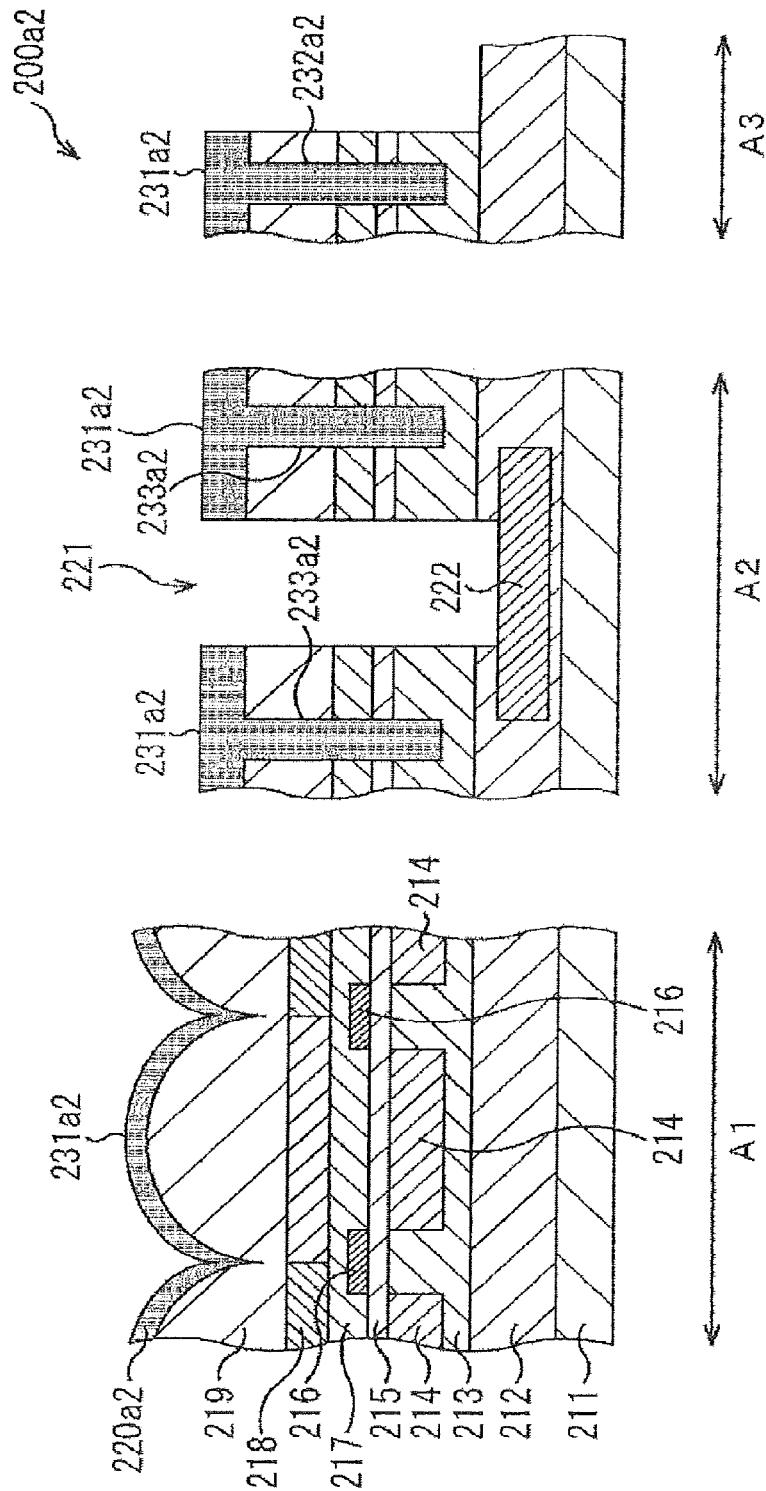
FIG. 7 is a cross-sectional view schematically illustrating a second embodiment of a chip forming a CMOS image sensor to which the present application is applied.

Next, referring to FIG. 7, a second embodiment of the present application will be described. FIG. 7 is a cross-sectional view schematically illustrating the second embodiment of the chip forming the CMOS image sensor 100 in FIG. 3. Note that in FIG. 7, parts corresponding to those in FIG. 6 are denoted by the same reference numerals, and a description thereof is omitted as necessary for avoiding repetition.

A structure of the protection film 220a2 in a chip 200a2 in FIG. 7 is different from that of the protection film 220a1 in the chip 200a1 in FIG. 6.

Specifically, a ceiling part 231a2 of the protection film 220a2 has a structure similar to that of the ceiling part 231a1 of the protection film 220a1 in FIG. 6.

A side wall part 232a2 of the protection film 220a2 is embedded in a groove (slit) formed from the upper end of the microlens layer 219 to reach the inside of the silicon substrate 213 a little inside and along an outer periphery of the chip 200a2. Further, the side wall part 232a2 is vertical to the surface of the silicon substrate 213, and a lower end part of the side wall part 232a2 is in contact with the silicon substrate 213.

An opening wall part 233a2 of the protection film 220a2 is embedded in a groove formed from the upper end of the microlens layer 219 to reach the inside of the silicon substrate 213 in the periphery of the pad opening 221. Further, the opening wall part 233a2 is vertical to the surface of the silicon substrate 213, and a lower end part of the opening wall part 233a2 is in contact with the silicon substrate 213.

Accordingly, a region including the pixel region A1 where the photodiodes 214 are arranged and the color filter layer 218 is tightly surrounded by the silicon substrate 213 and the protection film 220a2 each having a water-proofing property. As a result, the entrance of moisture and an impurity to surfaces of the photodiodes 214 and the color filter layer 218 is prevented, and an increase in dark current or a change in optical characteristics of color filters is prevented.

Note that, hereinafter, a protection film that is formed such that a side wall part and an opening wall part are exposed to outside along a side surface of a chip or an inner wall of a pad opening, like the protection film 220a1 of the chip 200a1 in FIG. 6, is referred to as a side-wall type. On the other hand, a protection film in which an opening wall part and a side wall part are embedded in a groove, like the protection film 220a2 of the chip 200a2 in FIG. 7, is hereinafter referred to as an embedded type.

Note that a step in the up-down direction in the embedded type protection film 220a2 can be smaller than that in the side-wall type protection film 220a1.

5. Third Embodiment

Figure 8:
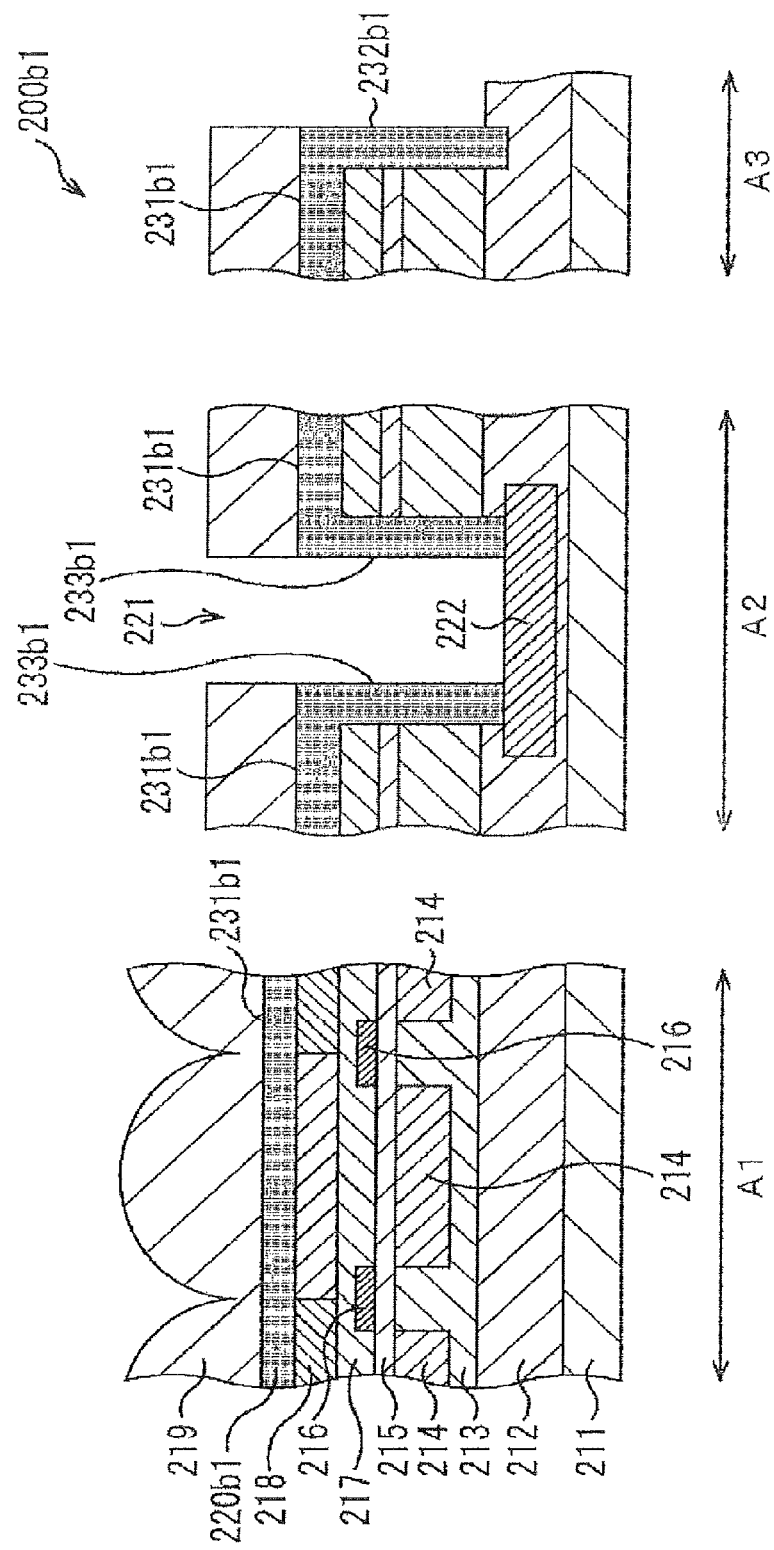
FIG. 8 is a cross-sectional view schematically illustrating a third embodiment of a chip forming a CMOS image sensor to which the present application is applied.

Next, referring to FIG. 8, a third embodiment of the present application will be described. FIG. 8 is a cross-sectional view schematically illustrating the third embodiment of the chip forming the CMOS image sensor 100 in FIG. 3. Note that in FIG. 8, parts corresponding to those in FIG. 6 are denoted by the same reference numerals, and a description thereof is omitted as necessary for avoiding repetition.

A chip 200b1 in FIG. 8 is different from the chip 200a1 in FIG. 6 in that a protection film 220b1 is provided instead of the protection film 220a1.

A ceiling part 231b1 of the protection film 220b1 is formed between the color filter layer 218 and the microlens layer 219, and is in contact with a top surface of the color filter layer 218 and a lower surface of the microlens layer 219. Note that in a part where the color filter layer 218 is not provided, the ceiling part 231b1 is formed between the planarization film 217 and the microlens layer 219 and is in contact with a top surface of the planarization film 217 and the lower surface of the microlens layer 219.

A side wall part 232b1 of the protection film 220b1 is formed to cover a range from an upper end of the planarization film 217 to a part of the wiring layer 212 in a side surface of the chip 200b1. Further, the side wall part 232b1 is vertical to the surface of the silicon substrate 213 and in contact with the side surface of the silicon substrate 213.

An opening wall part 233b1 of the protection film 220b1 is formed to cover a part below the upper end of the planarization film 217 in the inner wall of the pad opening 221. Further, an outer wall of the opening wall part 233b1 is in contact with the silicon substrate 213, and a lower end of the opening wall part 233b1 is in contact with the top surface of the electrode pad 222.

Accordingly, a region including the pixel region A1 where the photodiodes 214 are arranged and the color filter layer 218 is tightly surrounded by the silicon substrate 213 and the protection film 220b1 each having a water-proofing property. As a result, the entrance of moisture and an impurity to surfaces of the photodiodes 214 and the color filter layer 218 is prevented, and an increase in dark current or a change in optical characteristics of color filters is prevented.

6. Fourth Embodiment

Figure 9:
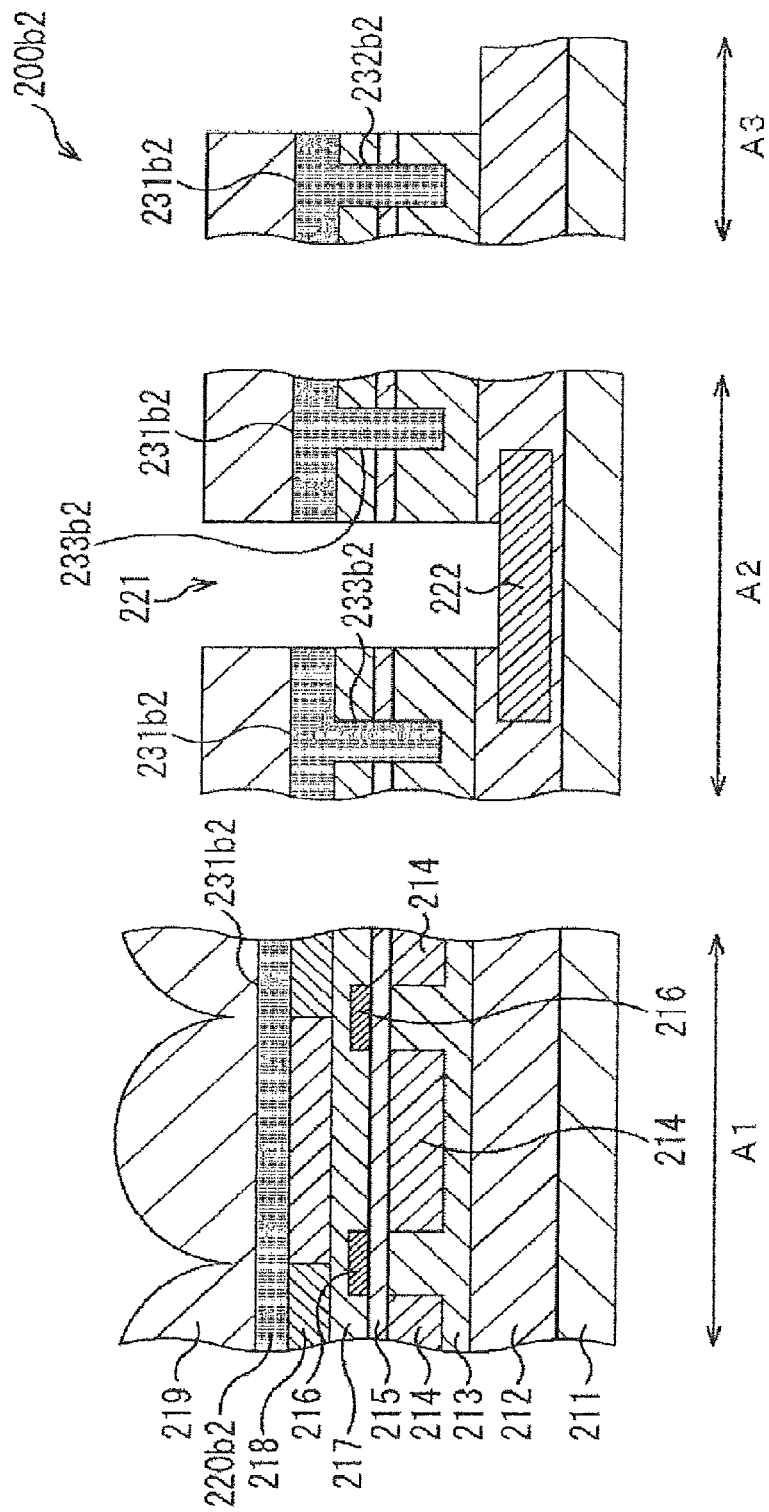
FIG. 9 is a cross-sectional view schematically illustrating a fourth embodiment of a chip forming a CMOS image sensor to which the present application is applied.

Next, referring to FIG. 9, a fourth embodiment of the present application will be described. FIG. 9 is a cross-sectional view schematically illustrating the fourth embodiment of the chip forming the CMOS image sensor 100 in FIG. 3. Note that in FIG. 9, parts corresponding to those in FIG. 8 are denoted by the same reference numerals, and a description thereof is omitted as necessary for avoiding repetition.

A chip 200b2 in FIG. 9 differs from the chip 200b1 in FIG. 8 in that an embedded type protection film 220b2 is provided instead of the side-wall type protection film 220b1.

Specifically, a ceiling part 231b2 of the protection film 220b2 has a structure similar to that of the ceiling part 231b1 of the protection film 220b1 in FIG. 8.

A side wall part 232b2 of the protection film 220b2 is embedded in a groove formed from the upper end of the planarization film 217 to reach the inside of the silicon substrate 213 a little inside and along an outer periphery of the chip 200b2. Further, the side wall part 232b2 is vertical to the surface of the silicon substrate 213, and a lower end part of the side wall part 232b2 is in contact with the silicon substrate 213.

An opening wall part 233b2 of the protection film 220b2 is embedded in a groove formed from the upper end of the planarization film 217 to reach the inside of the silicon substrate 213 in the periphery of the pad opening 221. Further, the opening wall part 233b2 is vertical to the surface of the silicon substrate 213, and a lower end part of the opening wall part 233b2 is in contact with the silicon substrate 213.

Accordingly, a region including the pixel region A1 where the photodiodes 214 are arranged and the color filter layer 218 is tightly surrounded by the silicon substrate 213 and the protection film 220b2 each having a water-proofing property.

As a result, the entrance of moisture and an impurity to surfaces of the photodiodes 214 and the color filter layer 218 is prevented, and an increase in dark current or a change in optical characteristics of color filters is prevented.

7. Fifth Embodiment

Figure 10:
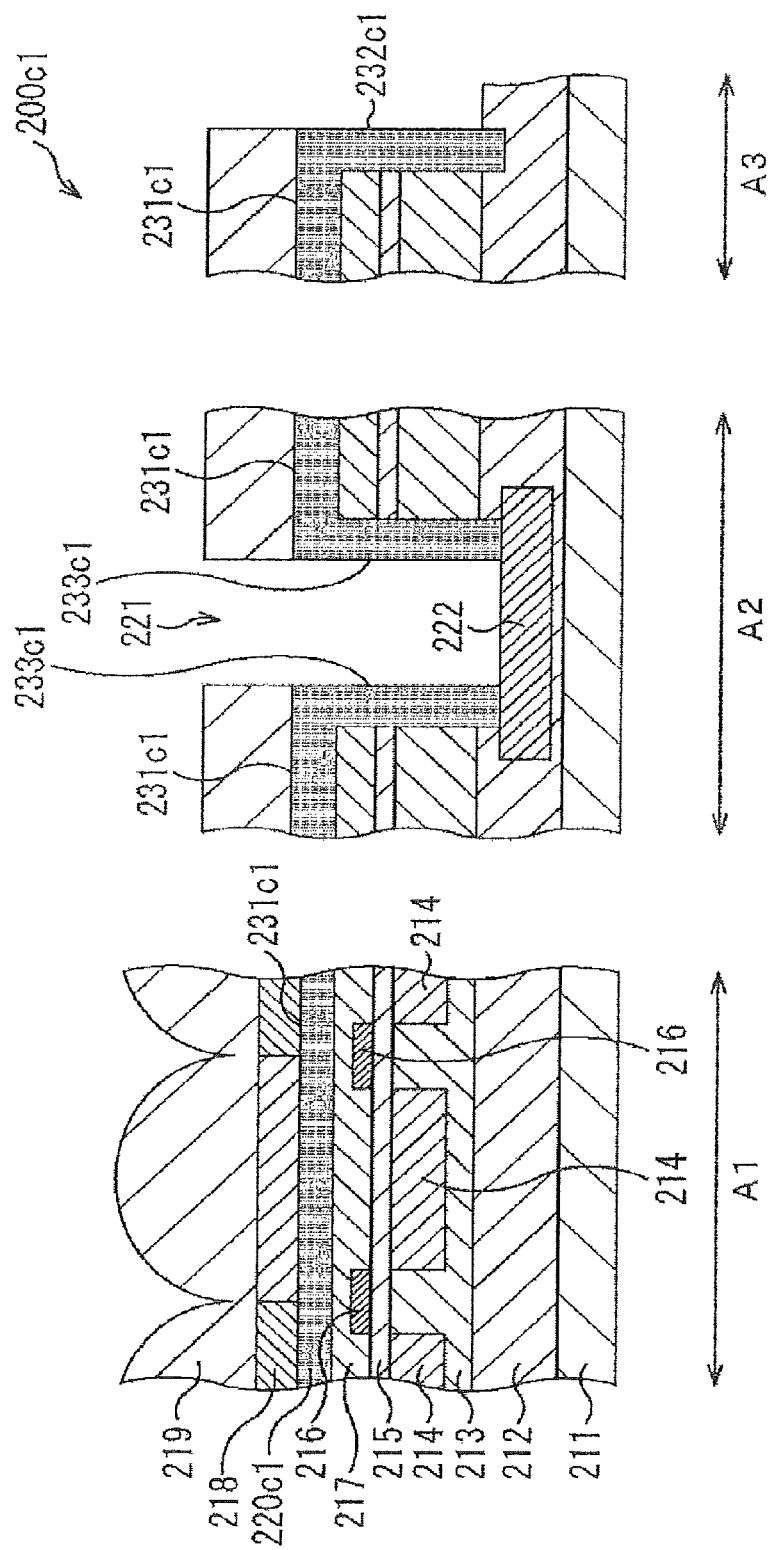
FIG. 10 is a cross-sectional view schematically illustrating a fifth embodiment of a chip forming a CMOS image sensor to which the present application is applied.

Next, referring to FIG. 10, a fifth embodiment of the present application will be described. FIG. 10 is a cross-sectional view schematically illustrating the fifth embodiment of the chip forming the CMOS image sensor 100 in FIG. 3. Note that in FIG. 10, parts corresponding to those in FIG. 6 are denoted by the same reference numerals, and a description thereof is omitted as necessary for avoiding repetition.

A chip 200c1 in FIG. 10 is different from the chip 200a1 in FIG. 6 in that a protection film 220c1 is provided instead of the protection film 220a1.

A ceiling part 231c1 of the protection film 220c1 is formed between the planarization film 217 and the color filter layer 218, and is in contact with a top surface of the planarization film 217 and a lower surface of the color filter layer 218. Therefore, the ceiling part 231c1 is disposed between the color filter layer 218 and the silicon substrate 213. Note that in a part where the color filter layer 218 is not provided, the ceiling part 231c1 is formed between the planarization film 217 and the microlens layer 219 and is in contact with the top surface of the planarization film 217 and the lower surface of the microlens layer 219.

A side wall part 232c1 of the protection film 220c1 is formed to cover a range from the upper end of the planarization film 217 to a part of the wiring layer 212 in the side surface of the chip 200c1. Further, the side wall part 232c1 is vertical to the surface of the silicon substrate 213 and in contact with the side surface of the silicon substrate 213.

An opening wall part 233c1 of the protection film 220c1 is formed to cover a part below the upper end of the planarization film 217 in the inner wall of the pad opening 221. Further, the outer wall of the opening wall part 233c1 is in contact with the silicon substrate 213, and a lower end of the opening wall part 233c1 is in contact with the top surface of the electrode pad 222.

Accordingly, a region including the pixel region A1 where the photodiodes 214 are arranged is tightly surrounded by the silicon substrate 213 and the protection film 220c1 each having a water-proofing property. As a result, the entrance of moisture and an impurity to surfaces of the photodiodes 214 is prevented, and an increase in dark current is prevented.

8. Sixth Embodiment

Figure 11:
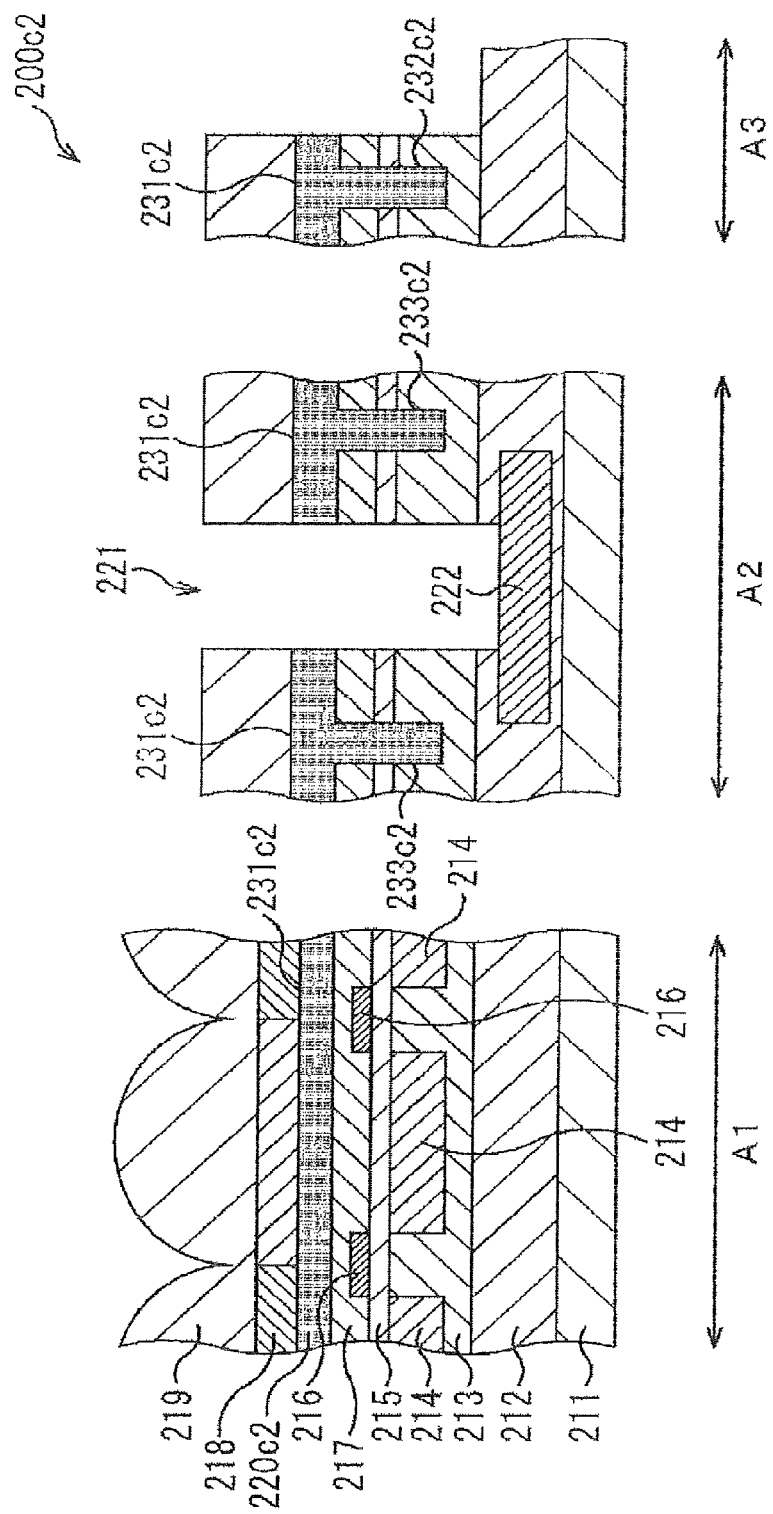
FIG. 11 is a cross-sectional view schematically illustrating a sixth embodiment of a chip forming a CMOS image sensor to which the present application is applied.

Next, referring to FIG. 11, a sixth embodiment of the present application will be described. FIG. 11 is a cross-sectional view schematically illustrating the sixth embodiment of the chip forming the CMOS image sensor 100 in FIG. 3. Note that in FIG. 11, parts corresponding to those in FIG. 10 are denoted by the same reference numerals, and a description thereof is omitted as necessary for avoiding repetition.

A chip 200c2 in FIG. 11 differs from the chip 200c1 in FIG. 10 in that an embedded type protection film 220c2 is provided instead of the side-wall type protection film 220c1.

Specifically, a ceiling part 231c2 of the protection film 220c2 has a structure similar to that of the ceiling part 231c1 of the protection film 220c1 in FIG. 10.

A side wall part 232c2 of the protection film 220c2 is embedded in a groove formed from the upper end of the planarization film 217 to reach the inside of the silicon substrate 213 a little inside and along an outer periphery of the chip 200c2. Further, the side wall part 232c2 is vertical to the surface of the silicon substrate 213, and a lower end part of the side wall part 232c2 is in contact with the silicon substrate 213.

An opening wall part 233c2 of the protection film 220c2 is embedded in a groove formed from the upper end of the planarization film 217 to reach the inside of the silicon substrate 213 in the periphery of the pad opening 221. Further, the opening wall part 233c2 is vertical to the surface of the silicon substrate 213, and a lower end part of the opening wall part 233c2 is in contact with the silicon substrate 213.

Accordingly, a region including the pixel region A1 where the photodiodes 214 are arranged is tightly surrounded by the silicon substrate 213 and the protection film 220c2 each having a water-proofing property. As a result, the entrance of moisture and an impurity to surfaces of the photodiodes 214 is prevented, and an increase in dark current is prevented.

9. Seventh Embodiment

Figure 12:
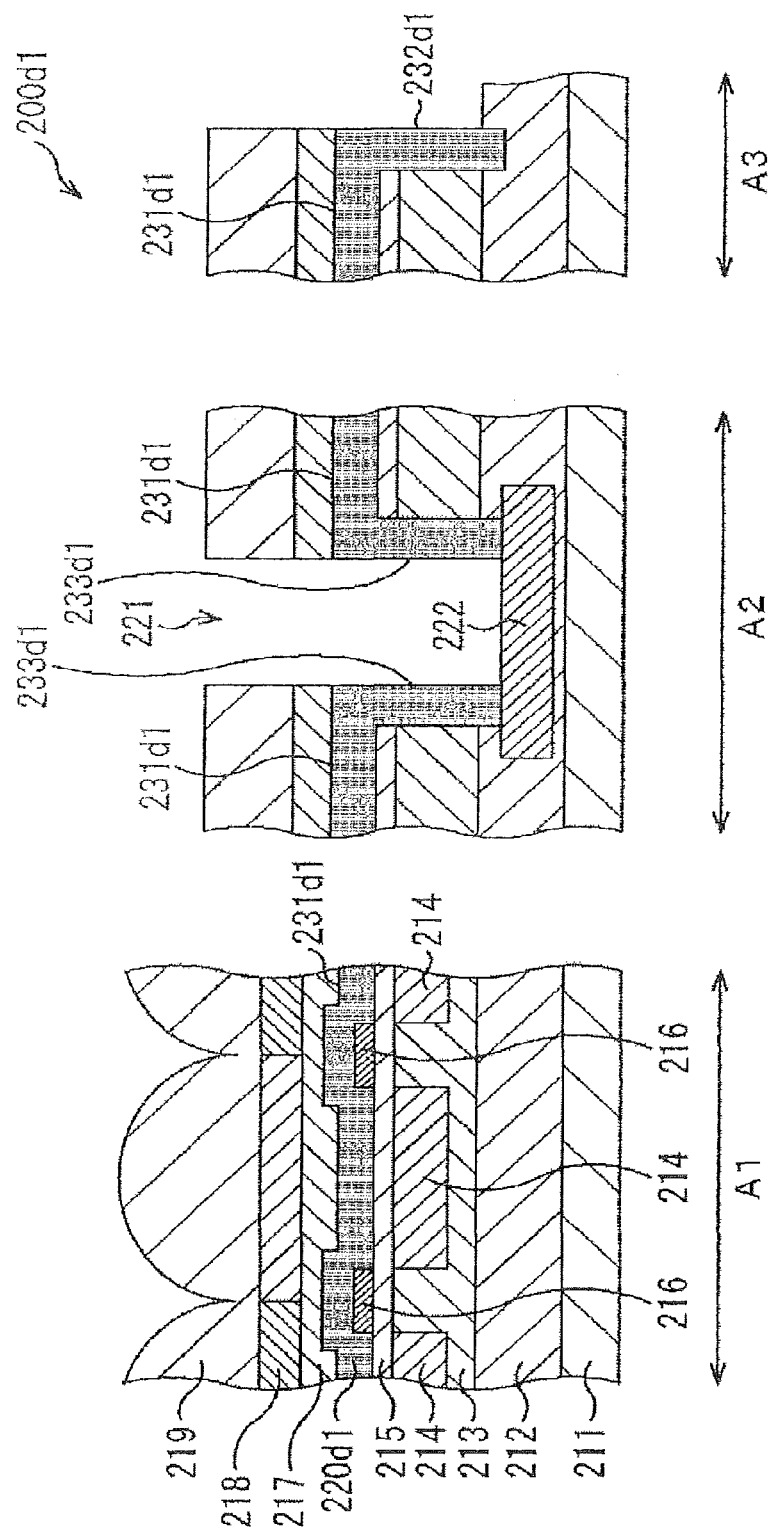
FIG. 12 is a cross-sectional view schematically illustrating a seventh embodiment of a chip forming a CMOS image sensor to which the present application is applied.

Next, referring to FIG. 12, a seventh embodiment of the present application will be described. FIG. 12 is a cross-sectional view schematically illustrating the seventh embodiment of the chip forming the CMOS image sensor 100 in FIG. 3. Note that in FIG. 12, parts corresponding to those in FIG. 6 are denoted by the same reference numerals, and a description thereof is omitted as necessary for avoiding repetition.

A chip 200d1 in FIG. 12 is different from the chip 200a1 in FIG. 6 in that a protection film 220d1 is provided instead of the protection film 220a1.

A ceiling part 231d1 of the protection film 220d1 is formed among the protection film 215, the light-shielding film 216, and the planarization films 217, and is in contact with a top surface of the protection film 215, top surfaces of the light-shielding films 216, and the lower surface of the planarization film 217.

A side wall part 232d1 of the protection film 220d1 is formed to cover a range from an upper end of the protection film 215 to a part of the wiring layer 212 in the side surface of the chip 200d1. Further, the side wall part 232d1 is vertical to the surface of the silicon substrate 213 and in contact with the side surface of the silicon substrate 213.

An opening wall part 233d1 of the protection film 220d1 is formed to cover a part below the upper end of the protection film 215 in the inner wall of the pad opening 221. Further, an outer wall of the opening wall part 233d1 is in contact with the silicon substrate 213, and a lower end of the opening wall part 233d1 is in contact with the top surface of the electrode pad 222.

Accordingly, a region including the pixel region A1 where the photodiodes 214 are arranged is tightly surrounded by the silicon substrate 213 and the protection film 220d1 each having a water-proofing property. As a result, the entrance of moisture and an impurity to surfaces of the photodiodes 214 is prevented, and an increase in dark current is prevented.

10. Eighth Embodiment

Figure 13:
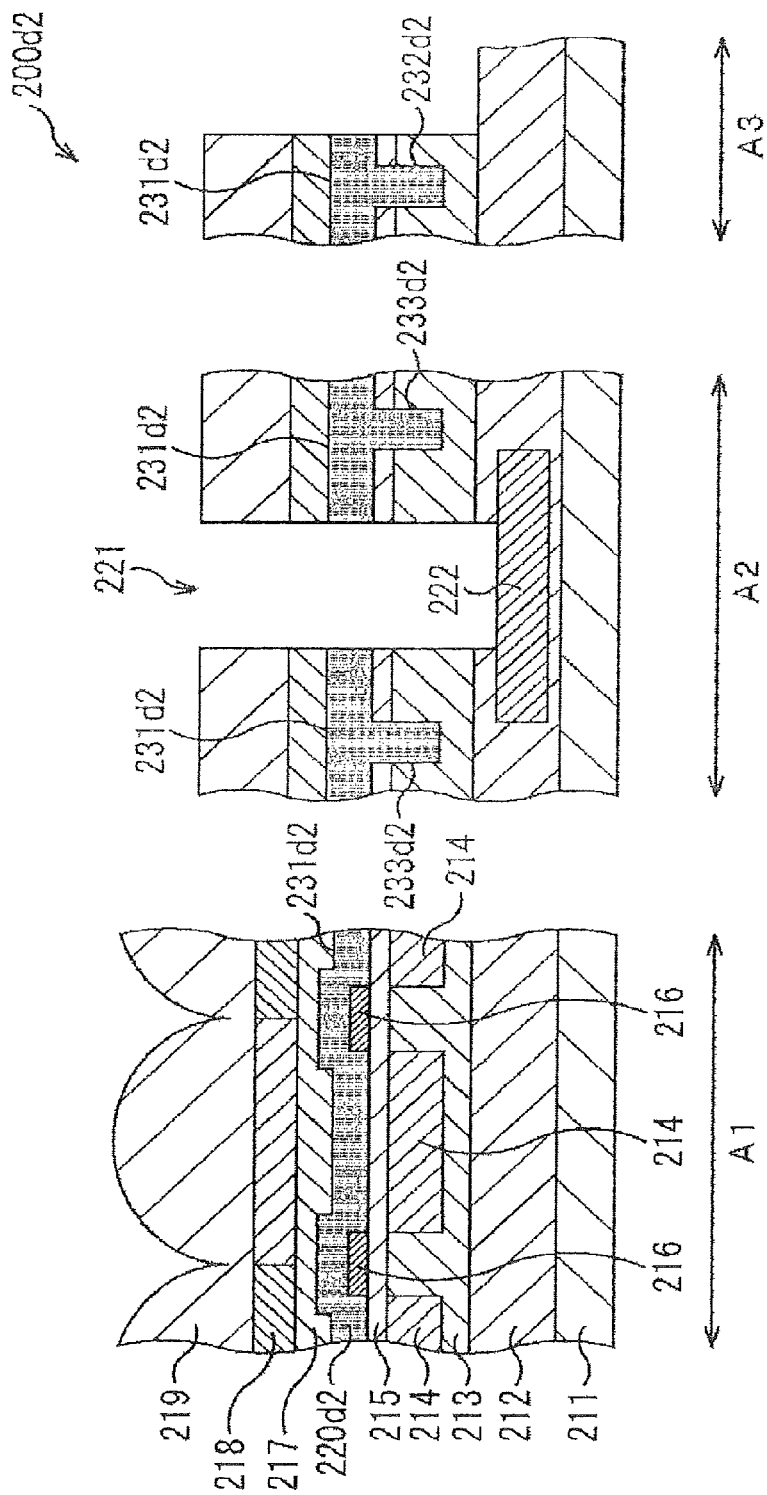
FIG. 13 is a cross-sectional view schematically illustrating an eighth embodiment of a chip forming a CMOS image sensor to which the present application is applied.

Next, referring to FIG. 13, an eighth embodiment of the present application will be described. FIG. 13 is a cross-sectional view schematically illustrating the eighth embodiment of the chip forming the CMOS image sensor 100 in FIG. 3. Note that in FIG. 13, parts corresponding to those in FIG. 12 are denoted by the same reference numerals, and a description thereof is omitted as necessary for avoiding repetition.

A chip 200d2 in FIG. 13 differs from the chip 200d1 in FIG. 12 in that an embedded type protection film 220d2 is provided instead of the side-wall type protection film 220d1.

Specifically, a ceiling part 231d2 of the protection film 220d2 has a structure similar to that of the ceiling part 231d1 of the protection film 220d1 in FIG. 12.

A side wall part 232d2 of the protection film 220d2 is embedded in a groove formed from the upper end of the protection film 215 to reach the inside of the silicon substrate 213 a little inside and along an outer periphery of the chip 200d2. Further, the side wall part 232d2 is vertical to the surface of the silicon substrate 213, and a lower end part of the side wall part 232d2 is in contact with the silicon substrate 213.

An opening wall part 233d2 of the protection film 220d2 is embedded in a groove formed from the upper end of the protection film 215 to reach the inside of the silicon substrate 213 in the periphery of the pad opening 221. Further, the opening wall part 233d2 is vertical to the surface of the silicon substrate 213, and a lower end part of the opening wall part 233d2 is in contact with the silicon substrate 213.

Accordingly, a region including the pixel region A1 where the photodiodes 214 are arranged is tightly surrounded by the silicon substrate 213 and the protection film 220d2 each having a water-proofing property. As a result, the entrance of moisture and an impurity to surfaces of the photodiodes 214 is prevented, and an increase in dark current is prevented.

11. Ninth Embodiment

Figure 14:
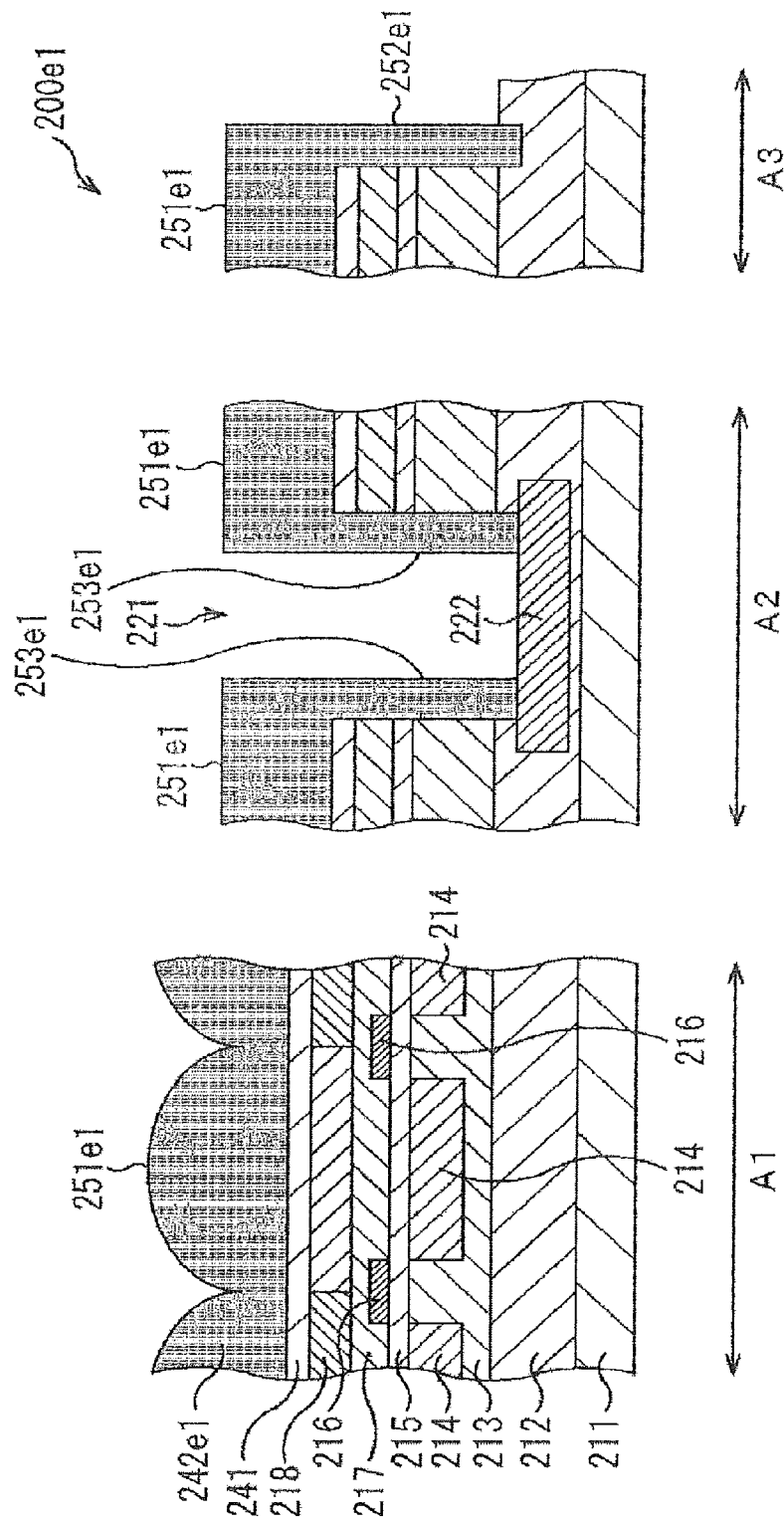
FIG. 14 is a cross-sectional view schematically illustrating a ninth embodiment of a chip forming a CMOS image sensor to which the present application is applied.

Next, referring to FIG. 14, a ninth embodiment of the present application will be described. FIG. 14 is a cross-sectional view schematically illustrating the ninth embodiment of the chip forming the CMOS image sensor 100 in FIG. 3. Note that in FIG. 14, parts corresponding to those in FIG. 6 are denoted by the same reference numerals, and a description thereof is omitted as necessary for avoiding repetition.

A chip 200e1 in FIG. 14 is different from the chip 200a1 in FIG. 6 in that a planarization film 241 and a microlens protection film 242e1 are provided instead of the microlens layer 219 and the protection film 220a1.

The planarization film 241 is formed between the color filter layer 218 and the microlens protection film 242e1 in order to planarize a region where microlenses are to be formed.

The microlens protection film 242e1 is formed using SiN for example, which is transparent and has a water-proofing property, and functions as both the microlens layer 219 and the protection film 220a1 in FIG. 6. The microlens protection film 242e1 includes a ceiling part 251e1, a side wall part 252e1, and an opening wall part 253e1.

In the ceiling part 251e1, microlenses for gathering light to of the photodiodes 214 in the respective pixels are formed for each pixel in the pixel region A1. Further, the ceiling part 251e1 is formed to cover the entire region surrounded by the side wall part 252e1 except for a part where the pad openings 221 are formed.

A side wall part 252e1 is formed to cover a range from an upper end of the planarization film 241 to a part of the wiring layer 212 in a side surface of the chip 200e1. Further, the side wall part 252e1 is vertical to the surface of the silicon substrate 213 and in contact with the side surface of the silicon substrate 213.

An opening wall part 253e1 is formed to cover the inner wall of the pad opening 221. Further, an outer wall of the opening wall part 253e1 is in contact with the silicon substrate 213, and a lower end of the opening wall part 253e1 is in contact with the top surface of the electrode pad 222.

Accordingly, a region including the pixel region A1 where the photodiodes 214 are arranged and the color filter layer 218 is tightly surrounded by the silicon substrate 213 and the microlens protection film 242e1 each having a water-proofing property. As a result, the entrance of moisture and an impurity to surfaces of the photodiodes 214 and the color filter layer 218 is prevented, and an increase in dark current or a change in optical characteristics of color filters is prevented.

Further, since the microlens protection film 242e1 functions as both a microlens and a protection film having a water-proofing property, it is possible to reduce the number of stacked layers in the chip 200e1 and manufacturing steps.

12. Tenth Embodiment

Figure 15:
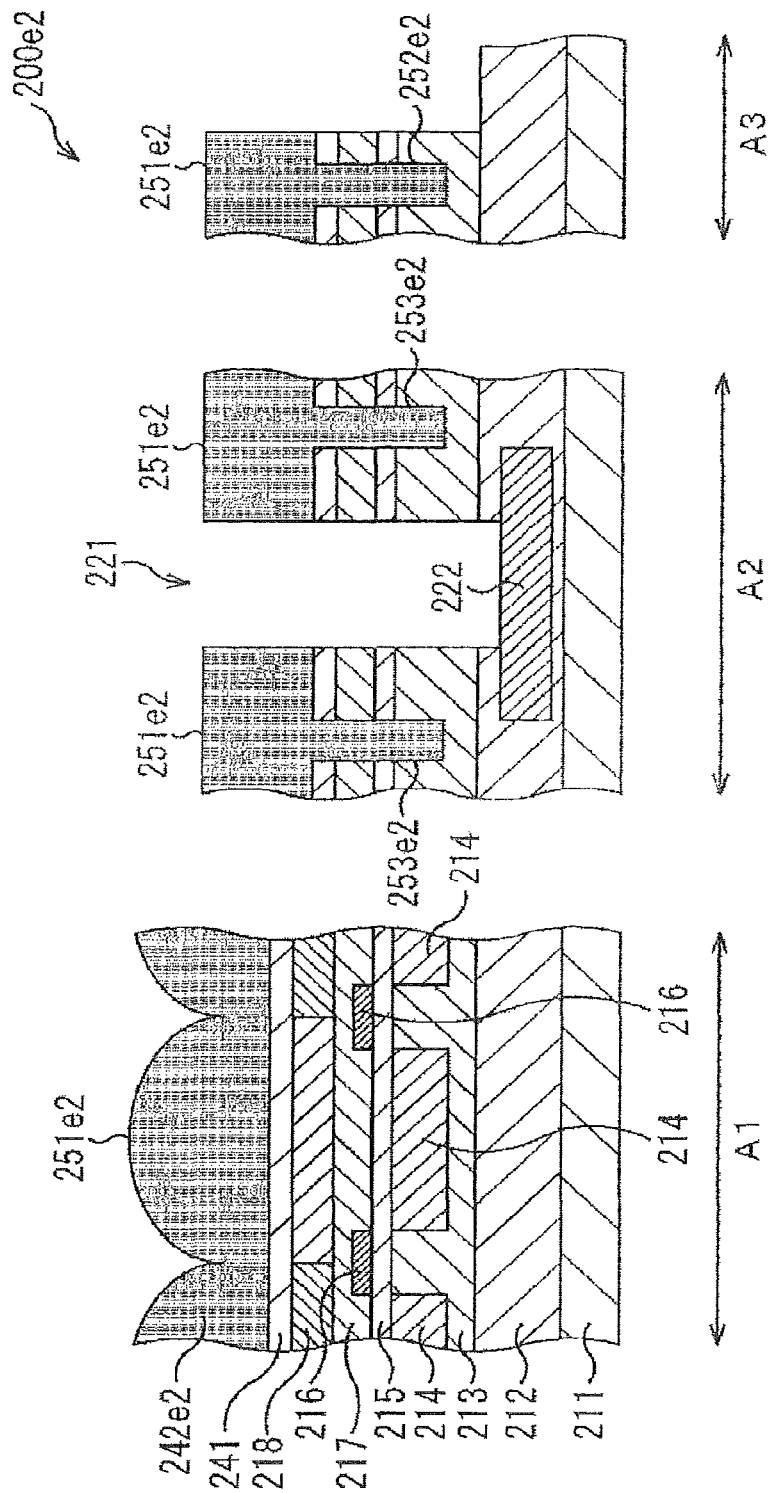
FIG. 15 is a cross-sectional view schematically illustrating a tenth embodiment of a chip forming a CMOS image sensor to which the present application is applied.

Next, referring to FIG. 15, a tenth embodiment of the present application will be described. FIG. 15 is a cross-sectional view schematically illustrating the tenth embodiment of the chip forming the CMOS image sensor 100 in FIG. 3. Note that in FIG. 15, parts corresponding to those in FIG. 14 are denoted by the same reference numerals, and a description thereof is omitted as necessary for avoiding repetition.

A chip 200e2 in FIG. 15 differs from the chip 200e1 in FIG. 14 in that an embedded type microlens protection film 242e2 is provided instead of the side-wall type microlens protection film 242e1.

Specifically, a ceiling part 251e2 of the microlens protection film 242e2 has a structure similar to that of the ceiling part 251e1 of the microlens protection film 242e1 in FIG. 14.

A side wall part 252e2 of the microlens protection film 242e2 is embedded in a groove formed from the upper end of the planarization film 241 to reach the inside of the silicon substrate 213 a little inside and along an outer periphery of the chip 200e2. Further, the side wall part 252e2 is vertical to the surface of the silicon substrate 213, and a lower end part of the side wall part 252e2 is in contact with the silicon substrate 213.

An opening wall part 253e2 of the microlens protection film 242e2 is embedded in a groove formed from the upper end of the planarization film 241 to reach the inside of the silicon substrate 213 in the periphery of the pad opening 221. Further, the opening wall part 253e2 is vertical to the surface of the silicon substrate 213, and a lower end part of the opening wall part 253e2 is in contact with the silicon substrate 213.

Accordingly, a region including the pixel region A1 where the photodiodes 214 are arranged and the color filter layer 218 is tightly surrounded by the silicon substrate 213 and the microlens protection film 242e2 each having a water-proofing property. As a result, the entrance of moisture and an impurity to surfaces of the photodiodes 214 and the color filter layer 218 is prevented, and an increase in dark current or a change in optical characteristics of color filters is prevented.

13. Eleventh Embodiment

Figure 16:
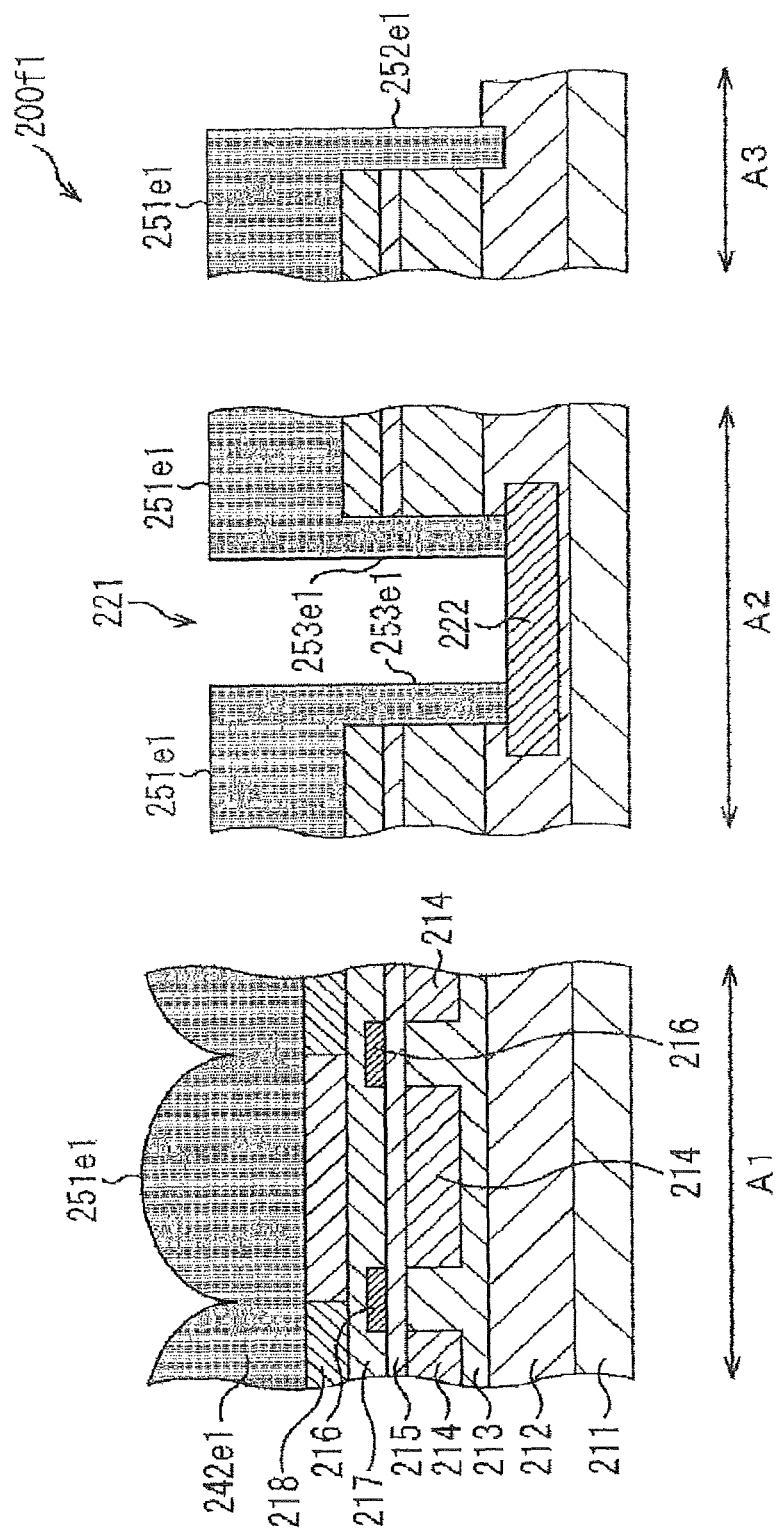
FIG. 16 is a cross-sectional view schematically illustrating an eleventh embodiment of a chip forming a CMOS image sensor to which the present application is applied.

Next, referring to FIG. 16, an eleventh embodiment of the present application will be described. FIG. 16 is a cross-sectional view schematically illustrating the eleventh embodiment of the chip forming the CMOS image sensor 100 in FIG. 3. Note that in FIG. 16, parts corresponding to those in FIG. 14 are denoted by the same reference numerals, and a description thereof is omitted as necessary for avoiding repetition.

In a chip 200f1, the planarization film 241 is omitted from the chip 200e1 in FIG. 14. Therefore, the ceiling part 251e1 of the microlens protection film 242e1 is in contact with the top surface of the color filter layer 218.

Accordingly, although the planarity of microlenses in the chip 200f1 is a little lower than in the chip 200e1 in FIG. 14, it is possible to achieve the same water-proofing effects, to shorten the manufacturing process, and to reduce cost.

14. Twelfth Embodiment

Figure 17:
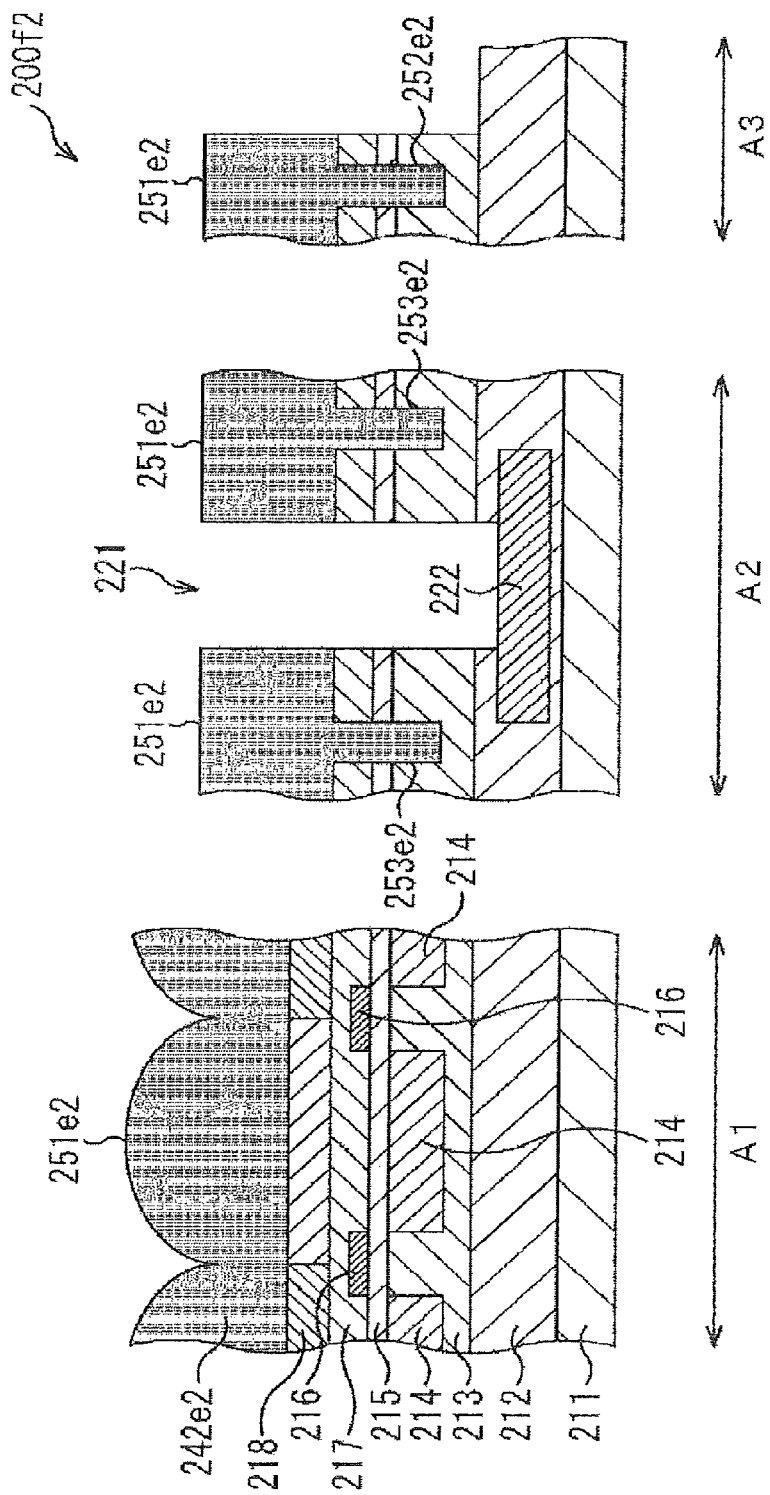
FIG. 17 is a cross-sectional view schematically illustrating a twelfth embodiment of a chip forming a CMOS image sensor to which the present application is applied.

Next, referring to FIG. 17, a twelfth embodiment of the present application will be described. FIG. 17 is a cross-sectional view schematically illustrating the twelfth embodiment of the chip forming the CMOS image sensor 100 in FIG. 3. Note that in FIG. 17, parts corresponding to those in FIG. 15 are denoted by the same reference numerals, and a description thereof is omitted as necessary for avoiding repetition.

In a chip 200f2, the planarization film 241 is omitted from the chip 200e2 in FIG. 15. Therefore, the ceiling part 251e2 of the microlens protection film 242e2 is in contact with the top surface of the color filter layer 218.

Accordingly, although the planarity of microlenses in the chip 200f2 is a little lower than in the chip 200e2 in FIG. 15, it is possible to achieve the same water-proofing effects, to shorten the manufacturing process, and to reduce cost.

15. Thirteenth Embodiment

In the above embodiments, although examples in each of which the present application is applied to the bottom emission type CMOS image sensor are shown, the present application can also be applied to a top emission type CMOS image sensor.

Figure 18:
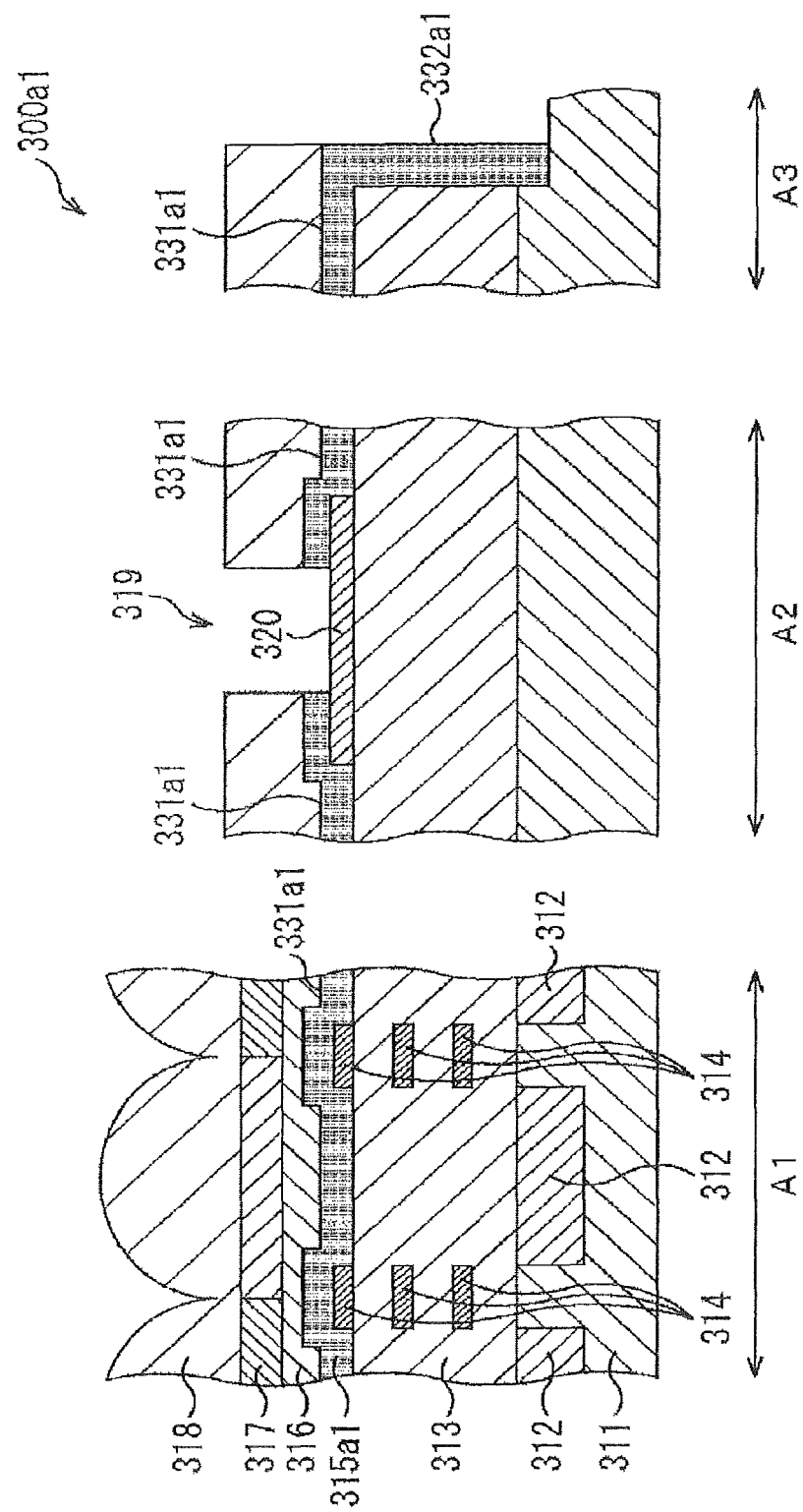
FIG. 18 is a cross-sectional view schematically illustrating a thirteenth embodiment of a chip forming a CMOS image sensor to which the present application is applied.

FIG. 18 is a cross-sectional view schematically illustrating a thirteenth embodiment of a chip forming the CMOS image sensor 100 in FIG. 3.

Over a surface of a silicon substrate 311 of a chip 311a1, a plurality of photodiodes 312 are formed at predetermined intervals, each as a photoelectric conversion part of each pixel.

Over the silicon substrate 311 and the photodiodes 312, an interlayer insulating film 313 is formed. In and over the interlayer insulating film 313, wiring layer metals 314 are formed to be vertically arranged between adjacent photodiodes 312. That is, the chip 300a1 forms the top emission type CMOS image sensor in which wiring layers are provided over (on a top surface side of) the photodiodes 312.

Further, each of these wiring layer metals 314 also has a function as a light-shielding film for preventing light leakage to adjacent pixels.

Over the interlayer insulating film 313 and uppermost layers of the wiring layer metals 314, a protection film 315a1 for preventing the entrance of moisture is formed. The protection film 315a1 is formed using SiN for example, which is transparent and has a water-proofing property.

Over the protection film 315a1, a planarization film 316 for planarizing a region where color filters are to be formed is formed.

Over the planarization film 316, a color filter layer 317 is formed. In the color filter layer 317, color filters are provided for each pixel, and colors of the respective color filters are arranged in accordance with the Bayer arrangement.

Over the color filter layer 317, a microlens layer 318 is formed. In the microlens layer 318, microlenses for gathering light to the photodiodes 312 in the respective pixels are formed for each pixel.

The chip 300a1 is broadly divided into the pixel region A1, the pad regions A2, the scribe region A3, and the other regions as illustrated in FIG. 4, in the same manner as the above-described chip of the bottom emission type CMOS image sensor.

In the pad region A2, a pad opening 319 which is a vertical opening reaching a top surface of the interlayer insulating film 313 from an upper end of the chip 300a1 and is an opening for wiring to an electrode pad 320 is formed. Further, the electrode pad 320 for wiring is provided at a bottom of the pad opening 319.

Further, the protection film 315a1 is broadly divided into a ceiling part 331a1 and a side wall part 332a1.

The ceiling part 331a1 is formed to cover the entire region surrounded by the side wall part 332a1 except for a part where the pad opening 319 is formed. Further, the ceiling part 331a1 is in contact with the top surface of the interlayer insulating film 313, top surfaces of the uppermost layers of the wiring layer metals 314, and a lower surface of the planarization film 316. Note that in a part where the color filter layer 317 is not provided, the ceiling part 331a1 is formed between the interlayer insulating film 313 and the microlens layer 318, and is in contact with the top surface of the insulating film 313 and a lower surface of the microlens layer 318.

The side wall part 332a1 is formed vertically to a surface of the silicon substrate 311 along a side surface of the chip 300a1 (a side wall of an outer periphery, i.e., an outer wall, of the chip 300a1). The side wall part 332a1 covers a range from an upper end of the interlayer insulating film 313 to a part of the silicon substrate 311 in the side surface of the chip 300a1, and a lower end part of the side wall part 332a1 is in contact with the silicon substrate 311.

Accordingly, a region including the pixel region A1 where the photodiodes 312 are arranged is tightly surrounded by the silicon substrate 311, the protection film 315a1, and the electrode pad 320 each having a water-proofing property. As a result, the entrance of moisture and an impurity to surfaces of the photodiodes 312 is prevented, and an increase in dark current is prevented.

16. Fourteenth Embodiment

Figure 19:
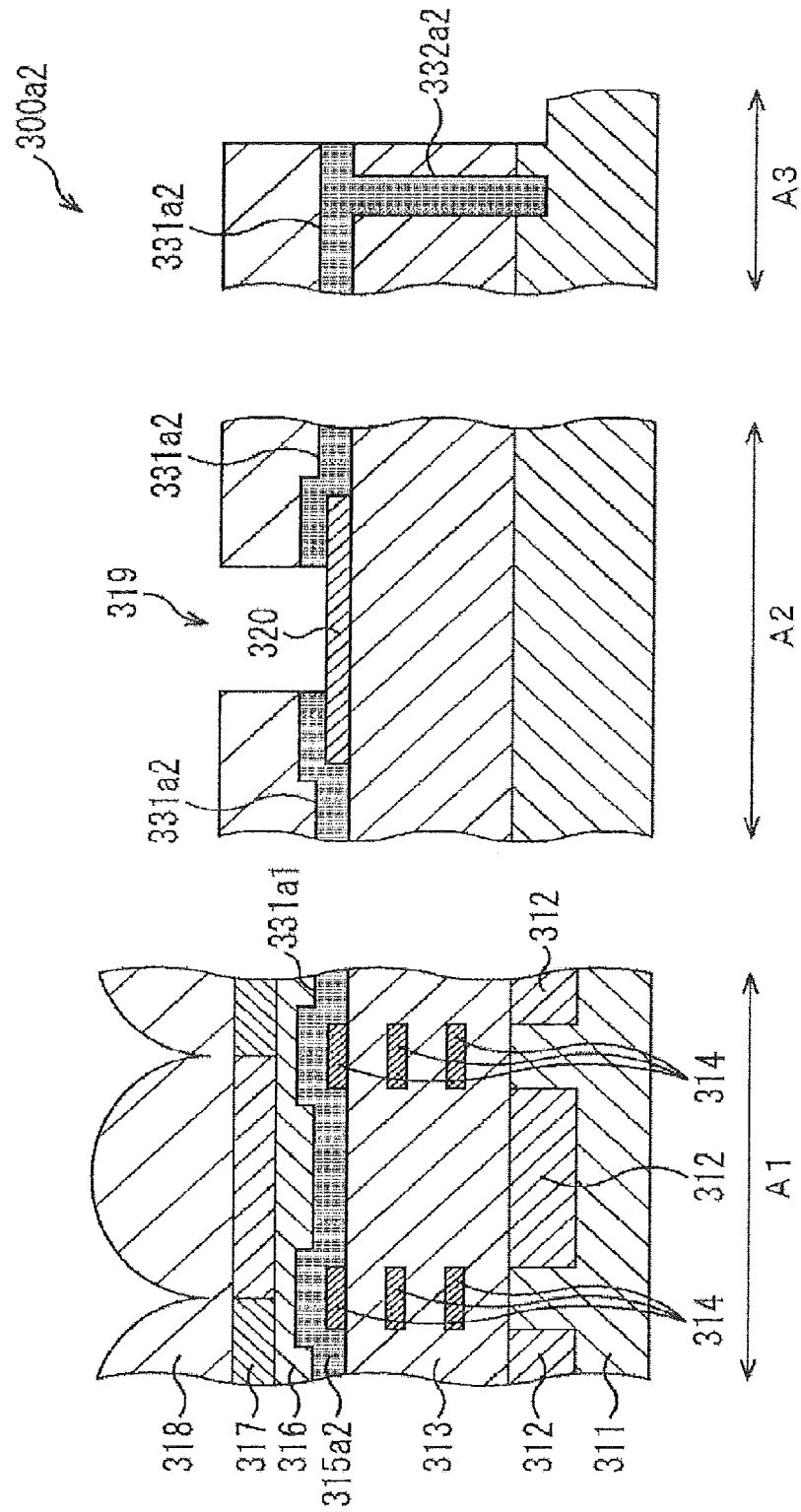
FIG. 19 is a cross-sectional view schematically illustrating a fourteenth embodiment of a chip forming a CMOS image sensor to which the present application is applied.

Next, referring to FIG. 19, a fourteenth embodiment of the present application will be described. FIG. 19 is a cross-sectional view schematically illustrating the fourteenth embodiment of the chip forming the CMOS image sensor 100 in FIG. 3. Note that in FIG. 19, parts corresponding to those in FIG. 18 are denoted by the same reference numerals, and a description thereof is omitted as necessary for avoiding repetition.

A chip 300a2 in FIG. 19 differs from the chip 300a1 in FIG. 18 in that an embedded type protection film 315a2 is provided instead of the side-wall type protection film 315a1.

Specifically, a ceiling part 331a2 of the protection film 315a2 has a structure similar to that of the ceiling part 331a1 of the protection film 315a1 in FIG. 18.

A side wall part 332a2 of the protection film 315a2 is embedded in a groove formed from the upper end of the interlayer insulating film 313 to reach the inside of the silicon substrate 311 a little inside and along an outer periphery of the chip 300a2. Further, the side wall part 332a2 is vertical to the surface of the silicon substrate 311, and a lower end part of the side wall part 332a2 is in contact with the silicon substrate 311.

Accordingly, a region including the pixel region A1 where the photodiodes 312 are arranged is tightly surrounded by the silicon substrate 311, the protection film 315a2, and the electrode pad 320 each having a water-proofing property. As a result, the entrance of moisture to surfaces of the photodiodes 312 is prevented, and an increase in dark current is prevented.

17. Fifteenth Embodiment

Figure 20:
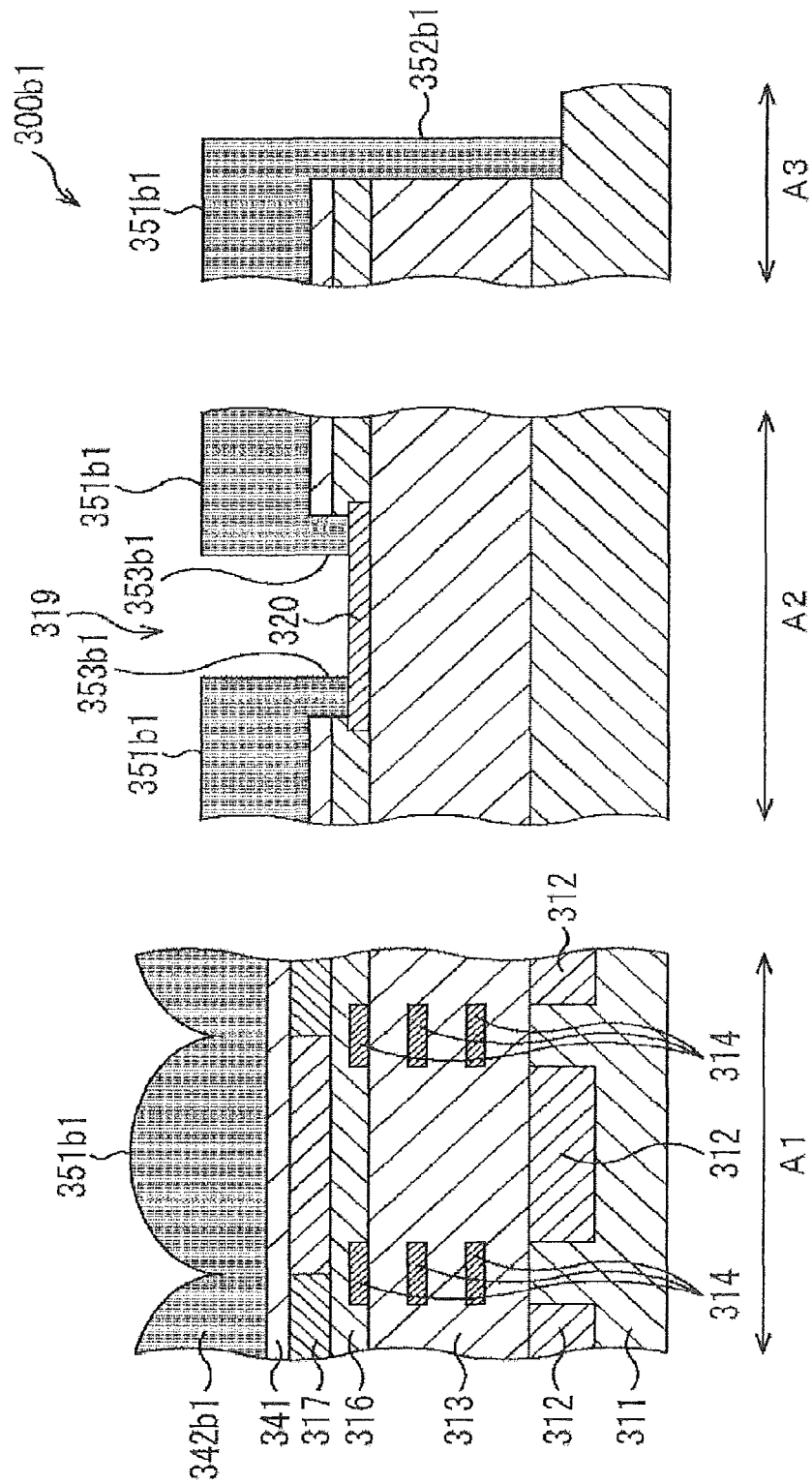
FIG. 20 is a cross-sectional view schematically illustrating a fifteenth embodiment of a chip forming a CMOS image sensor to which the present application is applied.

Next, referring to FIG. 20, a fifteenth embodiment of the present application will be described. FIG. 20 is a cross-sectional view schematically illustrating the fifteenth embodiment of the chip forming the CMOS image sensor 100 in FIG. 3. Note that in FIG. 20, parts corresponding to those in FIG. 18 are denoted by the same reference numerals, and a description thereof is omitted as necessary for avoiding repetition.

A chip 300b1 in FIG. 20 is different from the chip 300a1 in FIG. 18 in that a planarization film 341 and a microlens protection film 342b1 are provided instead of the microlens layer 318 and the protection film 315a1.

The planarization film 341 is formed between the color filter layer 317 and the microlens protection film 342b1 in order to planarize a region where microlenses are to be formed.

The microlens protection film 342b1 is formed using SiN for example, which is transparent and has a water-proofing property, and functions as both the microlens layer 318 and the protection film 315a1 in FIG. 18. The microlens protection film 342b1 includes a ceiling part 351b1, a side wall part 352b1, and an opening wall part 353b1.

In the ceiling part 351b1, microlenses for gathering light to the photodiodes 312 in the respective pixels are formed for each pixel in the pixel region A1. Further, the ceiling part 351b1 is formed to cover the entire region surrounded by the side wall part 352b1 except for a part where the pad opening 319 is formed.

The side wall part 352b1 is formed to cover a range from an upper end of the planarization film 341 to a part of the silicon substrate 311 in a side surface of the chip 300b1. Further, the side wall part 352b1 is vertical to the surface of the silicon substrate 311 and in contact with the side surface of the silicon substrate 311.

The opening wall part 353b1 is formed to cover the inner wall of the pad opening 319. Further, a lower end of the opening wall part 353b1 is in contact with the top surface of the electrode pad 320.

Accordingly, a region including the pixel region A1 where the photodiodes 312 are arranged and the color filter layer 317 is tightly surrounded by the silicon substrate 311, the microlens protection film 342b1, and the electrode pad 320 each having a water-proofing property. As a result, the entrance of moisture and an impurity to surfaces of the photodiodes 312 and the color filter layer 317 is prevented, and an increase in dark current or a change in optical characteristics of color filters is prevented.

18. Sixteenth Embodiment

Figure 21:
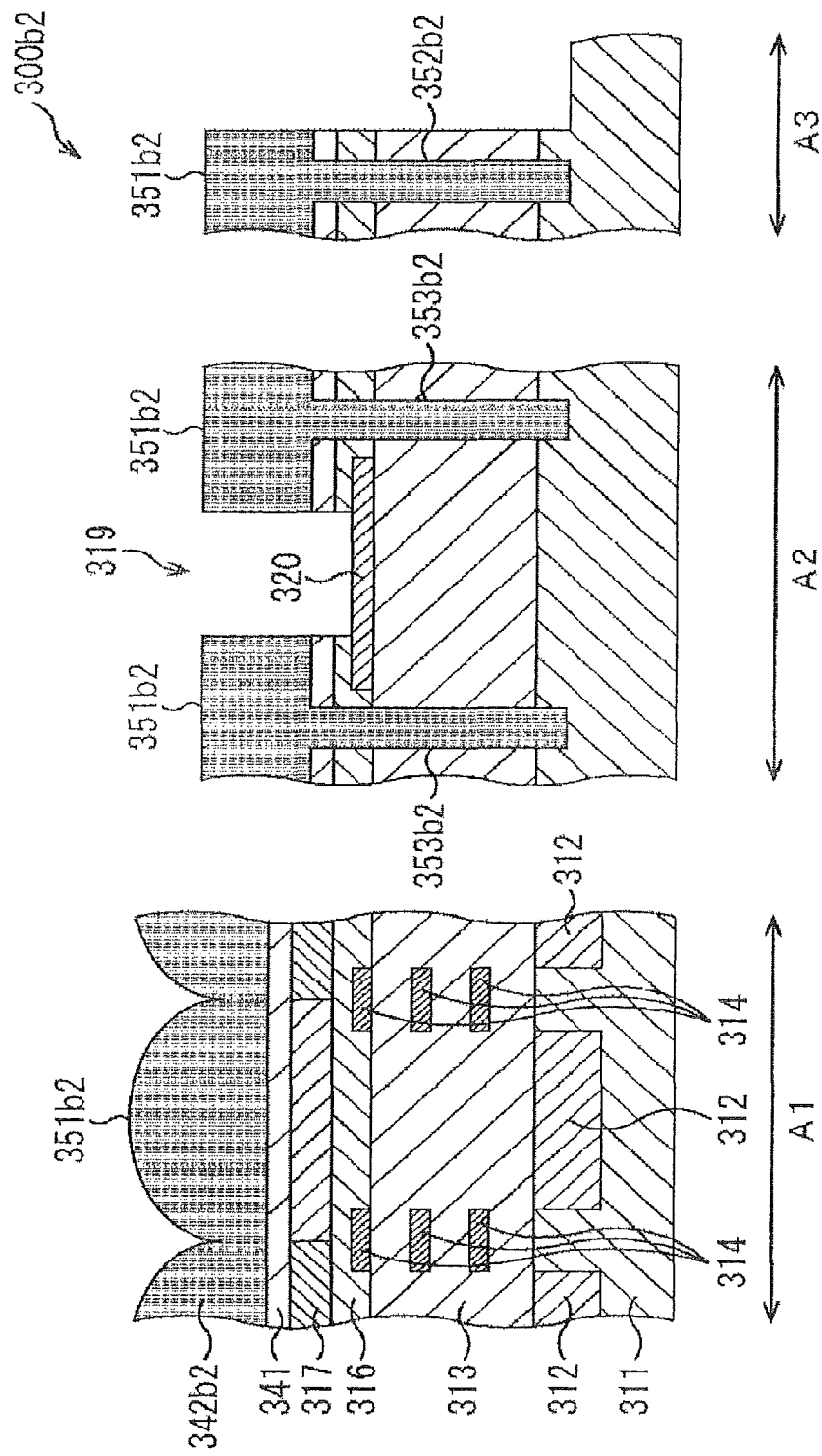
FIG. 21 is a cross-sectional view schematically illustrating a sixteenth embodiment of a chip forming a CMOS image sensor to which the present application is applied.

Next, referring to FIG. 21, a sixteenth embodiment of the present application will be described. FIG. 21 is a cross-sectional view schematically illustrating the sixteenth embodiment of the chip forming the CMOS image sensor 100 in FIG. 3. Note that in FIG. 21, parts corresponding to those in FIG. 20 are denoted by the same reference numerals, and a description thereof is omitted as necessary for avoiding repetition.

Figure 22:
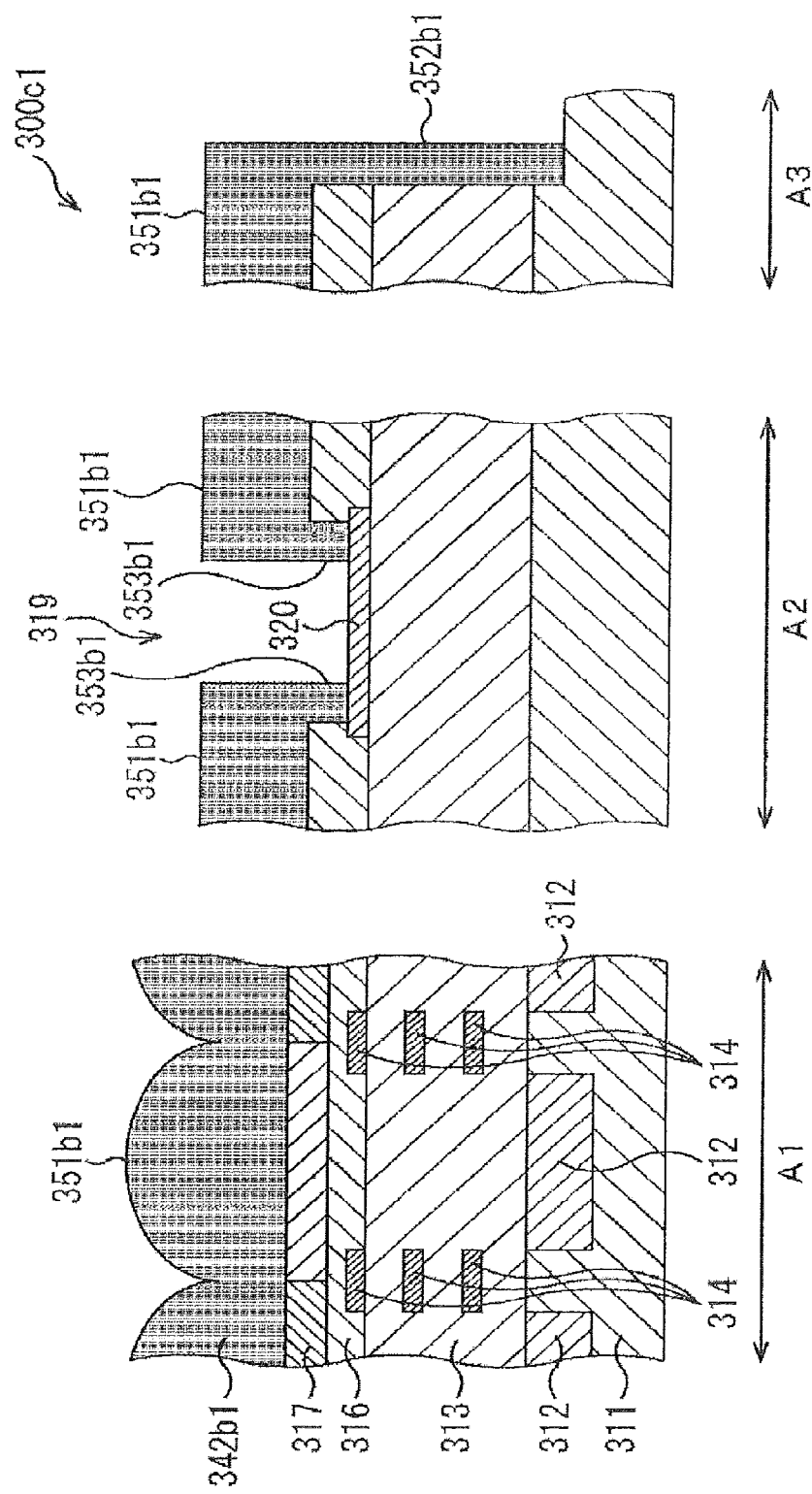
FIG. 22 is a cross-sectional view schematically illustrating a seventeenth embodiment of a chip forming a CMOS image sensor to which the present application is applied.

A chip 300b2 in FIG. 21 differs from the chip 300b2 in FIG. 22 in that an embedded type microlens protection film 342b2 is provided instead of the side-wall type microlens protection film 342b1.

Specifically, a ceiling part 351b2 of the microlens protection film 342b2 has a structure similar to that of the ceiling part 351b1 of the microlens protection film 342b1 in FIG. 20.

A side wall part 352b2 of the microlens protection film 342b2 is embedded in a groove formed from the upper end of the planarization film 341 to reach the inside of the silicon substrate 311 a little inside and along an outer periphery of the chip 300b2. Further, the side wall part 352b2 is vertical to the surface of the silicon substrate 311, and a lower end part of the side wall part 352b2 is in contact with the silicon substrate 311.

An opening wall part 353b2 of the microlens protection film 342b2 is embedded in a groove formed from the upper end of the planarization film 341 to reach the inside of the silicon substrate 311 in the periphery of the pad opening 319. Further, the opening wall part 353b2 is vertical to the surface of the silicon substrate 311, and a lower end part of the opening wall part 353b2 is in contact with the silicon substrate 311.

Accordingly, a region including the pixel region A1 where the photodiodes 312 are arranged and the color filter layer 317 is tightly surrounded by the silicon substrate 311 and the microlens protection film 342b2 each having a water-proofing property. As a result, the entrance of moisture and an impurity to surfaces of the photodiodes 312 and the color filter layer 317 is prevented, and an increase in dark current or a change in optical characteristics of color filters is prevented.

19. Seventeenth Embodiment

Next, referring to FIG. 22, a seventeenth embodiment of the present application will be described. FIG. 22 is a cross-sectional view schematically illustrating the seventeenth embodiment of the chip forming the CMOS image sensor 100 in FIG. 3. Note that in FIG. 22, parts corresponding to those in FIG. 20 are denoted by the same reference numerals, and a description thereof is omitted as necessary for avoiding repetition.

In a chip 300c, the planarization film 341 is omitted from the chip 300b1 in FIG. 20. Therefore, the ceiling part 351b1 of the microlens protection film 342b1 is in contact with the top surface of the color filter layer 317.

Accordingly, although the planarity of microlenses in the chip 300c1 is a little lower than in the chip 300b1 in FIG. 20, it is possible to achieve the same water-proofing effects, to shorten the manufacturing process, and to reduce cost.

20. Eighteenth Embodiment

Figure 23:
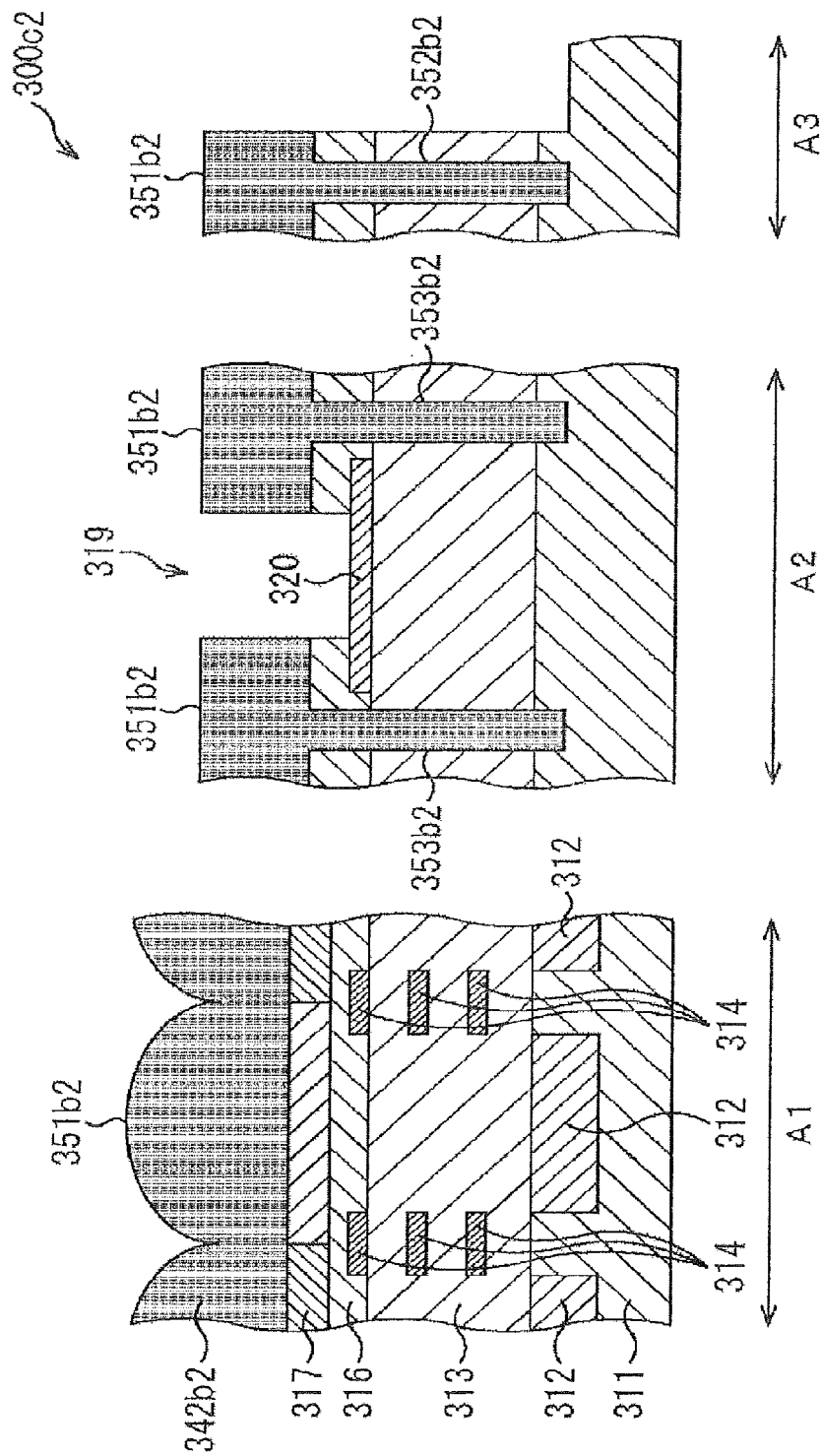
FIG. 23 is a cross-sectional view schematically illustrating an eighteenth embodiment of a chip forming a CMOS image sensor to which the present application is applied.

Next, referring to FIG. 23, an eighteenth embodiment of the present application will be described. FIG. 23 is a cross-sectional view schematically illustrating the eighteenth embodiment of the chip forming the CMOS image sensor 100 in FIG. 3. Note that in FIG. 23, parts corresponding to those in FIG. 21 are denoted by the same reference numerals, and a description thereof is omitted as necessary for avoiding repetition.

In a chip 300c2, the planarization film 341 is omitted from the chip 300b2 in FIG. 22. Therefore, the ceiling part 351b2 of the microlens protection film 342b2 is in contact with the top surface of the color filter layer 317.

Accordingly, although the planarity of microlenses in the chip 300c2 is a little lower than in the chip 300b2 in FIG. 22, it is possible to achieve the same water-proofing effects, to shorten the manufacturing process, and to reduce cost.

21. Nineteenth Embodiment

As a method for packaging each of the above-described chips, for example, a chip size package (CSP) can be employed.

Figure 24:
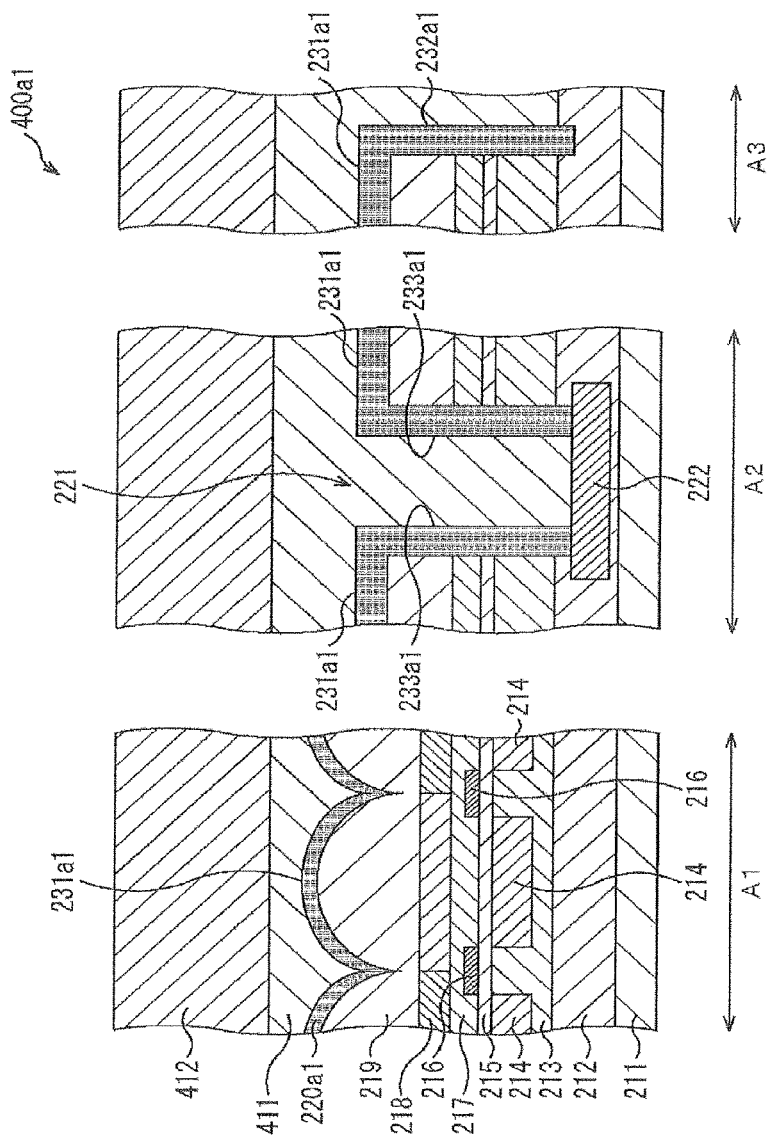
FIG. 24 is a cross-sectional view schematically illustrating a nineteenth embodiment of a chip forming a CMOS image sensor to which the present application is applied.

FIG. 24 is a cross-sectional view schematically illustrating a structure example of a semiconductor package 400a1 in which the chip 200a1 in FIG. 6 is packaged by the CSP. Note that in FIG. 24, parts corresponding to those in FIG. 6 are denoted by the same reference numerals, and a description thereof is omitted as necessary for avoiding repetition.

In the semiconductor package 400a1, a transparent sealing resin 411 is formed over a surface of the chip 200a1, and a glass substrate 412 is stacked over the transparent sealing resin 411. Accordingly, the chip 200a1 is protected from the external environment.

In a case where moisture enters the sealing resin 411, a component of an adhesive contained in the sealing resin 411 may be dissolved in the entering moisture, which may result in a degradation of the quality of the chip 200a1. However, as described above, a function of the protection film 220a1 prevents the entrance of moisture to surfaces of the photodiodes 214 and the color filter layer 218 in the chip 200a1, so that the degradation of the quality of the chip 200a1 is prevented.

22. Twentieth Embodiment

Figure 25:
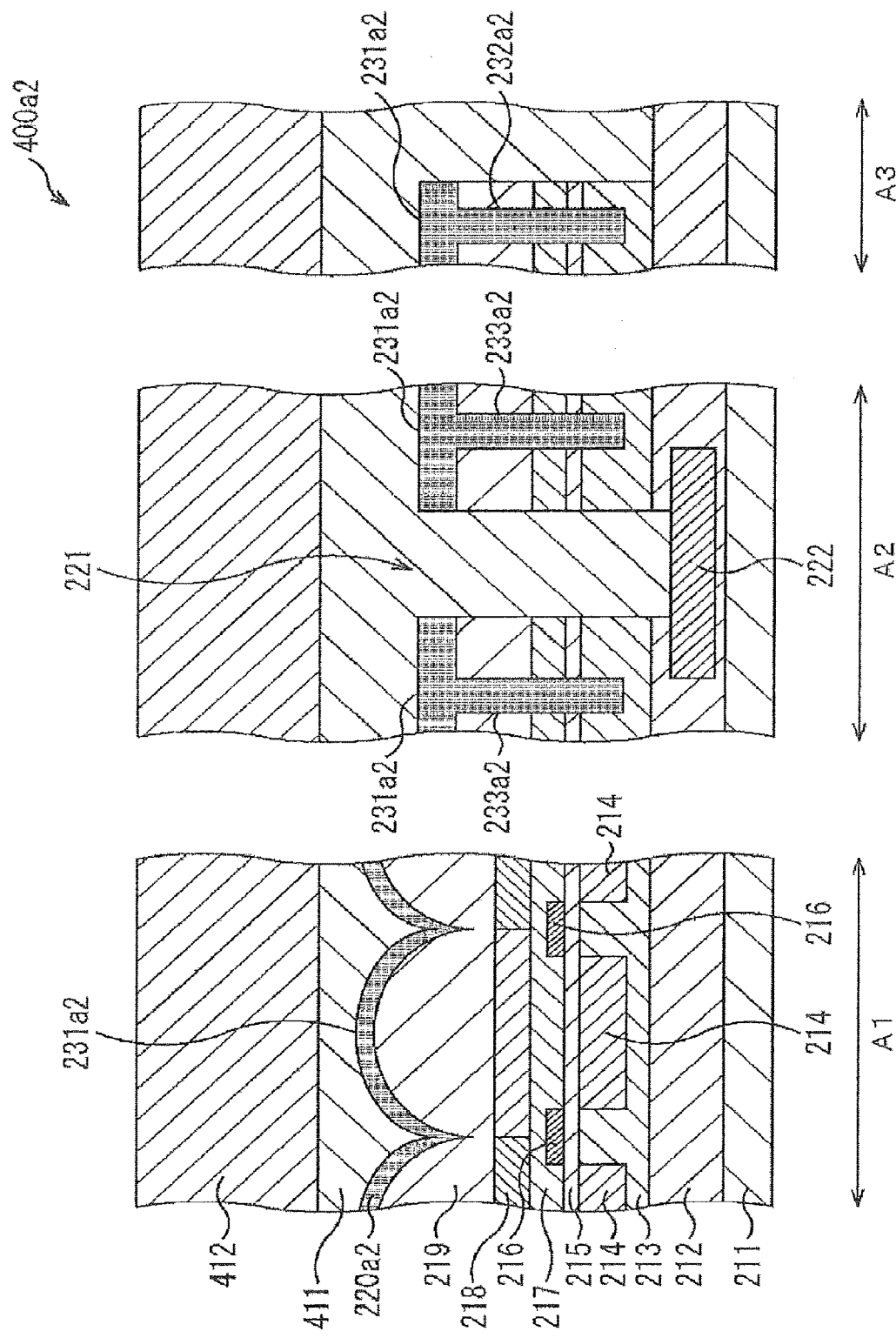
FIG. 25 is a cross-sectional view schematically illustrating a twentieth embodiment of a chip forming a CMOS image sensor to which the present application is applied.

FIG. 25 is a cross-sectional view schematically illustrating a structure example of a semiconductor package 400a2 in which the chip 200a2 in FIG. 7 is packaged by the CSP. Note that in FIG. 25, parts corresponding to those in FIG. 7 and FIG. 24 are denoted by the same reference numerals, and a description thereof is omitted as necessary for avoiding repetition.

In the semiconductor package 400a2, the transparent sealing resin 411 is formed over a surface of the chip 200a2, and the glass substrate 412 is stacked over the transparent sealing resin 411. Accordingly, the chip 200a2 is protected from the external environment. Further, a function of the protection film 220a2 prevents the quality of the chip 200a2 from being degraded by moisture entering the sealing resin 411.

23. Twenty-First Embodiment

Figure 26:
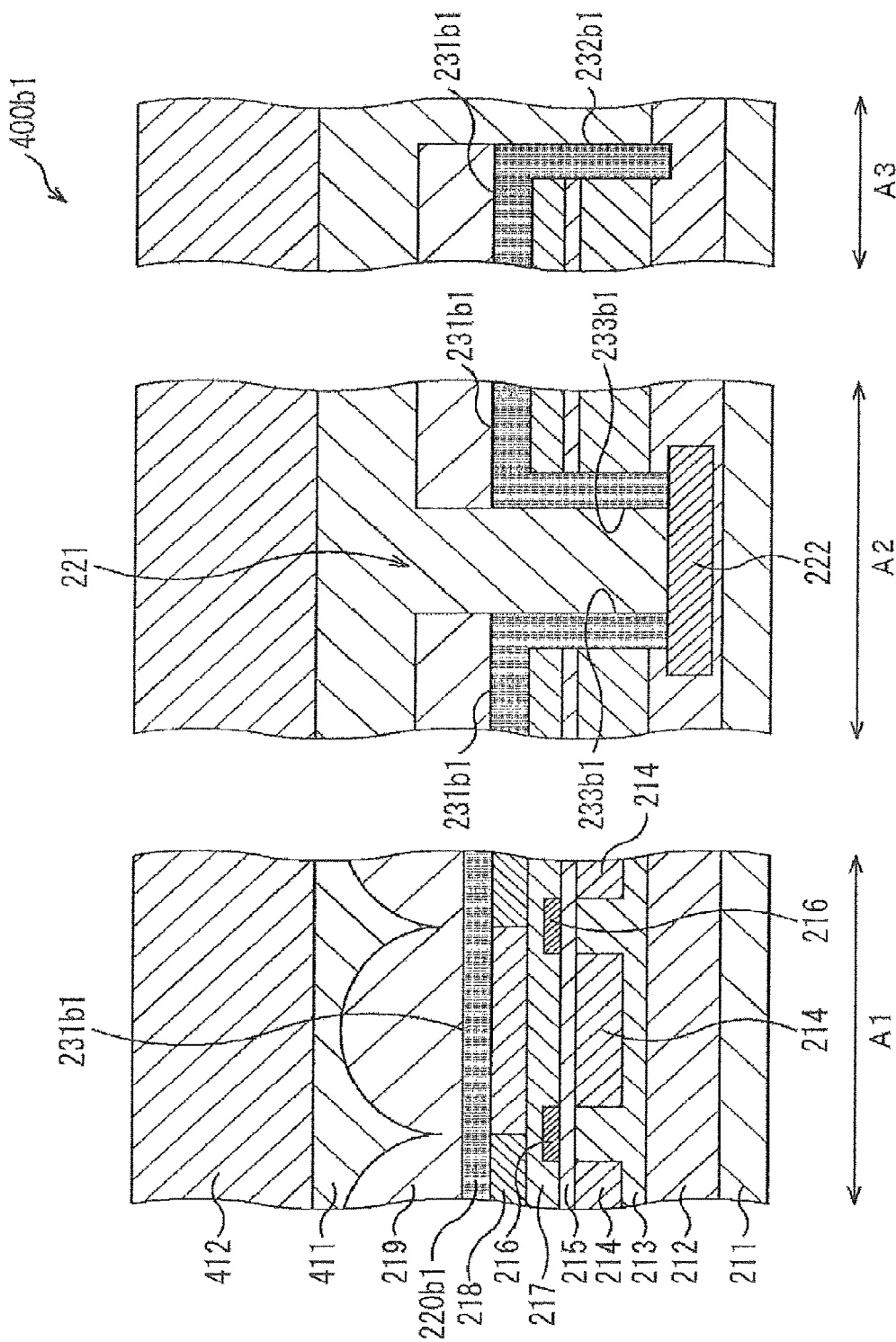
FIG. 26 is a cross-sectional view schematically illustrating a twenty-first embodiment of a chip forming a CMOS image sensor to which the present application is applied.

FIG. 26 is a cross-sectional view schematically illustrating a structure example of a semiconductor package 400b1 in which the chip 200b1 in FIG. 8 is packaged by the CSP. Note that in FIG. 26, parts corresponding to those in FIG. 8 and FIG. 24 are denoted by the same reference numerals, and a description thereof is omitted as necessary for avoiding repetition.

In the semiconductor package 400b1, the transparent sealing resin 411 is formed over a surface of the chip 200b1, and the glass substrate 412 is stacked over the transparent sealing resin 411. Accordingly, the chip 200b1 is protected from the external environment. Further, a function of the protection film 220b1 prevents the quality of the chip 200b1 from being degraded by moisture entering the sealing resin 411.

24. Twenty-Second Embodiment

Figure 27:
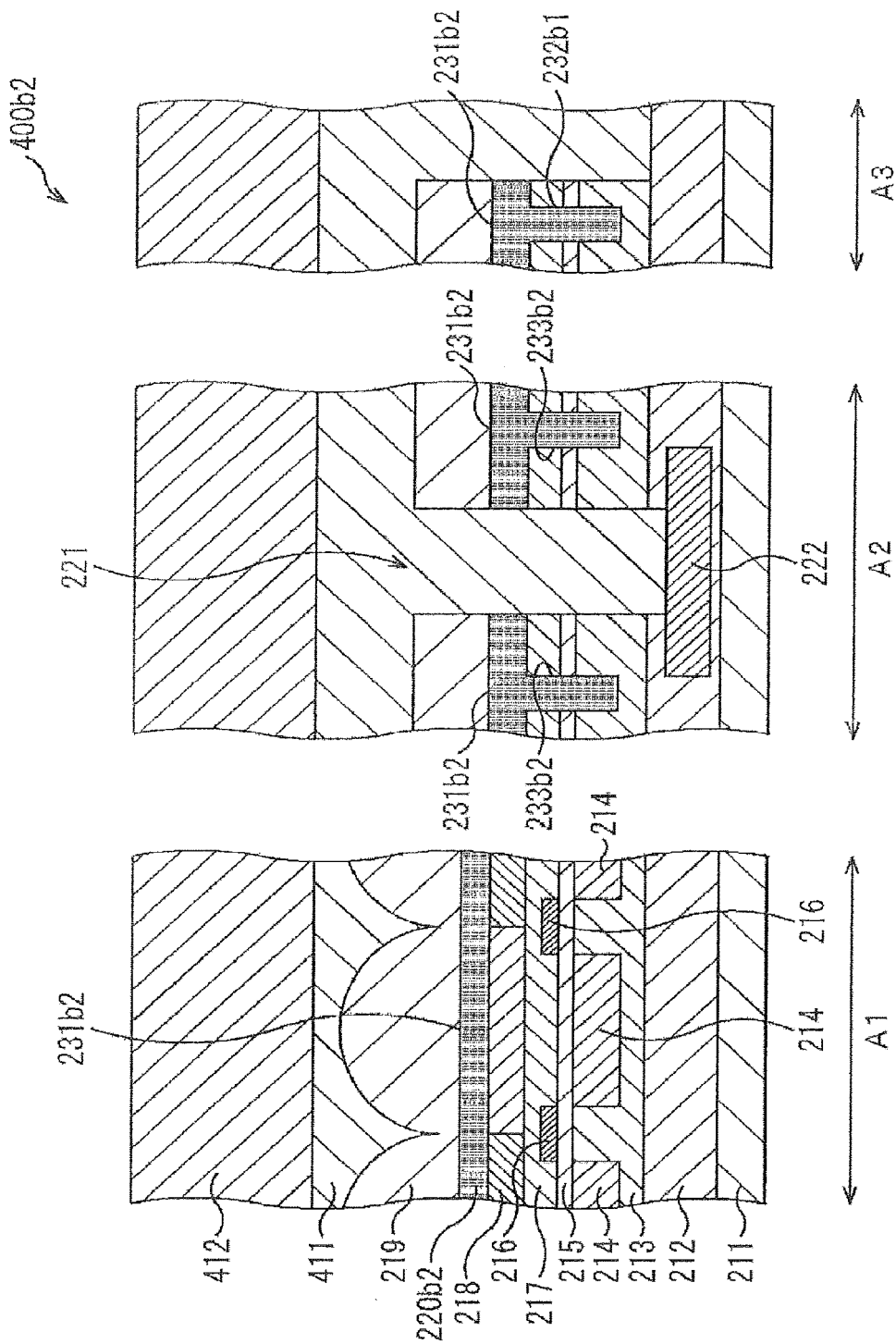
FIG. 27 is a cross-sectional view schematically illustrating a twenty-second embodiment of a chip forming a CMOS image sensor to which the present application is applied.

FIG. 27 is a cross-sectional view schematically illustrating a structure example of a semiconductor package 400b2 in which the chip 200b2 in FIG. 9 is packaged by the CSP. Note that in FIG. 27, parts corresponding to those in FIG. 9 and FIG. 24 are denoted by the same reference numerals, and a description thereof is omitted as necessary for avoiding repetition.

In the semiconductor package 400b2, the transparent sealing resin 411 is formed over a surface of the chip 200b2, and the glass substrate 412 is stacked over the transparent sealing resin 411. Accordingly, the chip 200b2 is protected from the external environment. Further, a function of the protection film 220b2 prevents the quality of the chip 200b2 from being degraded by moisture entering the sealing resin 411.

25. Twenty-Third Embodiment

Figure 28:
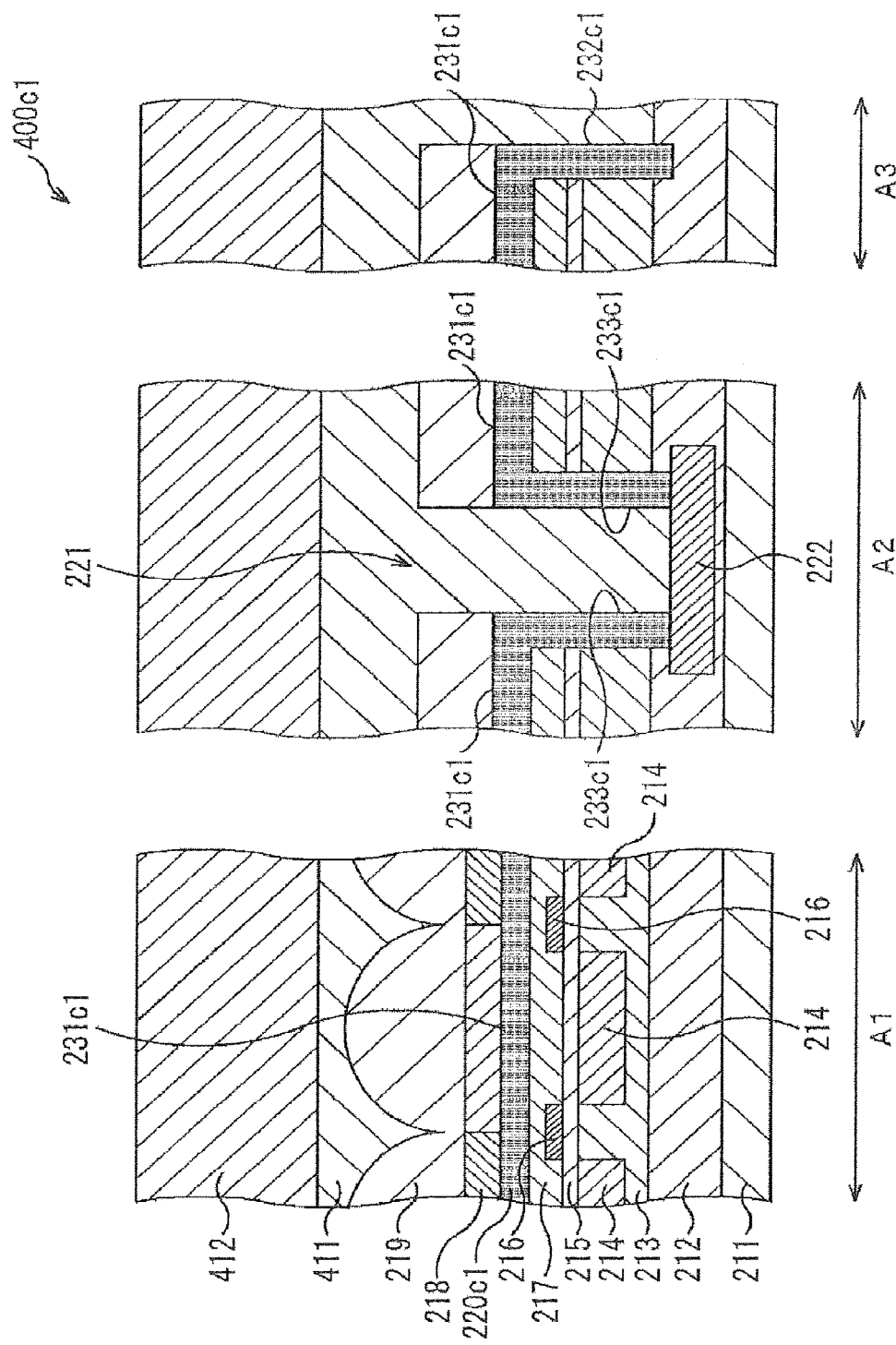
FIG. 28 is a cross-sectional view schematically illustrating a twenty-third embodiment of a chip forming a CMOS image sensor to which the present application is applied.

FIG. 28 is a cross-sectional view schematically illustrating a structure example of a semiconductor package 400c1 in which the chip 200c1 in FIG. 10 is packaged by the CSP. Note that in FIG. 28, parts corresponding to those in FIG. 10 and FIG. 24 are denoted by the same reference numerals, and a description thereof is omitted as necessary for avoiding repetition.

In the semiconductor package 400c1, the transparent sealing resin 411 is formed over a surface of the chip 200c1, and the glass substrate 412 is stacked over the transparent sealing resin 411. Accordingly, the chip 200c1 is protected from the external environment. Further, a function of the protection film 220c1 prevents the quality of the chip 200c1 from being degraded by moisture entering the sealing resin 411.

26. Twenty-Fourth Embodiment

Figure 29:
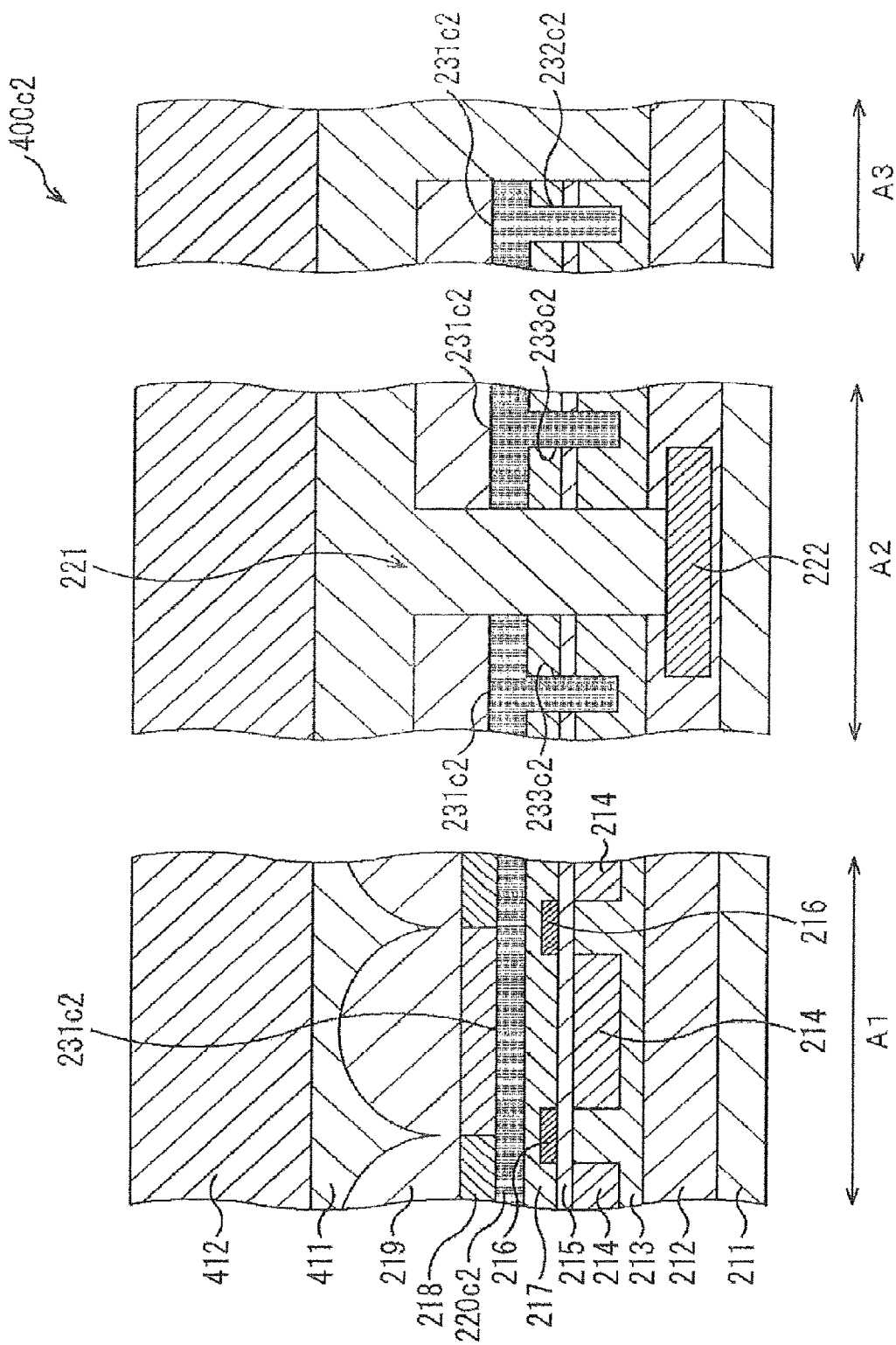
FIG. 29 is a cross-sectional view schematically illustrating a twenty-fourth embodiment of a chip forming a CMOS image sensor to which the present application is applied.

FIG. 29 is a cross-sectional view schematically illustrating a structure example of a semiconductor package 400c2 in which the chip 200c2 in FIG. 11 is packaged by the CSP. Note that in FIG. 29, parts corresponding to those in FIG. 11 and FIG. 24 are denoted by the same reference numerals, and a description thereof is omitted as necessary for avoiding repetition.

In the semiconductor package 400c2, the transparent sealing resin 411 is formed over a surface of the chip 200c2, and the glass substrate 412 is stacked over the transparent sealing resin 411. Accordingly, the chip 200c2 is protected from the external environment. Further, a function of the protection film 220c2 prevents the quality of the chip 200c2 from being degraded by moisture entering the sealing resin 411.

27. Twenty-Fifth Embodiment

Figure 30:
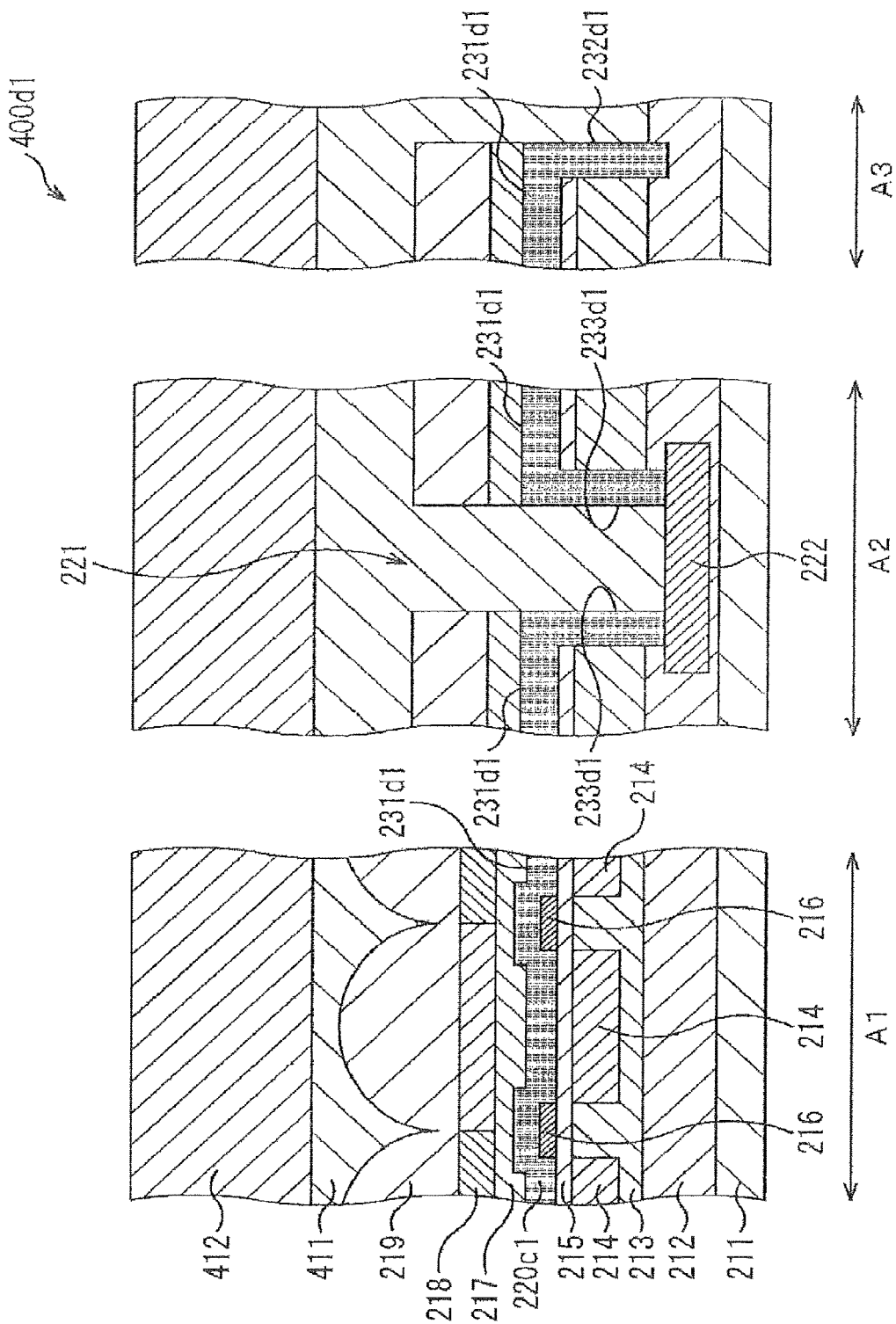
FIG. 30 is a cross-sectional view schematically illustrating a twenty-fifth embodiment of a chip forming a CMOS image sensor to which the present application is applied.

FIG. 30 is a cross-sectional view schematically illustrating a structure example of a semiconductor package 400d1 in which the chip 200d1 in FIG. 12 is packaged by the CSP. Note that in FIG. 30, parts corresponding to those in FIG. 12 and FIG. 24 are denoted by the same reference numerals, and a description thereof is omitted as necessary for avoiding repetition.

In the semiconductor package 400d1, the transparent sealing resin 411 is formed over a surface of the chip 200d1, and the glass substrate 412 is stacked over the transparent sealing resin 411. Accordingly, the chip 200d1 is protected from the external environment. Further, a function of the protection film 220d1 prevents the quality of the chip 200d1 from being degraded by moisture entering the sealing resin 411.

28. Twenty-Sixth Embodiment

Figure 31:
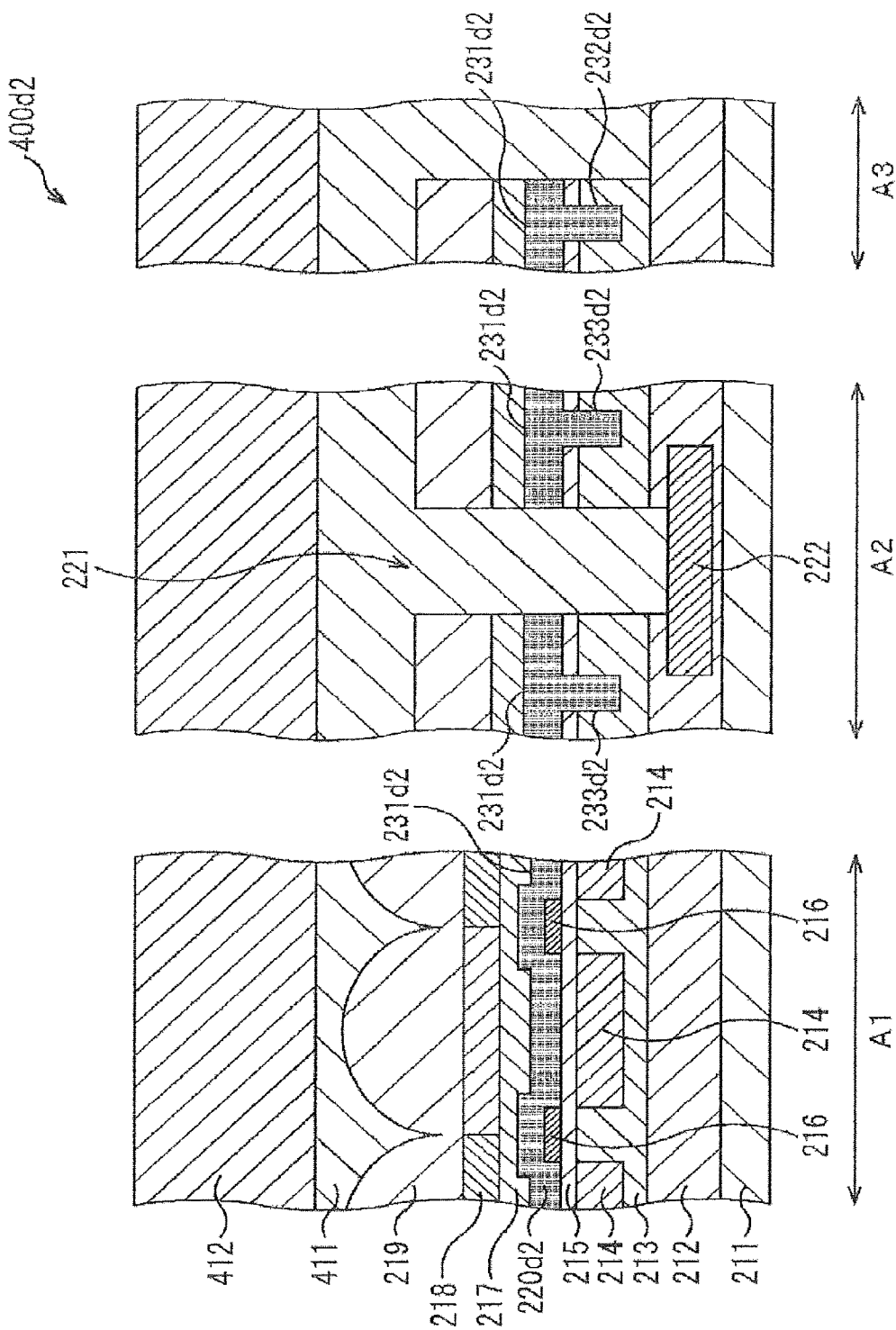
FIG. 31 is a cross-sectional view schematically illustrating a twenty-sixth embodiment of a chip forming a CMOS image sensor to which the present application is applied.

FIG. 31 is a cross-sectional view schematically illustrating a structure example of a semiconductor package 400d2 in which the chip 200d2 in FIG. 13 is packaged by the CSP. Note that in FIG. 31, parts corresponding to those in FIG. 13 and FIG. 24 are denoted by the same reference numerals, and a description thereof is omitted as necessary for avoiding repetition.

In the semiconductor package 400d2, the transparent sealing resin 411 is formed over a surface of the chip 200d2, and the glass substrate 412 is stacked over the transparent sealing resin 411. Accordingly, the chip 200d2 is protected from the external environment. Further, a function of the protection film 220d2 prevents the quality of the chip 200d2 from being degraded by moisture entering the sealing resin 411.

29. Twenty-Seventh Embodiment

Figure 32:
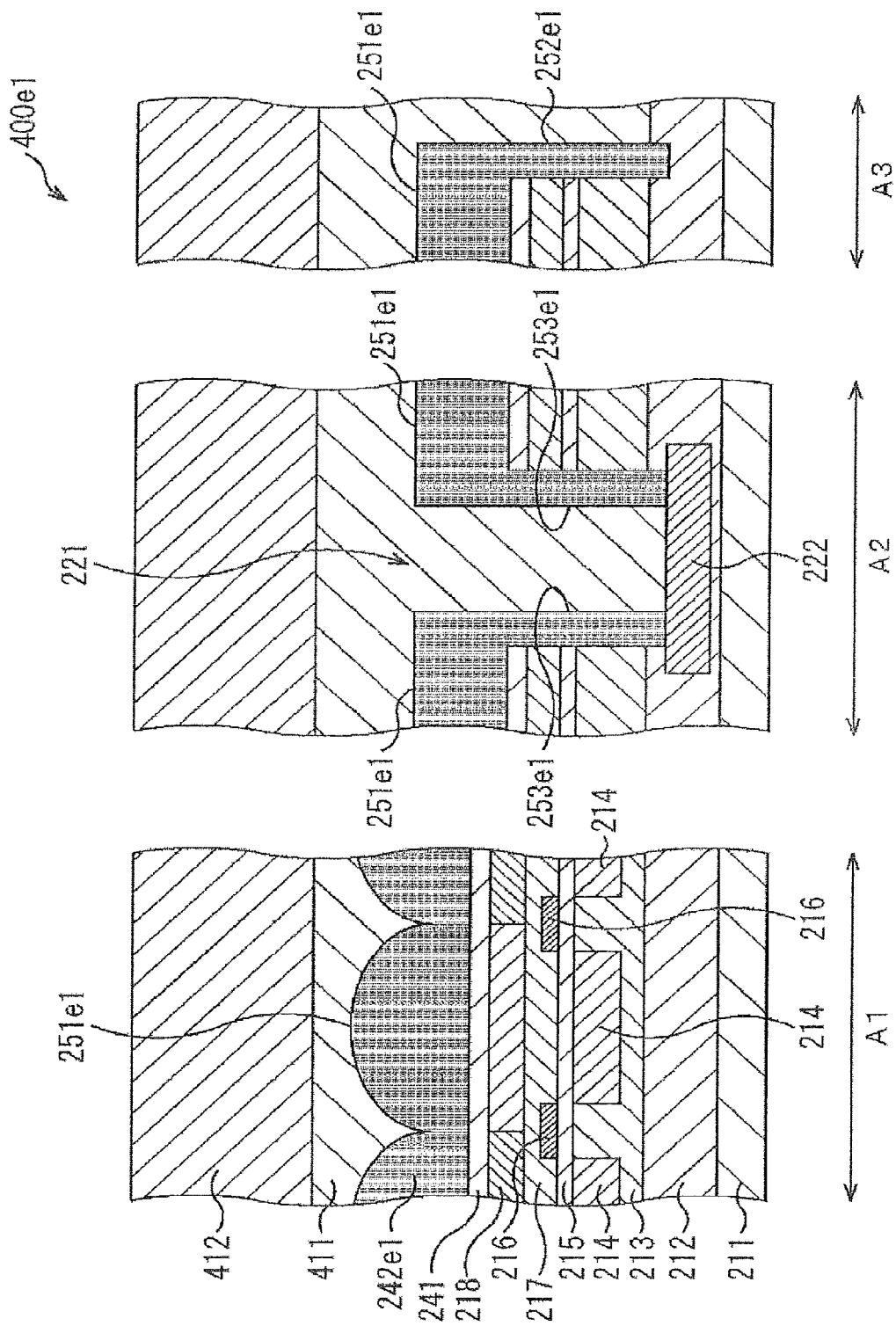
FIG. 32 is a cross-sectional view schematically illustrating a twenty-seventh embodiment of a chip forming a CMOS image sensor to which the present application is applied.

FIG. 32 is a cross-sectional view schematically illustrating a structure example of a semiconductor package 400e1 in which the chip 200e1 in FIG. 14 is packaged by the CSP. Note that in FIG. 32, parts corresponding to those in FIG. 14 and FIG. 24 are denoted by the same reference numerals, and a description thereof is omitted as necessary for avoiding repetition.

In the semiconductor package 400e1, the transparent sealing resin 411 is formed over a surface of the chip 200e1, and the glass substrate 412 is stacked over the transparent sealing resin 411. Accordingly, the chip 200e1 is protected from the external environment. Further, a function of the microlens protection film 242e1 prevents the quality of the chip 200e1 from being degraded by moisture entering the sealing resin 411.

30. Twenty-Eighth Embodiment

Figure 33:
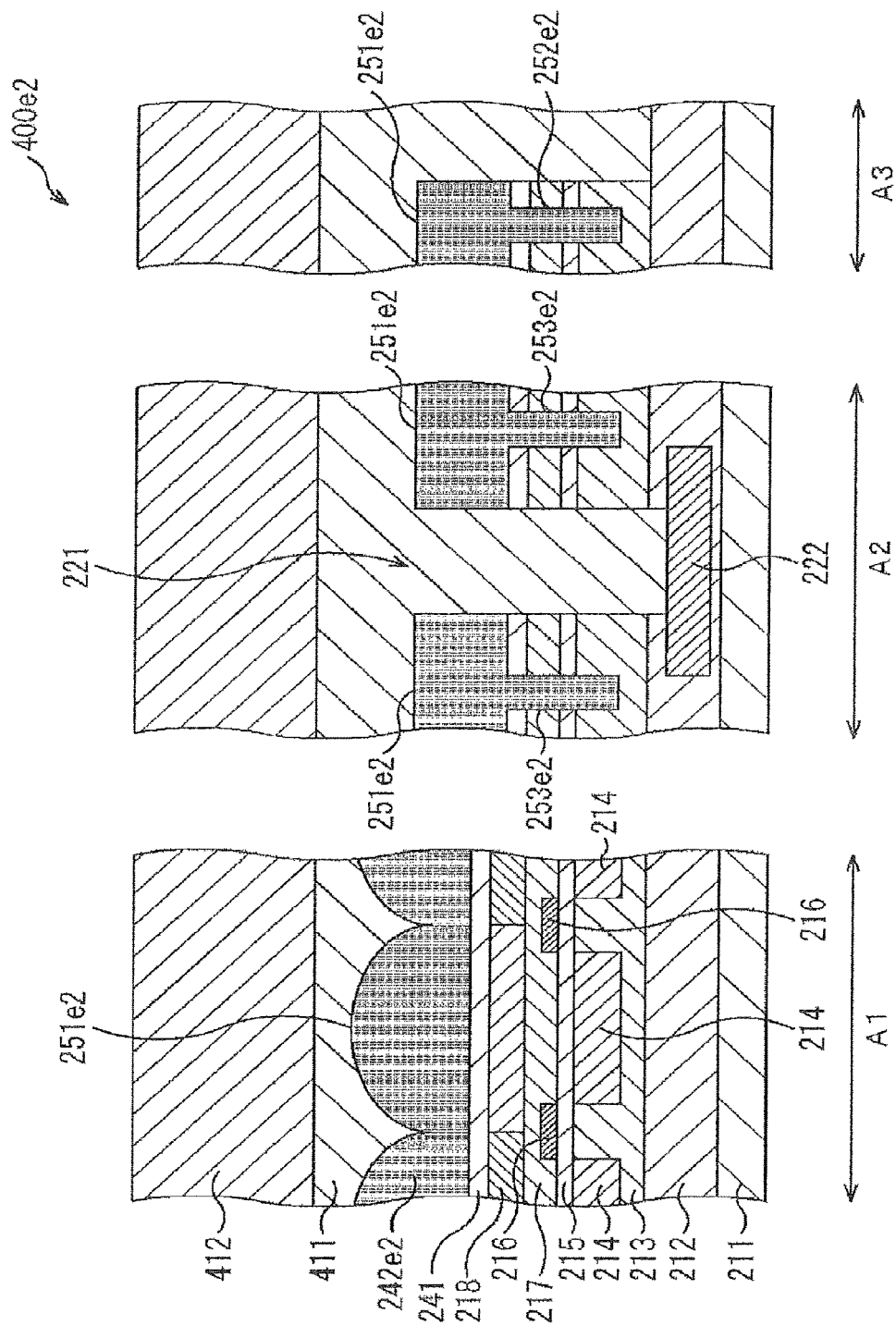
FIG. 33 is a cross-sectional view schematically illustrating a twenty-eighth embodiment of a chip forming a CMOS image sensor to which the present application is applied.

FIG. 33 is a cross-sectional view schematically illustrating a structure example of a semiconductor package 400e2 in which the chip 200e2 in FIG. 15 is packaged by the CSP. Note that in FIG. 33, parts corresponding to those in FIG. 15 and FIG. 24 are denoted by the same reference numerals, and a description thereof is omitted as necessary for avoiding repetition.

In the semiconductor package 400e2, the transparent sealing resin 411 is formed over a surface of the chip 200e2, and the glass substrate 412 is stacked over the transparent sealing resin 411. Accordingly, the chip 200e2 is protected from the external environment. Further, a function of the microlens protection film 242e2 prevents the quality of the chip 200e2 from being degraded by moisture entering the sealing resin 411.

31. Twenty-Ninth Embodiment

Figure 34:
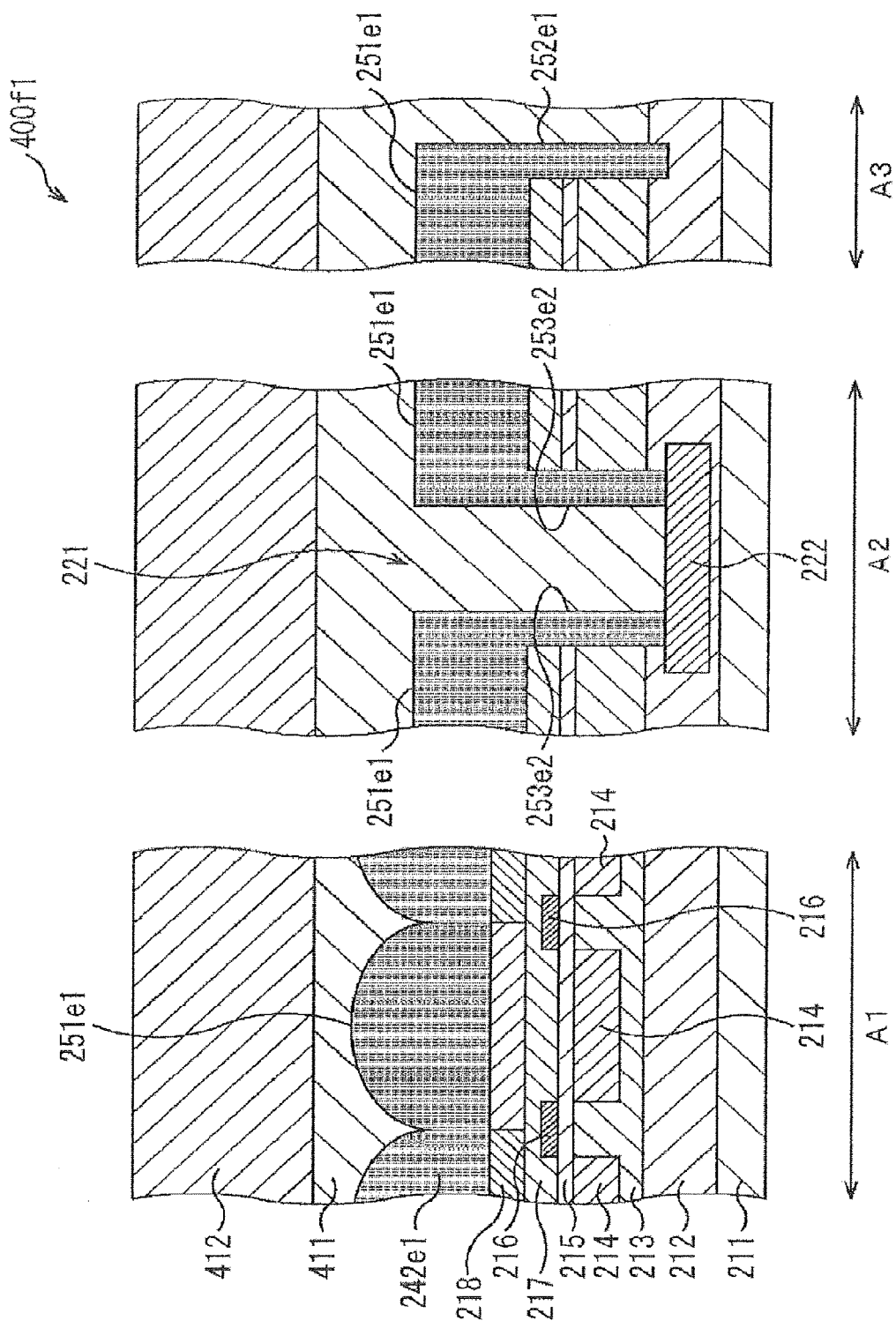
FIG. 34 is a cross-sectional view schematically illustrating a twenty-ninth embodiment of a chip forming a CMOS image sensor to which the present application is applied.

FIG. 34 is a cross-sectional view schematically illustrating a structure example of a semiconductor package 400f1 in which the chip 200f1 in FIG. 16 is packaged by the CSP. Note that in FIG. 34, parts corresponding to those in FIG. 16 and FIG. 24 are denoted by the same reference numerals, and a description thereof is omitted as necessary for avoiding repetition.

In the semiconductor package 400f1, the transparent sealing resin 411 is formed over a surface of the chip 200f1, and the glass substrate 412 is stacked over the transparent sealing resin 411. Accordingly, the chip 200f1 is protected from the external environment. Further, a function of the microlens protection film 242e1 prevents the quality of the chip 200f1 from being degraded by moisture entering the sealing resin 411.

32. Thirtieth Embodiment

Figure 35:
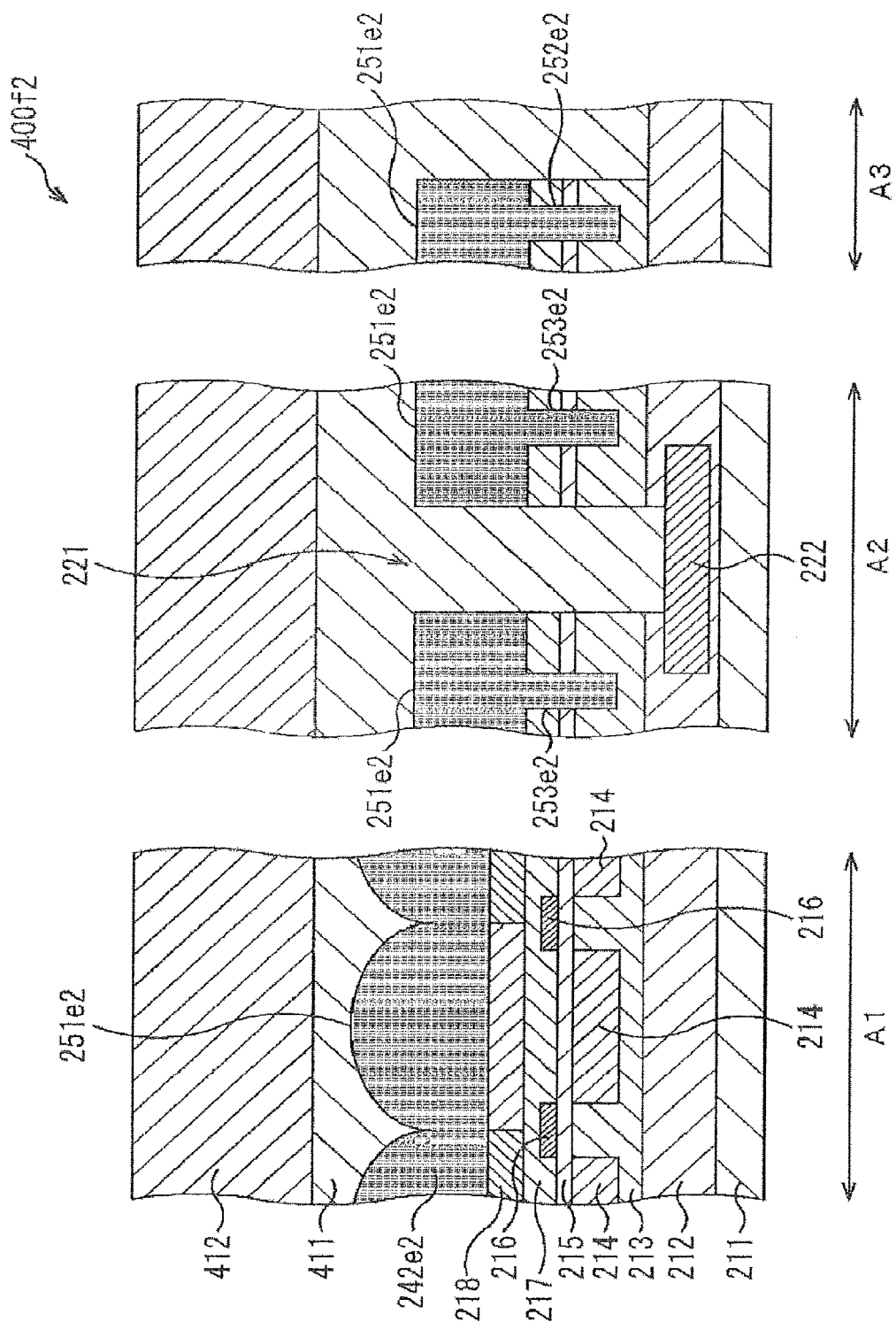
FIG. 35 is a cross-sectional view schematically illustrating a thirtieth embodiment of a chip forming a CMOS image sensor to which the present application is applied.

FIG. 35 is a cross-sectional view schematically illustrating a structure example of a semiconductor package 400f2 in which the chip 200f2 in FIG. 17 is packaged by the CSP. Note that in FIG. 35, parts corresponding to those in FIG. 17 and FIG. 24 are denoted by the same reference numerals, and a description thereof is omitted as necessary for avoiding repetition.

In the semiconductor package 400f2, the transparent sealing resin 411 is formed over a surface of the chip 200f2, and the glass substrate 412 is stacked over the transparent sealing resin 411. Accordingly, the chip 200f2 is protected from the external environment. Further, a function of the microlens protection film 242e2 prevents the quality of the chip 200f2 from being degraded by moisture entering the sealing resin 411.

33. Thirty-First Embodiment

Figure 36:
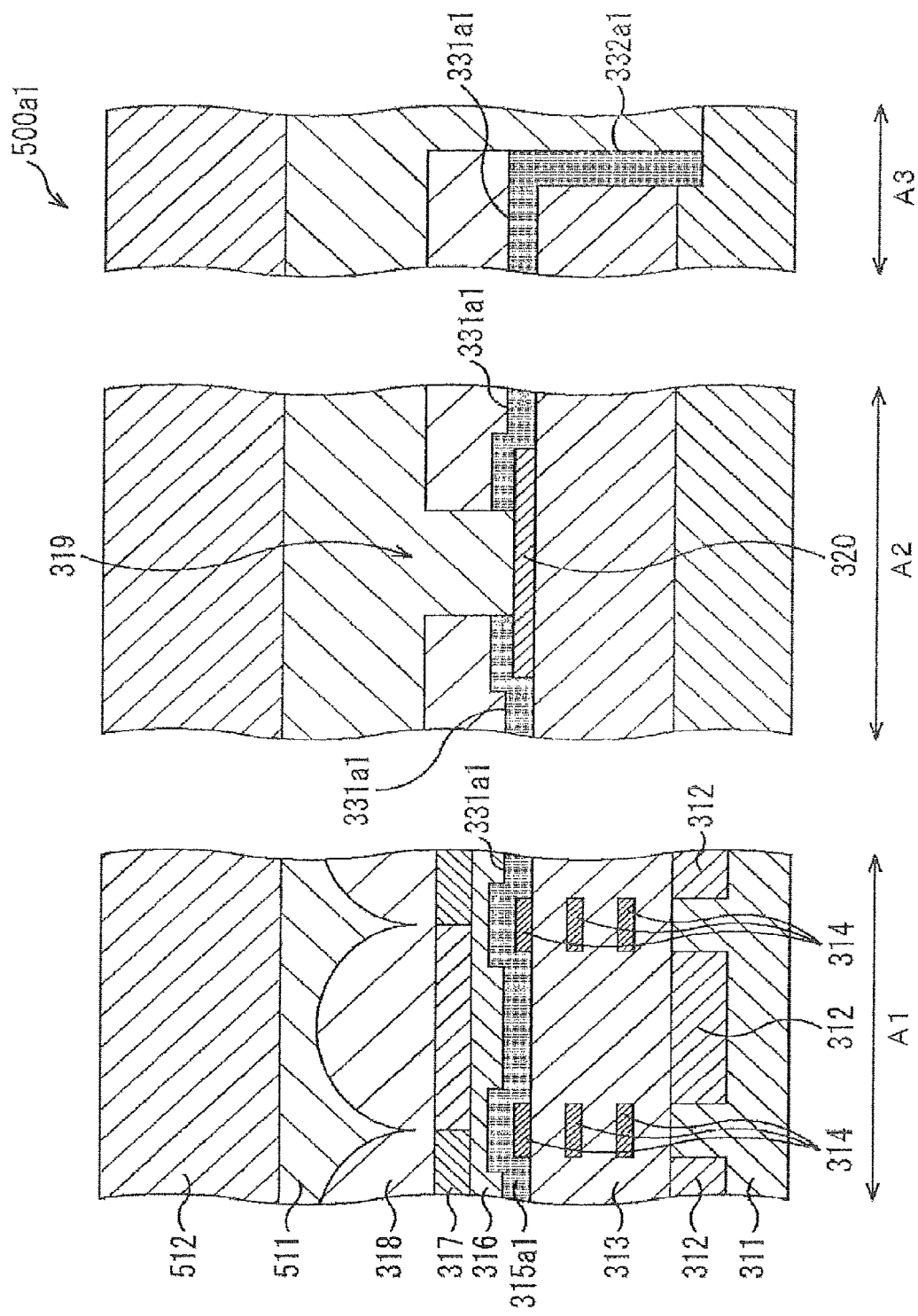
FIG. 36 is a cross-sectional view schematically illustrating a thirty-first embodiment of a chip forming a CMOS image sensor to which the present application is applied.

FIG. 36 is a cross-sectional view schematically illustrating a structure example of a semiconductor package 500a1 in which the chip 300a1 in FIG. 18 is packaged by the CSP. Note that in FIG. 36, parts corresponding to those in FIG. 18 are denoted by the same reference numerals, and a description thereof is omitted as necessary for avoiding repetition.

In the semiconductor package 500a1, a transparent sealing resin 511 is formed over a surface of the chip 300a1, and a glass substrate 512 is stacked over the transparent sealing resin 511. Accordingly, the chip 300a1 is protected from the external environment. Further, a function of the protection film 315a1 prevents the quality of the chip 300a1 from being degraded by moisture entering the sealing resin 511.

34. Thirty-Second Embodiment

Figure 37:
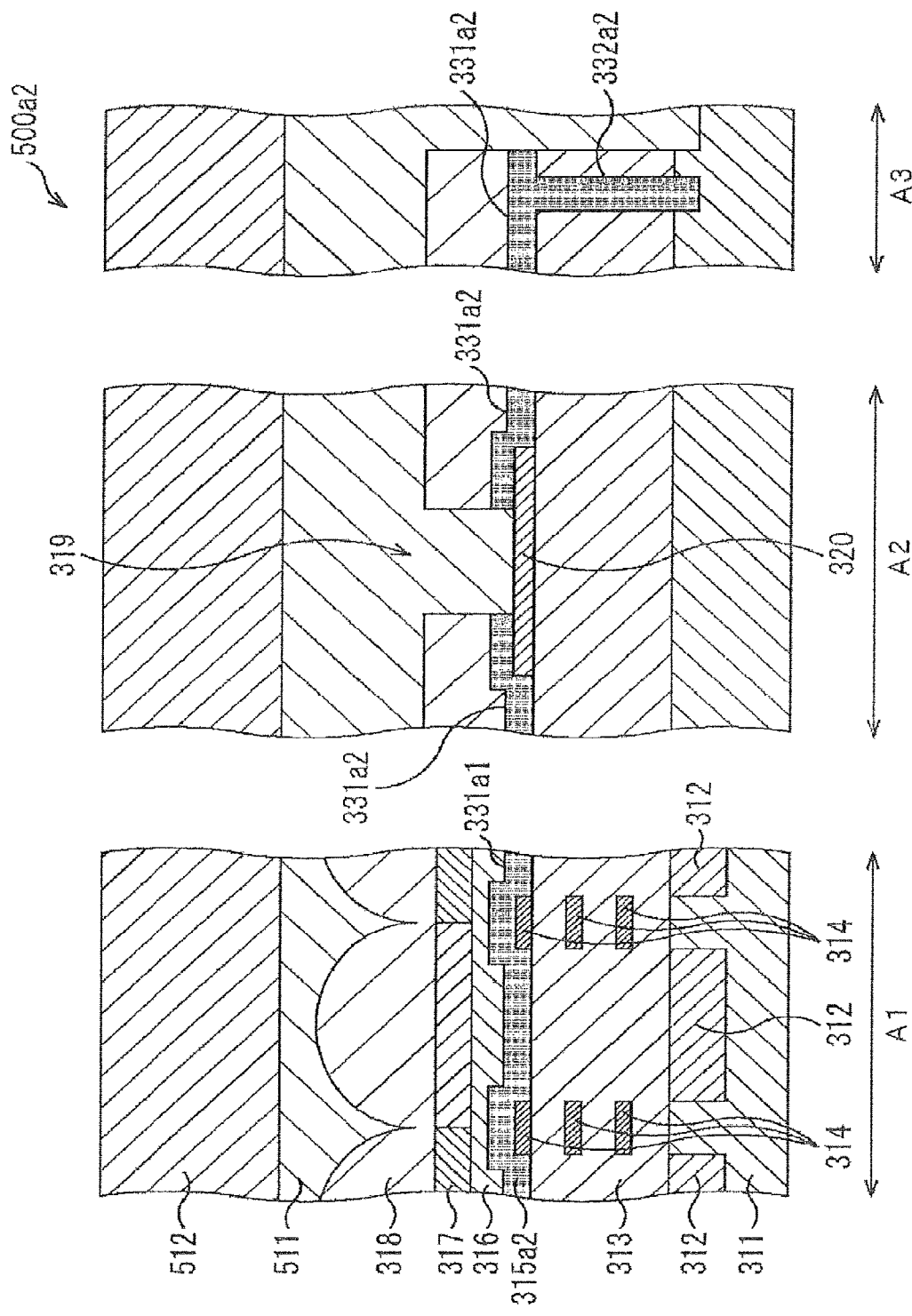
FIG. 37 is a cross-sectional view schematically illustrating a thirty-second embodiment of a chip forming a CMOS image sensor to which the present application is applied.

FIG. 37 is a cross-sectional view schematically illustrating a structure example of a semiconductor package 500a2 in which the chip 300a2 in FIG. 19 is packaged by the CSP. Note that in FIG. 37, parts corresponding to those in FIG. 19 and FIG. 36 are denoted by the same reference numerals, and a description thereof is omitted as necessary for avoiding repetition.

In the semiconductor package 500a2, the transparent sealing resin 511 is formed over a surface of the chip 300a2, and the glass substrate 512 is stacked over the transparent sealing resin 511. Accordingly, the chip 300a2 is protected from the external environment. Further, a function of the protection film 315a2 prevents the quality of the chip 300a2 from being degraded by moisture entering the sealing resin 511.

35. Thirty-Third Embodiment

Figure 38:
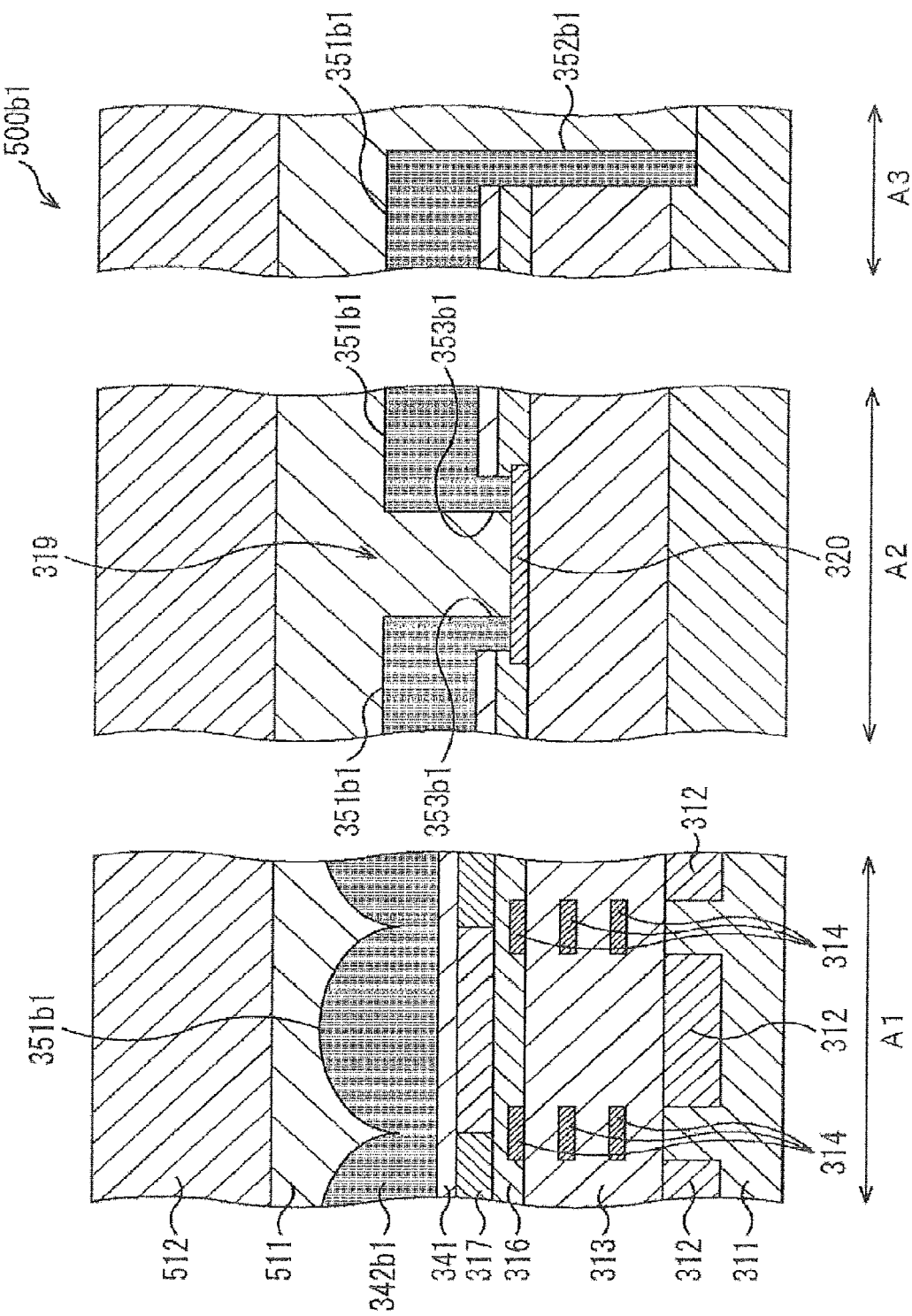
FIG. 38 is a cross-sectional view schematically illustrating a thirty-third embodiment of a chip forming a CMOS image sensor to which the present application is applied.

FIG. 38 is a cross-sectional view schematically illustrating a structure example of a semiconductor package 500b1 in which the chip 300b1 in FIG. 20 is packaged by the CSP. Note that in FIG. 38, parts corresponding to those in FIG. 20 and FIG. 36 are denoted by the same reference numerals, and a description thereof is omitted as necessary for avoiding repetition.

In the semiconductor package 500b1, the transparent sealing resin 511 is formed over a surface of the chip 300b1, and the glass substrate 512 is stacked over the transparent sealing resin 511. Accordingly, the chip 300b1 is protected from the external environment. Further, a function of the microlens protection film 342b1 prevents the quality of the chip 300b1 from being degraded by moisture entering the sealing resin 511.

36. Thirty-Fourth Embodiment

Figure 39:
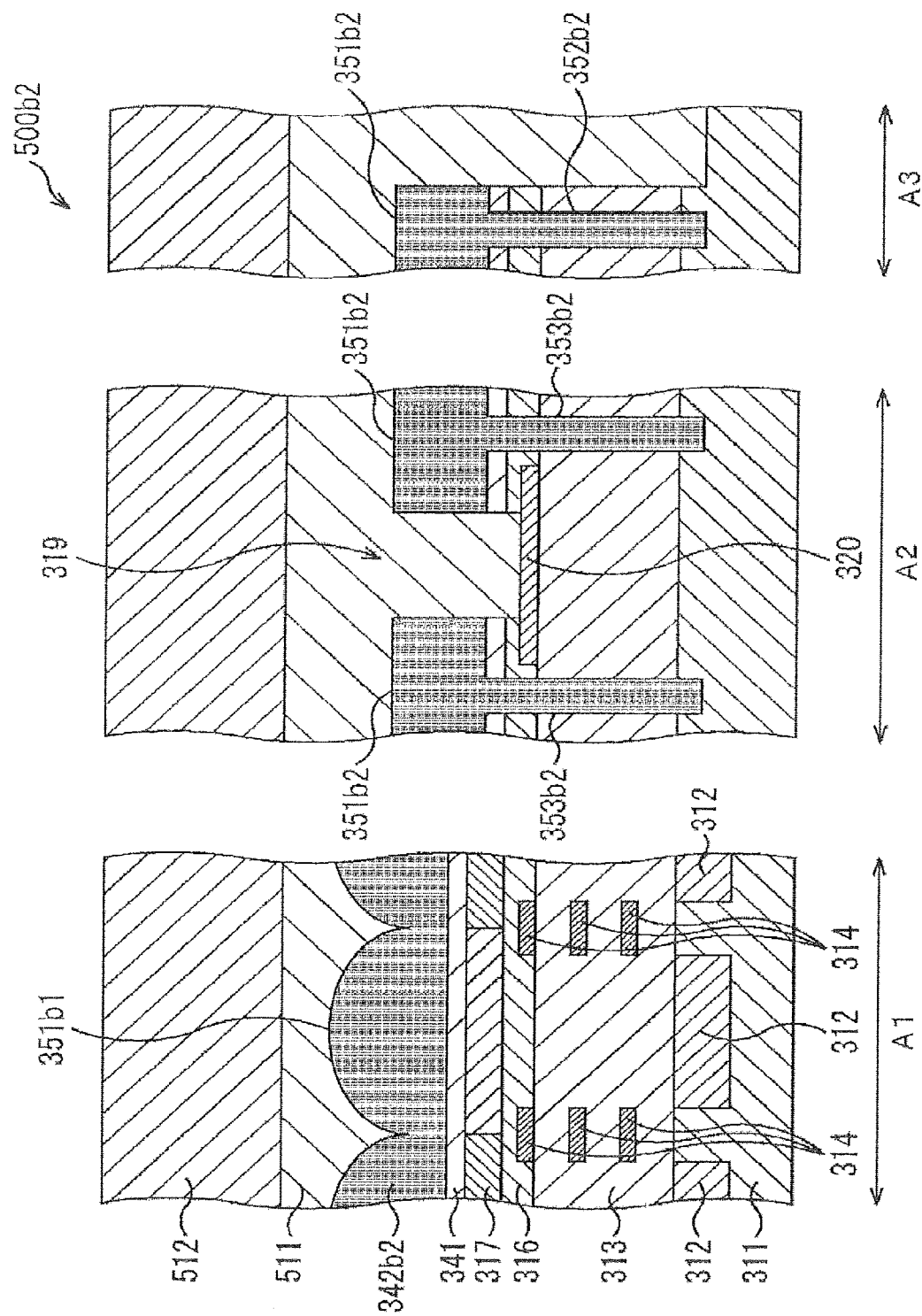
FIG. 39 is a cross-sectional view schematically illustrating a thirty-fourth embodiment of a chip forming a CMOS image sensor to which the present application is applied.

FIG. 39 is a cross-sectional view schematically illustrating a structure example of a semiconductor package 500b2 in which the chip 300b2 in FIG. 21 is packaged by the CSP. Note that in FIG. 39, parts corresponding to those in FIG. 21 and FIG. 36 are denoted by the same reference numerals, and a description thereof is omitted as necessary for avoiding repetition.

In the semiconductor package 500b2, the transparent sealing resin 511 is formed over a surface of the chip 300b2, and the glass substrate 512 is stacked over the transparent sealing resin 511. Accordingly, the chip 300b2 is protected from the external environment. Further, a function of the microlens protection film 342b2 prevents the quality of the chip 300b2 from being degraded by moisture entering the sealing resin 511.

37. Thirty-Fifth Embodiment

Figure 40:
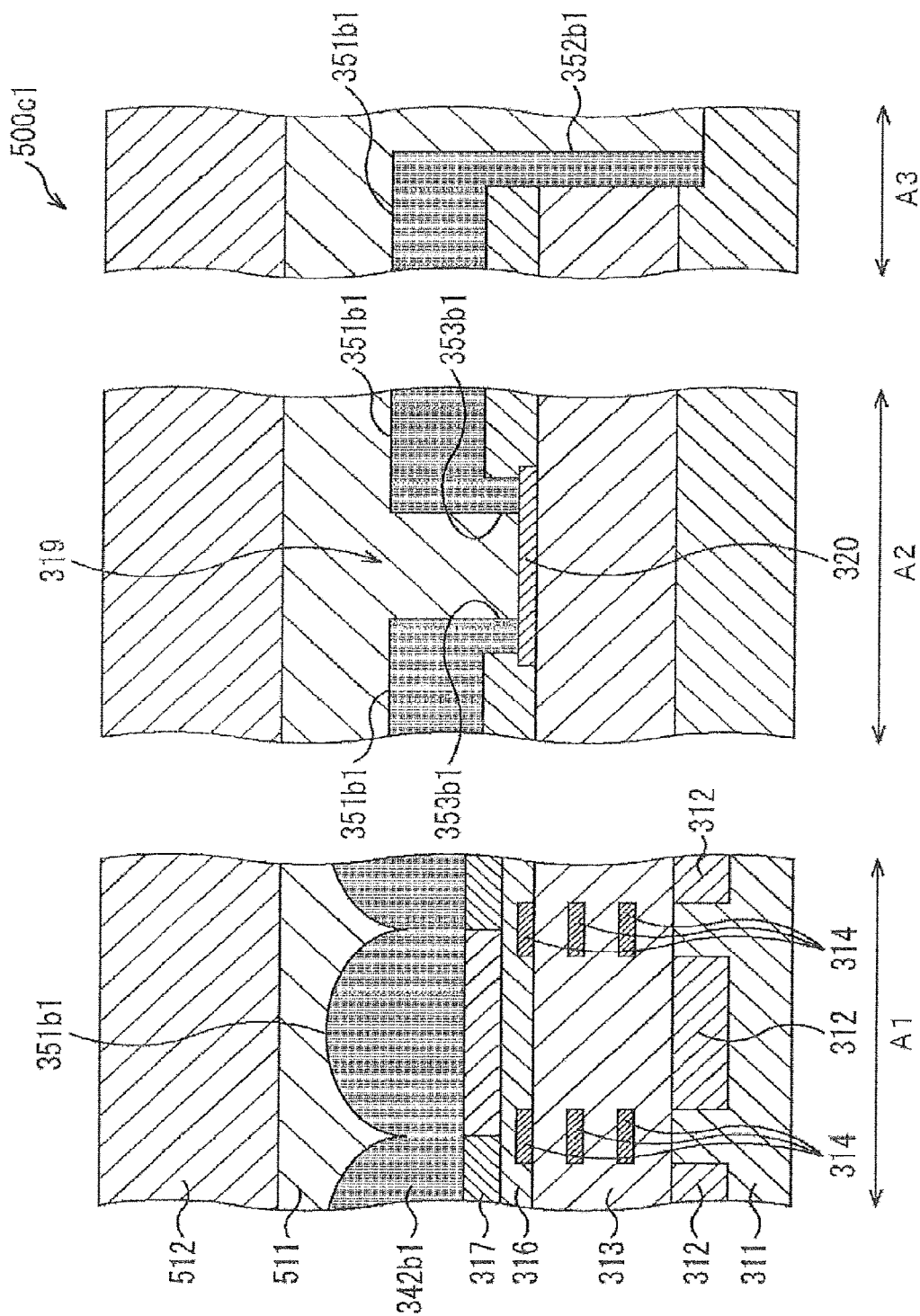
FIG. 40 is a cross-sectional view schematically illustrating a thirty-fifth embodiment of a chip forming a CMOS image sensor to which the present application is applied.
Figure 44:
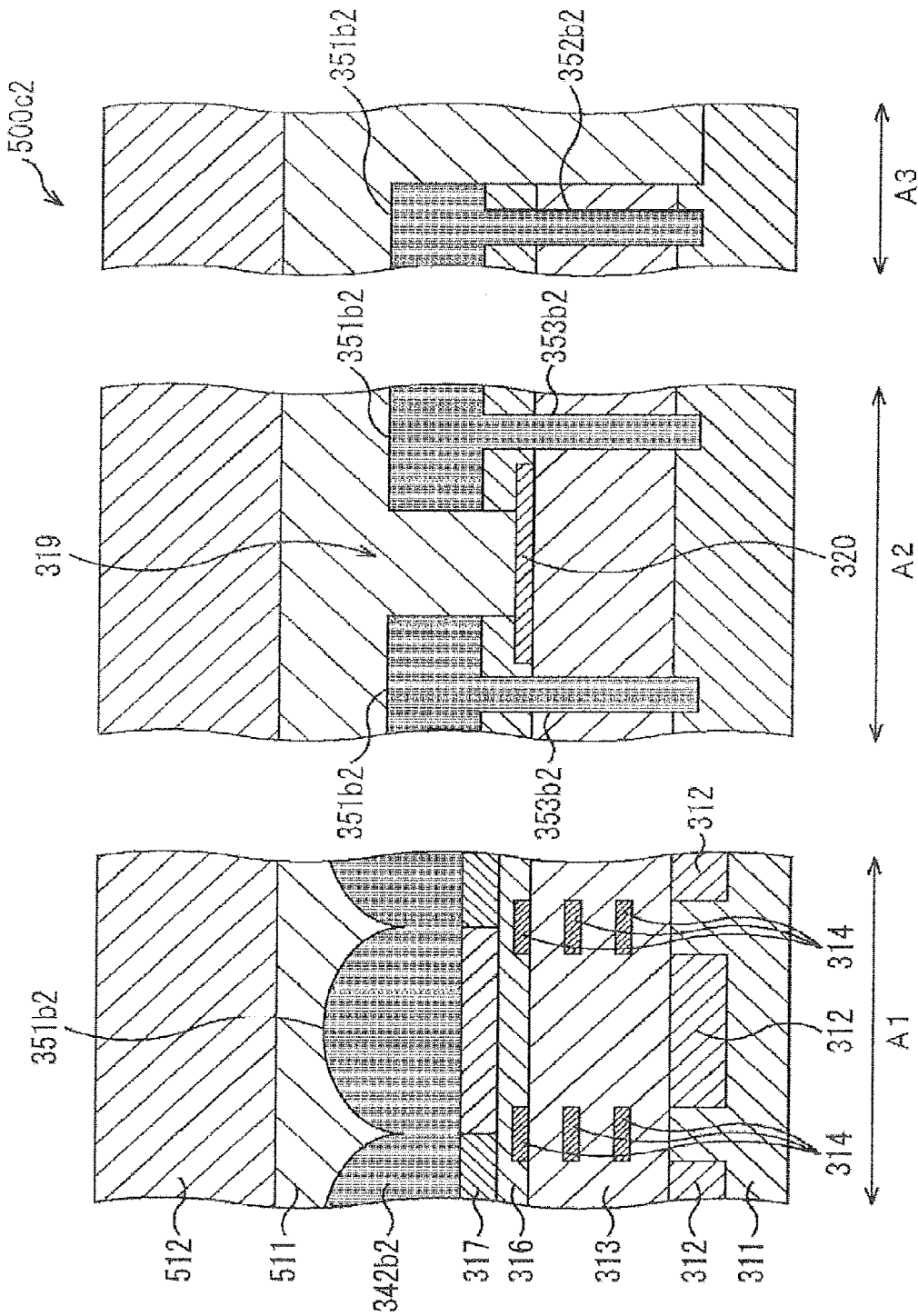

FIG. 40 is a cross-sectional view schematically illustrating a structure example of a semiconductor package 500c1 in which the chip 300c1 in FIG. 22 is packaged by the CSP. Note that in FIG. 40, parts corresponding to those in FIG. 22 and FIG. 36 are denoted by the same reference numerals, and a description thereof is omitted as necessary for avoiding repetition.

In the semiconductor package 500c1, the transparent sealing resin 511 is formed over a surface of the chip 300c1, and the glass substrate 512 is stacked over the transparent sealing resin 511. Accordingly, the chip 300c1 is protected from the external environment. Further, a function of the microlens protection film 342b1 prevents the quality of the chip 300c1 from being degraded by moisture entering the sealing resin 511.

38. Thirty-Sixth Embodiment

FIG. 41 is a cross-sectional view schematically illustrating a structure example of a semiconductor package 500c2 in which the chip 300c2 in FIG. 23 is packaged by the CSP. Note that in FIG. 41, parts corresponding to those in FIG. 23 and FIG. 36 are denoted by the same reference numerals, and a description thereof is omitted as necessary for avoiding repetition.

In the semiconductor package 500c2, the transparent sealing resin 511 is formed over a surface of the chip 300c2, and the glass substrate 512 is stacked over the transparent sealing resin 511. Accordingly, the chip 300c2 is protected from the external environment. Further, a function of the microlens protection film 342b2 prevents the quality of the chip 300c2 from being degraded by moisture entering the sealing resin 511.

39. Modulation Examples

Modulation examples of the above-described embodiments of the present application will be described below.

Although the above description shows the examples in which the present application is applied to the CMOS image sensors, for example, the present application can also be applied to other types of solid-state imaging devices, such as CCD image sensors.

Further, although the above description shows the examples in which SiN is used for the protection film or the microlens protection film, it is also possible to use another material that satisfies conditions of electrical characteristics, optical characteristics, durability, and the like, and is transparent and has a water-proofing property.

Furthermore, the present application can be applied also to a case where a chip is packaged by a method other than the CSP.

40. Electronic Devices (Imaging Devices)

The present application is not restrictedly applied to solid-state imaging devices, but can be applied to general electronic devices using solid-state imaging devices in image capturing parts (photoelectric conversion parts), such as imaging devices (e.g., digital still cameras and video cameras), mobile terminal devices having imaging functions (e.g., mobile phones), and photocopiers using solid-state imaging devices in image scanning parts. Note that there can be a case where the imaging device is a module-like mode mounted on an electronic device, i.e., a camera module.

Figure 42:
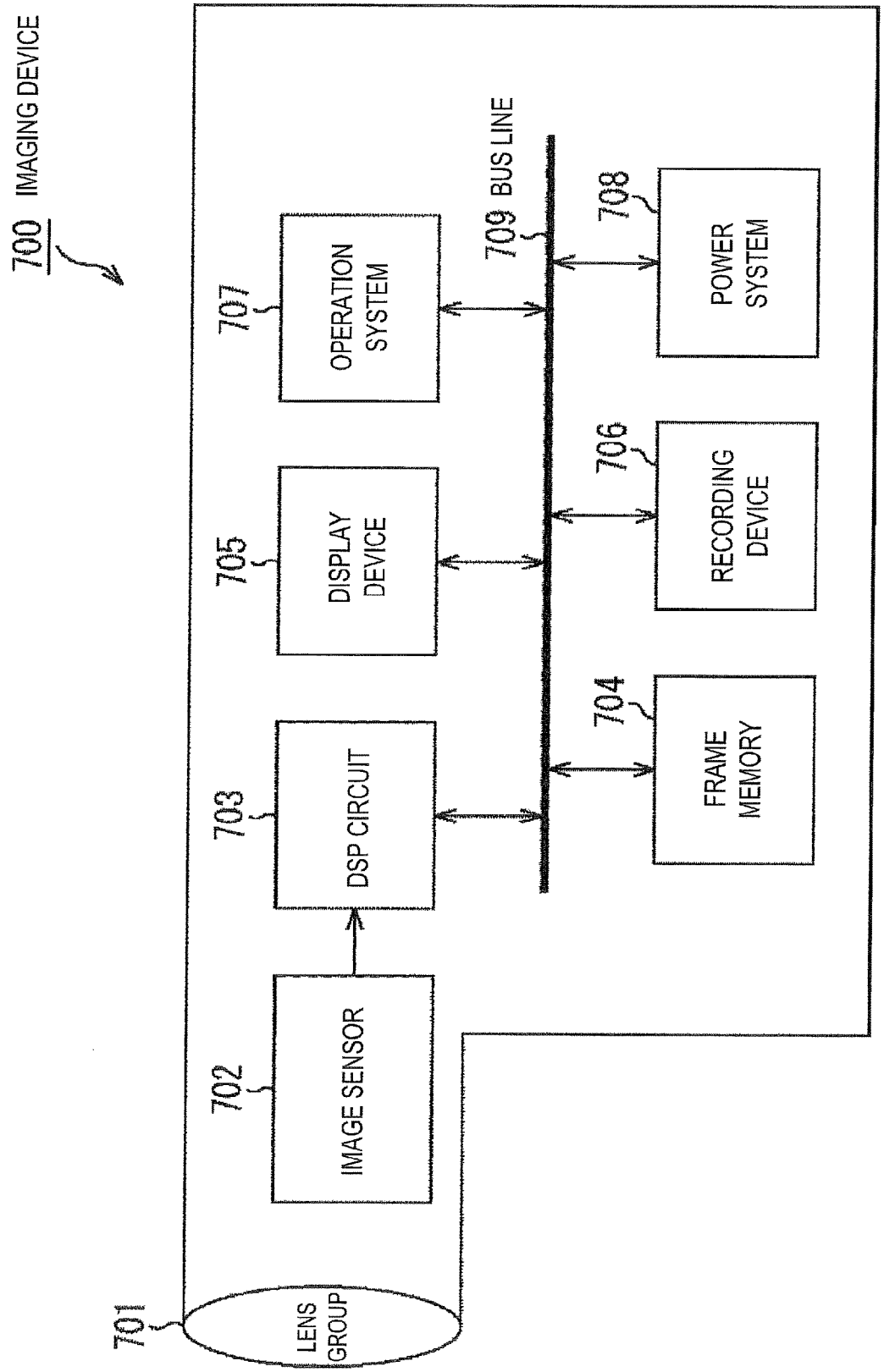
FIG. 42 is a block diagram illustrating an example of a configuration of an electronic device, an imaging device for example, according to an embodiment of the present application.

FIG. 42 is a block diagram illustrating a configuration example of an electronic device, for example, an imaging device, according to an embodiment of the present application.

As illustrated in FIG. 42, an imaging device 700 according to an embodiment of the present application includes an optical system including a lens group 701 and the like, an image sensor (imaging device) 702, a DSP circuit 703, a frame memory 704, a display device 705, a recording device 706, an operation system 707, a power system 708, and the like. Further, the DSP circuit 703, the frame memory 704, the display device 705, the recording device 706, the operation system 707, and the power system 708 are connected to one another via a bus line 709.

The lens group 701 forms an image on the imaging surface of the image sensor 702 by taking incident light (image light) from a subject. The image sensor 702 converts the amount of the incident light of the image formed on the imaging surface by the lens group 701 into electric signals per pixel unit, and outputs the converted electric signals as pixel signals.

The display device 705 is formed with a panel type display device, such as a liquid crystal display device or an organic electroluminescence (EL) display device, and displays moving images or still images imaged by the image sensor 702. The recording device 706 records the moving images or still images imaged by the image sensor 702 in a recording medium, such as a video tape or a digital versatile disk (DVD).

The operation system 707 outputs operation instructions about a variety of functions of the imaging device by user's operations. The power system 708 supplies power serving as operation power for the DSP circuit 703, the frame memory 704, the display device 705, the recording device 706, and the operation system 707 to these supplement objects as necessary.

The imaging device having the above configuration can be used as an imaging device, such as a video camera, a digital still camera, or a camera module for a mobile device like a mobile phone. Further, by using, as the image sensor 702 in the imaging device, any of the solid-state imaging devices according to the above-described embodiments, such as the chips 200*a*1 to 200*f*2, the chips 300*a*1 to 300*c*2, the semiconductor packages 400*a*1 to 400*f*2, and the semiconductor packages 500*a*1 to 500*c*2, it is possible to increase the water-proofing property and to prevent the degradation of the quality as described above.

It should be understood by those skilled in the art that various modifications, combinations, sub-combinations and alterations may occur depending on design requirements and other factors insofar as they are within the scope of the appended claims or the equivalents thereof.

Additionally, the present application may also be configured as below.

(1) A solid-state imaging device including:
a substrate having a surface over which a plurality of photodiodes are formed; and
a protection film that is transparent, has a water-proofing property, and includes a side wall part vertical to the surface of the substrate and a ceiling part covering a region surrounded by the side wall part, the side wall part and the ceiling part surrounding a region where the plurality of photodiodes are arranged over the substrate.

(2) The solid-state imaging device according to (1),
wherein the side wall part of the protection film is formed along a side surface of the solid-state imaging device.

(3) The solid-state imaging device according to (2),
wherein the protection film is further formed along an inner wall of an opening for wiring to an electrode pad of the solid-state imaging device.

(4) The solid-state imaging device according to (1),
wherein the side wall part of the protection film is embedded in a groove formed inside and along an outer periphery of the solid-state imaging device.

(5) The solid-state imaging device according to (4),
wherein the protection film is further embedded in a groove formed in a periphery of an opening for wiring to the electrode pad of the solid-state imaging device.

(6) The solid-state imaging device according to any one of (1) to (5),
wherein at least one of a lower end and an inner wall of the side wall part of the protection film is in contact with the substrate.

(7) The solid-state imaging device according to any one of (1) to (6),
wherein a color filter is disposed between the ceiling part of the protection film and the substrate.

(8) The solid-state imaging device according to (7),
wherein the ceiling part of the protection film forms a microlens for gathering light to each of the photodiodes.

(9) The solid-state imaging device according to (8),
wherein the ceiling part of the protection film is in contact with the color filter.

(10) The solid-state imaging device according to (7),
wherein the ceiling part of the protection film is formed over a surface of a microlens for gathering light to each of the photodiodes.

(11) The solid-state imaging device according to (7),
wherein the ceiling part of the protection film is disposed between a microlens for gathering light to each of the photodiodes and the color filter.

(12) The solid-state imaging device according to any one of (1) to (6),
wherein the ceiling part of the protection film is disposed between a color filter and the substrate.

(13) The solid-state imaging device according to (12),
wherein the color filter is in contact with the ceiling part of the protection film.

(14) The solid-state imaging device according to (12),
wherein the ceiling part of the protection film is in contact with a light-shielding film for preventing light leakage to an adjacent pixel.

(15) The solid-state imaging device according to any one of (1) to (14),
wherein the protection film includes silicon nitride.

(16) The solid-state imaging device according to any one of (1) to (15),
wherein the solid-state imaging device is a bottom emission type.

(17) The solid-state imaging device according to any one of (1) to (15),
wherein the solid-state imaging device is a top emission type.

(18) The solid-state imaging device according to any one of (1) to (17),
wherein the solid-state imaging device is packaged with a transparent resin and glass.

(19) An electronic device including:
a solid-state imaging device including
a substrate having a surface over which a plurality of photodiodes are formed, and
a protection film that is transparent, has a water-proofing property, and includes a side wall part vertical to the surface of the substrate and a ceiling part covering a region surrounded by the side wall part, the side wall part and the ceiling part surrounding a region where the plurality of photodiodes are arranged over the substrate; and
a signal processing part configured to perform signal processing of a pixel signal output from the solid-state imaging device.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention claimed is:
1. A package comprising:
a glass substrate;

a semiconductor substrate having a first side as a light-incident side and a second side opposite to the first side;
a protection layer between the glass substrate and the first side of the semiconductor substrate;
a microlens layer at the first side of the semiconductor substrate;
a first resin region including resin material between the protection layer and the glass substrate; and
a second resin region including resin material between a plane that is coincident with the first side of the semiconductor substrate and a plane that is coincident with the second side of the semiconductor substrate.

2. The package according to claim 1, wherein the resin material of the second resin region is exposed at an outer periphery of the package.

3. The package according to claim 1, further comprising a sidewall at an outer periphery of the package.

4. The package according to claim 3, wherein the resin material of the second resin region contacts at least two surfaces of the sidewall.

5. The package according to claim 3, wherein the resin material of the second resin region contacts the sidewall.

6. The package according to claim 1, wherein the second resin region extends beyond an edge of the protection layer in a direction parallel to the first side of the semiconductor substrate.

7. The package according to claim 1, wherein the second resin region extends from the glass substrate and beyond the microlens layer in a vertical direction.

8. The package according to claim 1, wherein the resin material of the second resin region is in contact with a material layer including at least one electrically conductive element.

9. The package according to claim 1, wherein a portion of the second resin region is disposed in a scribe region.

10. A package comprising:
a glass substrate;
a substrate having a first side as a light-incident side and a second side opposite to the first side;
a protection layer between the glass substrate and the first side of the substrate;
a microlens layer at the first side of the substrate;
a first resin region including resin material between the protection layer and the glass substrate; and
a second resin region including resin material between an edge of the substrate and an edge of the package, wherein the second resin region extends beyond an edge of the protection layer in a direction parallel to the first side of the substrate.

11. The package according to claim 10, wherein the resin material of the second resin region is exposed at an outer periphery of the package.

12. The package according to claim 10, further comprising a sidewall at an outer periphery of the package.

13. The package according to claim 12, wherein the resin material of the second resin region contacts at least two surfaces of the sidewall.

14. The package according to claim 12, wherein the resin material of the second resin region contacts the sidewall.

15. The package according to claim 10, wherein the second resin region extends from the glass substrate and beyond the microlens layer in a vertical direction.

16. The package according to claim 10, wherein the resin material of the second resin region is in contact with a material layer including at least one electrically conductive element.

17. The package according to claim 10, wherein a portion of the second resin region is disposed in a scribe region.

18. A camera module comprising:
a package including:
a glass substrate,
a semiconductor substrate having a first side as a light-incident side and a second side opposite to the first side,
a protection layer between the glass substrate and the first side of the semiconductor substrate,
a microlens layer over a color filter,
a first resin region including resin material between the protection layer and the glass substrate,
a second resin region including resin material between a plane that is coincident with the first side of the semiconductor substrate and a plane that is coincident with the second side of the semiconductor substrate;
at least one lens that guides light to the light-incident side of the semiconductor substrate; and
a signal processing circuit that processes an output signal from the package.

19. The camera module according to claim 18, wherein the resin material of the second resin region is exposed at an outer periphery of the package.

20. The camera module according to claim 18, further comprising a sidewall at an outer periphery of the package.

21. The camera module according to claim 20, wherein the resin material of the second resin region contacts at least two surfaces of the sidewall.

22. The camera module according to claim 20, wherein the resin material of the second resin region contacts the sidewall.

23. The camera module according to claim 18, wherein a portion of the second resin region is disposed in a scribe region.

24. The camera module according to claim 18, wherein the second resin region extends beyond an edge of the protection layer in a direction parallel to the first side of the semiconductor substrate.

25. A camera module comprising:
a package including:
a glass substrate,
a substrate having a first side as a light-incident side and a second side opposite to the first side,
a protection layer between the glass substrate and the first side of the substrate,
a microlens layer over a color filter,
a first resin region including resin material between the protection layer and the glass substrate, and
a second resin region including resin material between an edge of the substrate and an edge of the package, wherein the second resin region extends beyond an edge of the protection layer in a direction parallel to the first side of the substrate;
at least one lens that guides light to the light-incident side of the substrate; and
a signal processing circuit that processes an output signal from the package.

26. The camera module according to claim 25, wherein the resin material of the second resin region is exposed at an outer periphery of the package.

27. The camera module according to claim 25, further comprising a sidewall at an outer periphery of the package.

28. The camera module according to claim 27, wherein the resin material of the second resin region contacts at least two surfaces of the sidewall.

29. The camera module according to claim 28, wherein the resin material of the second resin region contacts the sidewall.

30. The camera module according to claim 25, wherein a portion of the second resin region is disposed in a scribe region.

* * * * *